US008559655B2

(12) United States Patent
Mihelich et al.

(10) Patent No.: US 8,559,655 B2
(45) Date of Patent: Oct. 15, 2013

(54) EFFICIENCY OPTIMIZED AUDIO SYSTEM

(75) Inventors: Ryan J. Mihelich, Farmington Hills, MI (US); Steven E. Hoshaw, Milford, MI (US)

(73) Assignee: Harman International Industries, Incorporated, Northridge, CA (US)

( * ) Notice: Subject to any disclaimer, the term of this patent is extended or adjusted under 35 U.S.C. 154(b) by 485 days.

(21) Appl. No.: 12/782,143

(22) Filed: May 18, 2010

(65) Prior Publication Data

US 2010/0290643 A1 Nov. 18, 2010

Related U.S. Application Data

(60) Provisional application No. 61/179,239, filed on May 18, 2009.

(51) Int. Cl.
*H03G 5/00* (2006.01)

(52) U.S. Cl.
USPC ................. 381/98; 381/99; 381/103; 381/77; 700/94

(58) Field of Classification Search
USPC ........... 381/98–99, 104–109, 56–58, 103, 77; 700/94
See application file for complete search history.

(56) References Cited

U.S. PATENT DOCUMENTS

| | | | | |
|---|---|---|---|---|
| 5,581,621 | A | 12/1996 | Koyama et al. | 381/103 |
| 6,108,426 | A | 8/2000 | Stortz | 381/77 |
| 6,449,368 | B1 | 9/2002 | Davis et al. | 381/17 |
| 6,674,864 | B1 | 1/2004 | Kitamura | 381/103 |
| 6,940,981 | B2 * | 9/2005 | Neunaber | 381/55 |
| 7,305,100 | B2 * | 12/2007 | Pedersen | 381/320 |
| 7,391,869 | B2 | 6/2008 | Eid et al. | 381/22 |
| 7,526,093 | B2 * | 4/2009 | Devantier et al. | 381/59 |
| 7,792,310 | B2 * | 9/2010 | Lee et al. | 381/59 |
| 8,082,051 | B2 | 12/2011 | Mihelich et al. | 700/94 |
| 2001/0017921 | A1 | 8/2001 | Ohta | 381/98 |
| 2003/0031333 | A1 | 2/2003 | Cohen et al. | 381/303 |
| 2004/0091123 | A1 | 5/2004 | Stark et al. | 381/86 |
| 2004/0125487 | A9 | 7/2004 | Sternad et al. | 360/65 |

(Continued)

FOREIGN PATENT DOCUMENTS

| | | |
|---|---|---|
| EP | 0 898 364 A2 | 2/1999 |
| EP | 1 126 744 A2 | 8/2001 |

(Continued)

OTHER PUBLICATIONS

International Search Report from International Application No. PCT/2010/035213, dated Aug. 17, 2010. (8 pgs.).

(Continued)

*Primary Examiner* — Disler Paul
(74) *Attorney, Agent, or Firm* — Brinks Hofer Gilson & Lione

(57) ABSTRACT

An automated audio tuning system may optimize an audio system for power efficiency when performing automated tuning of the audio system to optimize acoustic performance. The system may establish any number of different power efficiency weighting factors to provide a balance between acoustic performance and power efficiency during operation. The power efficiency weighting factors may range from representing optimizing power efficiency with constrained optimization of acoustic performance to optimized acoustic performance with minimized regard for power efficiency. For each of the efficiency weighting factors, the system may generate operational parameters, such as filter parameters, to achieve a target acoustic response while maintaining a determined level of power efficiency.

28 Claims, 19 Drawing Sheets

(56) References Cited

U.S. PATENT DOCUMENTS

| | | | | |
|---|---|---|---|---|
| 2004/0125967 | A1 | 7/2004 | Eid et al. | 381/99 |
| 2004/0178852 | A1 | 9/2004 | Neunaber | |
| 2004/0258259 | A1 | 12/2004 | Koyama | 381/307 |
| 2005/0031129 | A1 | 2/2005 | Devantier | 381/18 |
| 2005/0031130 | A1 | 2/2005 | Devantier | 381/59 |
| 2005/0031135 | A1 | 2/2005 | Devantier | 381/59 |
| 2005/0031143 | A1 | 2/2005 | Devantier et al. | 381/300 |
| 2005/0063554 | A1 | 3/2005 | Devantier et al. | 381/99 |
| 2005/0069153 | A1 | 3/2005 | Hall et al. | 381/103 |
| 2005/0100174 | A1 | 5/2005 | Howard et al. | |
| 2006/0104453 | A1 | 5/2006 | Lee et al. | |
| 2006/0147057 | A1 | 7/2006 | Aggarwal et al. | 381/103 |
| 2006/0229752 | A1 | 10/2006 | Chung | |
| 2007/0025559 | A1 | 2/2007 | Mihelich et al. | 381/59 |
| 2007/0098190 | A1 | 5/2007 | Song et al. | 381/120 |
| 2008/0101631 | A1 * | 5/2008 | Jung et al. | 381/307 |
| 2009/0003628 | A1 * | 1/2009 | Kirn | 381/96 |
| 2009/0154723 | A1 | 6/2009 | Choi et al. | 381/80 |

FOREIGN PATENT DOCUMENTS

| | | | | |
|---|---|---|---|---|
| EP | 1 241 922 | A2 | 9/2002 | |
| EP | 1 355 514 | A2 | 10/2003 | |
| EP | 1 523 221 | A2 | 4/2005 | H04S 7/00 |
| EP | 1 677 515 | A2 | 7/2006 | |
| JP | 61-162124 | | 10/1986 | |
| JP | 2001-224099 | A | 8/2001 | H04S 7/00 |
| JP | 2002-369299 | A | 12/2002 | H04S 5/02 |
| JP | 2004-007604 | | 1/2004 | H04R 27/00 |
| JP | 2005-012534 | A | 1/2005 | H04S 5/02 |
| JP | 2005-151539 | A | 6/2005 | H04R 3/12 |
| JP | 2006-109479 | | 4/2006 | |
| JP | 2008-507244 | | 3/2008 | |
| KR | 10-2006-0079125 | | 7/2006 | |
| WO | WO/2007016527 | A1 | 2/2007 | |
| WO | WO 2007/116802 | A1 | 10/2007 | H04S 5/02 |

OTHER PUBLICATIONS

First Office Action, Mar. 15, 2013, for Chinese Patent Application No. 201080003001.1, 21 pgs.

Notice of Preliminary Rejection for Korean Patent Application No. 10-2011-7027350, delivery date Jan. 24, 2013, 12 pgs.

Japanese Office Action, Japanese Application No. 2011-528104, Jan. 24, 2013, 7 pgs.

* cited by examiner

EFFICIENCY OPTIMIZED AUDIO SYSTEM

PRIORITY CLAIM

This application claims priority to U.S. Provisional Patent Application No. 61/179,239, filed on May 18, 2009 entitled "Efficiency Optimized Audio System," by Ryan J. Mihelich and Steven E. Hoshaw, which is incorporated by reference herein.

BACKGROUND OF THE INVENTION

1. Technical Field

The invention relates to audio systems, and more particularly, to systems and methods for optimizing efficiency of an audio system.

2. Related Art

Multimedia systems, such as home theater systems, home audio systems, vehicle audio/video systems are well known. Such systems typically include multiple components that include a sound processor driving loudspeakers with amplified audio signals. Multimedia systems may be installed in an almost unlimited amount of configurations with various components. In addition, such multimedia systems may be installed in listening spaces of almost unlimited sizes, shapes and configurations. The components of a multimedia system, the configuration of the components and the listening space in which the system is installed all may have significant impact on the audio sound produced.

Once installed in a listening space, a system may be tuned to produce a desirable sound field within the space. Tuning may include adjusting the equalization, delay, and/or filtering to compensate for the equipment and/or the listening space. Such tuning is typically performed manually using subjective analysis of the sound emanating from the loudspeakers.

Once tuned, an audio system will have a certain power consumption behavior. Depending on the particulars of the tuning solution including the filtering, a tuned audio system can be made to consume different amounts of power by distributing energy in different ways to the various speakers that are present in the system. The power consumption outcome can depend on the decisions of the individual who tuned the system and/or the parameters that were entered into the automated audio system tuning software.

There is a need for an automated tuning system that factors power consumption in generating tuning settings. There is also a need for a way of providing the user with information regarding power consumption relative to alternative configurations of the audio system performance.

SUMMARY

In view of the above, an automated audio tuning system is provided for optimizing an audio system for power efficiency. An example system includes a setup file configured to store audio system specific configuration settings for an audio system to be tuned to operate in one or more power efficiency modes. A processor is configured to operate the audio system in one of the power efficiency modes based on a power efficiency weighting factor associated with each of the respective modes. Any of one or more engines included in the system may generate operational parameters for the audio system in association with each of the power efficiency weighting factors. For example, a crossover engine is configured to generate at least one efficiency optimized crossover setting for a selected group of amplified channels for each of the power efficiency weighting factors. When indicated by the power efficiency weighting factor, the crossover settings may be optimized to minimize power consumption when operating in the power efficiency mode while still optimizing acoustic performance of the audio system.

The automated audio tuning system may tune the audio system to included different sets operational parameters for acoustic performance at different levels of power efficiency. In addition to tuning the system to include different crossover settings, tuning to generate operational parameters with an equalization engine and a bass management engine may also be performed for each of the power efficiency weighting factors. Using loudspeaker impedance data, the system may determine the power consumption of an audio amplifier included in the audio system when different operational parameters are applied. Accordingly, depending on the power efficiency weighting factor, the system may generate operational parameters bias towards optimizing power consumption or biased towards acoustic performance. Since any number of sets of operational parameters may be generated for a number of respective power efficiency weighting factors, an audio system may have a number of different power efficiency modes.

During operation, selection of the power efficiency weighting factor (the power efficiency mode) may be based on user selection, or operational factors. For example, in a hybrid vehicle, progressively higher levels of power efficiency may be called for as a battery included in the hybrid vehicle becomes depleted.

Those skilled in the art will appreciate that the features mentioned above and those yet to be explained below can be used not only in the respective combinations indicated, but also in other combinations or in isolation, without leaving the scope of the invention. Other devices, apparatus, systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE FIGURES

The invention can be better understood with reference to the following drawings and description. The components in the figures are not necessarily to scale, emphasis instead being placed upon illustrating the principles of the invention.

DESCRIPTION

I. General Description

Figure 1:
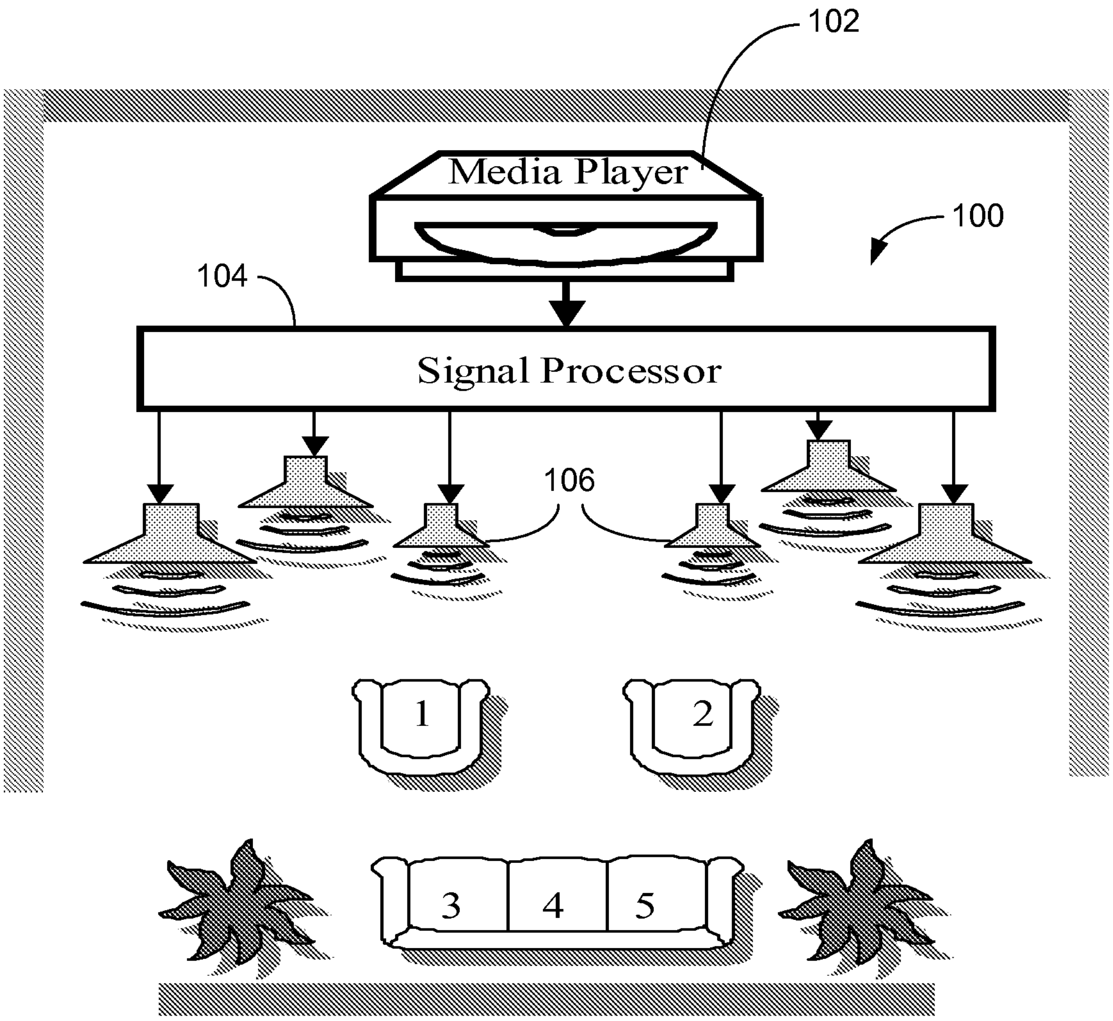
FIG. 1 is a schematic diagram of an example listening space that includes an audio system.

An automated audio tuning system may be configured with audio system specific configuration information related to an audio system to be tuned. In addition, the automated audio tuning system may include a response matrix. Audio responses of a plurality of loudspeakers included in the audio system may be captured with one or more microphones and stored in the response matrix. The measured audio responses can be in-situ responses, such as from inside a vehicle, and/or laboratory audio responses. The measured audio responses can include small signal (linear) responses as well as large signal (non-linear) responses.

In addition, the automated audio tuning system may include an electrical impedance matrix. Electrical impedances, such as manufacturer's impedance curves or measured impedance values, of a plurality of loudspeakers included in the audio system may be stored in an impedance matrix.

The automated tuning system may include one or more engines capable of generating operational parameters for use in the audio system. A target acoustic response, the in-situ data and/or the audio system specific configuration information may be used in generating at least some of the operational parameters. The operational parameters, such as filter parameters and equalization settings may be downloaded into the audio system to configure the operational performance of the audio system.

Generation of operational parameters with the automated audio tuning system may be with one or more of an equalization engine, a delay engine, a gain engine, a crossover engine, a bass optimization engine and a system optimization engine. Sets of operational parameters may be generated by the engines for each of a number of power efficiency modes based on respective power efficiency weighting factors. The power efficiency weighting factors may provide balance between minimizing energy consumption and maximizing acoustic performance. Thus, the power efficiency weighting factors may be considered a reduction in power consumption that is performed in consideration of acoustic performance. In other words, whatever the power efficiency is without a power efficiency weighting factor applied, power consumption may be reduced within the audio system based on application of a power efficiency weighting factor so long as acoustic performance is not compromised too greatly for the level of reduction in power that is achieved. By performing a balance between acoustic performance and power consumption based on the power efficiency weighting factor, power efficiency may be optimized while still maintaining an optimized level of audio performance. Thus, when a sacrifice in audio performance due to reductions in power consumption exceeds a determined threshold, the automated audio tuning system may forego further reductions in power consumption in favor of acoustic performance. In addition or alternatively, the automated audio tuning system may perform a number of different iterations of various changes in the operational parameters in an effort to achieve reductions in power consumption while at the same time minimizing any detrimental effect or reduced audio performance.

In addition, the automated audio tuning system may include a settings application simulator. The setting applications simulator may generate simulations based on application of one or more of the operational parameters and/or the audio system specific configuration information to the measured audio responses and electrical impedances. The engines may use one or more of the simulations or the measured audio responses, the electrical impedances and the system specific configuration information to generate the operational parameters for each of the respective power efficiency weighting factors.

The equalization engine may generate operational parameters in the form of channel equalization settings for each of the power efficiency weighting factors. The channel equalization settings may be downloaded and applied to amplified audio channels in the audio system. The amplified audio channels may each drive one or more loudspeakers. The channel equalization settings may compensate for anomalies or undesirable features in the operational performance of the loudspeakers in their acoustic environment. To optimize power efficiency, the channel equalization settings may reduce the audio signal output to a loudspeaker in a frequency range where a large amount of power is required to achieve an audible output. In addition, or alternatively, the channel equalization settings may increase the audio signal output to the loudspeaker in a frequency range where a mechanical or acoustical resonance is present in a respective loudspeaker. The delay and gain engines may generate respective delay and gain settings for each of the amplified audio channels based on listening positions in a listening space where the audio system is installed and operational.

The crossover engine may determine operational parameters in the form of a crossover setting for a group of the amplified audio channels that are configured to drive respective loudspeakers operating in different frequency ranges. The combined audible output of the respective loudspeakers driven by the group of amplified audio channels may be optimized by the crossover engine using the crossover settings. The crossover engine may also change or adjust the crossover frequency of one or more of the speakers in the system to minimize power consumption. The bass optimization engine may optimize the audible output of a determined group of low frequency loudspeakers by generating operational parameters providing phase adjustments for each of the respective amplified output channels driving the loudspeakers in a group of loudspeakers operating in an overlapping frequency range. The bass optimization engine may change the adjustment in phase response of one or more of the speakers in the system to minimize power consumption. The system optimization engine may generate operational parameters in the form of group equalization settings for groups of amplified output channels. The group equalization settings may be applied to one or more of the input channels of the audio system, or one or more of the spatially steered channels of the audio system so that groups of the amplified output channels will be equalized. The group equalization settings may be generated to optimize power consumption and acoustic performance as a function of the efficiency weighting factors.

The nonlinear optimization engine may determine operational parameters the include non-linear settings to form limiters, compressors, clipping and other nonlinear processes that are applied to the audio system for acoustic performance, protection, power reduction, distortion management and/or other reasons. A large magnitude audio signal output of the audio system, such as when volume is at high levels and amplification of the audio signals is relatively large, may be optimized in the nonlinear optimization engine to minimize distortion. In addition, non-linear settings may be generated based on optimized power consumption and acoustic performance as a function of the efficiency weighting factors.

In an example audio tuning system, audio tuning settings that offer high sound quality may be generated and ranked by power consumption. In cases where optimal sound quality consumes significantly more power than other solutions, it may be desirable to continue to provide the end user the option of listening to these results. Other solutions that consume less power but have lower performance can also be provided to the user as a way of saving power (fuel and/or electricity).

The electrical impedance of devices in the system may be included as part of the stored laboratory acoustic data being incorporated into the audio tuning system. Details of the audio amplifier and loudspeakers included in the audio system may be used to compute power consumption results and to optimize the operational parameters of the system for acoustic performance at different levels of power efficiency. Alternatively, the impedance of devices in the system may be determined based on measured parameters. Such measured parameters may include voltage and current. Other input parameters incorporated in the system may include peak voltage and current available from the amplifier as well as the long term power that the amplifier can deliver.

Electrical impedance, voltage, current and power may also be used by the automated tuning system along with the audio system tuning parameters to generate an electro-acoustic power efficiency metric for each iteration of a simulation of operation of the audio system to be tuned. Iteration results may be ranked in order of sound quality and efficiency and may be associated with a corresponding power efficiency weighting factor. Metrics may be used to sort appropriate solutions for use in an end product as power efficiency modes.

The automated audio tuning system may be operated to generate operational parameters that are downloaded and stored in the audio system prior to operation of the audio system. Alternatively, or in addition, the automated audio tuning system may operate in conjunction with operation of the audio system to produce audible sound. Accordingly, the power efficiency mode may include static operational parameters provided to the audio system prior to operation, and/or dynamic operational parameters provided to the audio system during operation. With regard to dynamic operational parameters provided automatically during operation, the automated audio tuning system may operate to optimize power efficiency in the power efficiency mode by dynamically adjusting operational parameters based on existing conditions in the audio system, such as current audio system operating conditions. For example, updated operational parameters may be provided from the automated audio tuning system to the audio system as the impedance of the loudspeakers change (such as due to heating and cooling), as the level of amplification of the audio channels changes (such as the volume level) or any other changeable conditions within the audio system. In addition, external changes, such as the level of power supplying the audio system, the genre of the audio content being processed by the audio system, external background noise, or any other external parameters related to operation of the audio system may be leveraged by the automated audio tuning system to automatically generate static or dynamic operational parameters for the audio system.

During operation, a real-time power consumption meter may be added to a user interface to deliver information to the user regarding instantaneous and long term power consumption of the audio system. The information may be reported in watts or alternatively in a fuel usage metric for vehicles.

A user interface may be added to allow the user to select from a number of different tuning solutions such as power efficiency modes. Each of the power efficiency modes may correspond to one of the power efficiency weighting factors. Each power efficiency weighting factor may have a different level of power consumption as a function of acoustic performance of the audio system.

Real-time battery level information may be used to automatically select a lower power consumption audio tuning solution (a different power efficiency mode) when a battery, fuel cell, or other power source supplying power to the audio system reaches certain degraded power levels. The user may be notified of this and may have the option to override the change or prevent it from ever happening.

II. Description of Example Audio Tuning System

FIG. 1 illustrates an example audio system 100 in an example listening space. In FIG. 1, the example listening space is depicted as a room. In other examples, the listening space may be in a vehicle, or in any other space where an audio system can be operated. The audio system 100 may be any system capable of providing audio content. In FIG. 1, the audio system 100 includes a media player 102, such as a compact disc, video disc player, etc., however, the audio system 100 may include any other form of audio related devices, such as a video system, a radio, a cassette tape player, a wireless or wireline communication device, a navigation system, a personal computer, or any other functionality or device that may be present in any form of multimedia system. The audio system 100 also includes a signal processor 104 and a plurality of loudspeakers 106 forming a loudspeaker system.

The signal processor 104 may be any computing device capable of processing audio and/or video signals, such as a computer processor, a digital signal processor, etc. The signal processor 104 may operate in association with a memory to execute instructions stored in the memory. The instructions may provide the functionality of the multimedia system 100. The memory may be any form of one or more data storage devices, such as volatile memory, non-volatile memory, electronic memory, magnetic memory, optical memory, etc. The loudspeakers 106 may be any form of device capable of translating electrical audio signals to audible sound.

During operation, audio signals may be generated by the media player 102, processed by the signal processor 104, and used to drive one or more of the loudspeakers 106. The loudspeaker system may consist of a heterogeneous collection of audio transducers. Each transducer may receive an independent and possibly unique amplified audio output signal from the signal processor 104. Accordingly, the audio system 100 may operate to produce mono, stereo or surround sound using any number of loudspeakers 106.

An ideal audio transducer would reproduce sound over the entire human hearing range, with equal loudness, and minimal distortion at elevated listening levels. Unfortunately, a single transducer meeting all these criteria is difficult, if not impossible to produce. Thus, a typical loudspeaker 106 may utilize two or more transducers, each optimized to accurately reproduce sound in a specified frequency range. Audio signals with spectral frequency components outside of a transducer's operating range may sound unpleasant and/or might damage the transducer.

The signal processor 104 may be configured to restrict the spectral content provided in audio signals that drive each transducer. The spectral content may be restricted to those frequencies that are in the optimum playback range of the loudspeaker 106 being driven by a respective amplified audio output signal. Sometimes even within the optimum playback range of a loudspeaker 106, a transducer may have undesirable anomalies in its ability reproduce sounds at certain frequencies. Thus, another function of the signal processor 104 may be to provide compensation for spectral anomalies in a particular transducer design.

The signal processor 104 may be configured to restrict the spectral content provided in audio signals that drive each transducer. The spectral content may be restricted to minimize the power required to drive the loudspeaker to the specified output levels and bandwidth.

Another function of the signal processor 104 may be to shape a playback spectrum of each audio signal provided to each transducer. The playback spectrum may be compensated with spectral colorization to account for room acoustics in the listening space where the transducer is operated. Room acoustics may be affected by, for example, the walls and other room surfaces that reflect and/or absorb sound emanating from each transducer. The walls may be constructed of materials with different acoustical properties. There may be doors, windows, or openings in some walls, but not others. Furniture and plants also may reflect and absorb sound. Therefore, both listening space construction and the placement of the loudspeakers 106 within the listening space may affect the spectral and temporal characteristics of sound produced by the audio system 100. In addition, the acoustic path from a transducer to a listener may differ for each transducer and each seating position in the listening space. Multiple sound arrival times may inhibit a listener's ability to precisely localize a sound, i.e., visualize a precise, single position from which a sound originated. In addition, sound reflections can add further ambiguity to the sound localization process. The signal processor 104 also may provide delay of the signals sent to each transducer so that a listener within the listening space experiences minimum degradation in sound localization.

Figure 2:
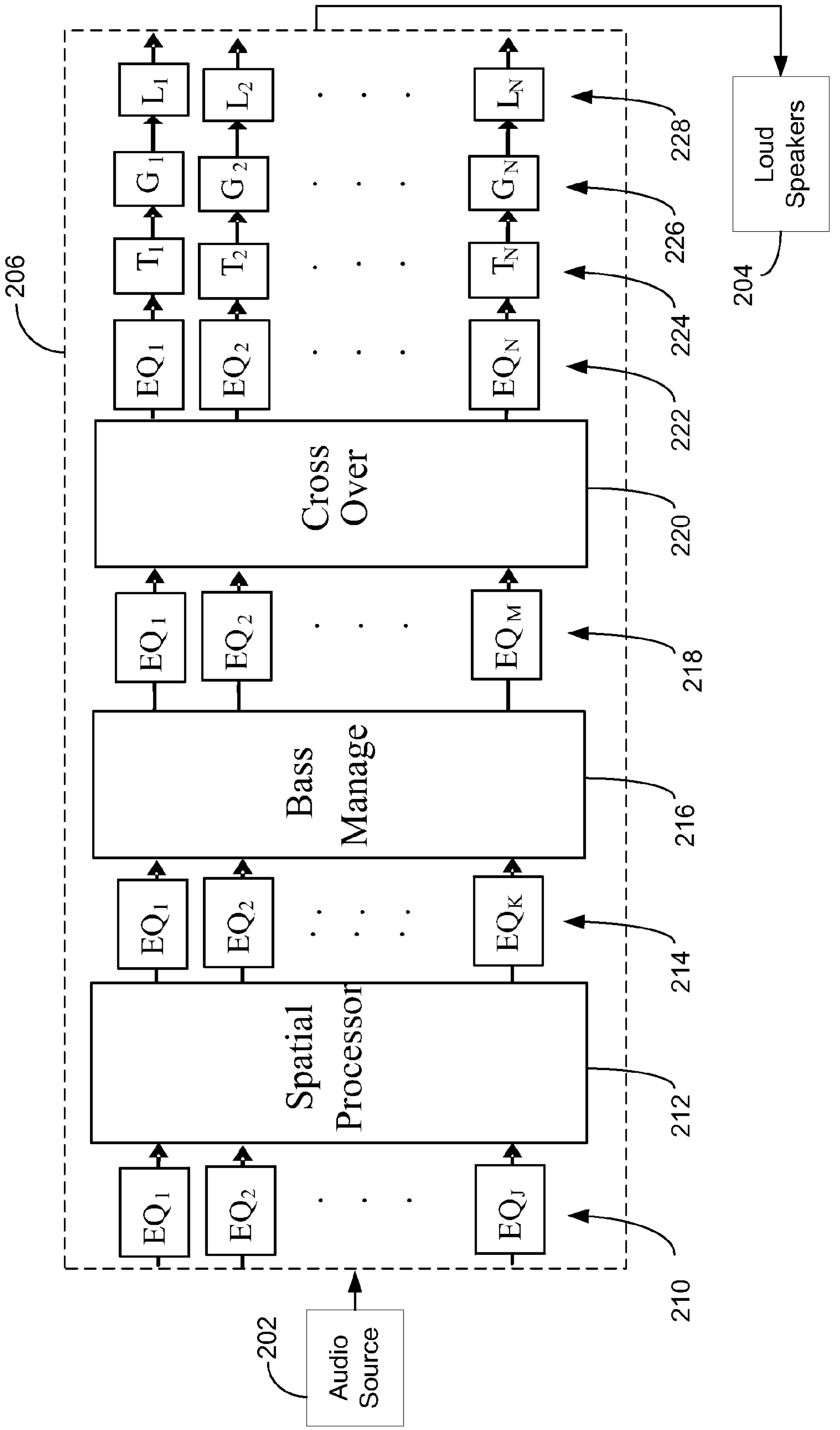
FIG. 2 is a block diagram of a portion of the audio system of FIG. 1 that includes an audio source, an audio signal processor, and loudspeakers.

FIG. 2 is an example block diagram that depicts an audio source 202, one or more loudspeakers 204, and an audio signal processor 206. The audio source 202 may include a compact disc player, a radio tuner, a navigation system, a mobile phone, a head unit, or any other device capable of generating digital or analog input audio signals representative of audio sound. In one example, the audio source 202 may provide digital audio input signals representative of left and right stereo audio input signals on left and right audio input channels. In another example, the audio input signals may be any number of channels of audio input signals, such as six audio channels in Dolby 6.1™ surround sound.

The loudspeakers 204 may be any form of one or more transducers capable of converting electrical signals to audible sound. The loudspeakers 204 may be configured and located to operate individually or in groups, and may be in any frequency range. The loudspeakers may collectively or individually be driven by amplified output channels, or amplified audio channels, provided by the audio signal processor 206.

The audio signal processor 206 may be one or more devices capable of performing logic to process the audio signals supplied on the audio channels from the audio source 202. Such devices may include digital signal processors (DSP), microprocessors, field programmable gate arrays (FPGA), or any other device(s) capable of executing instructions. In addition, the audio signal processor 206 may include other signal processing components such as filters, analog-to-digital converters (A/D), digital-to-analog (D/A) converters, signal amplifiers, decoders, delay, or any other audio processing mechanisms. The signal processing components may be hardware based, software based, or some combination thereof. Further, the audio signal processor 206 may include memory, such as one or more volatile and/or non-volatile memory devices, configured to store instructions and/or data. The instructions may be executable within the audio signal processor 206 to process audio signals. The data may be parameters used/updated during processing, parameters generated/updated during processing, user entered variables, and/or any other information related to processing audio signals.

In FIG. 2, the audio signal processor 206 may include a global equalization block 210. The global equalization block 210 includes a plurality of filters ($EQ_1$-$EQ_J$) that may be used to equalize the input audio signals on a respective plurality of input audio channels. Each of the filters ($EQ_1$-$EQ_J$) may include one filter, or a bank of filters, that include settings defining the operational signal processing functionality of the respective filter(s). The number of filters (J) may be varied based on the number of input audio channels. The global equalization block 210 may be used to adjust anomalies or any other properties of the input audio signals as a first step in processing the input audio signals with the audio signal processor 206. For example, global spectral changes to the input audio signals may be performed with the global equalization block 210. Alternatively, where such adjustment of the input audio signals in not desirable, the global equalization block 210 may be omitted.

The audio signal processor 206 also may include a spatial processing block 212. The spatial processing block 212 may receive the globally equalized, or unequalized, input audio signals. The spatial processing block 212 may provide processing and/or propagation of the input audio signals in view of the designated loudspeaker locations, such as by matrix decoding of the equalized input audio signals. Any number of spatial audio input signals on respective steered channels may be generated by the spatial processing block 212. Accordingly, the spatial processing block 212 may up mix, such as from two channels to seven channels, or down mix, such as from six channels to five channels. The spatial audio input signals may be mixed with the spatial processing block 212 by any combination, variation, reduction, and/or replication of the audio input channels. An example spatial processing block 212 is the Logic7™ system by Lexicon™. Alternatively, where spatial processing of the input audio signals is not desired, the spatial processing block 212 may be omitted.

The spatial processing block 212 may be configured to generate a plurality of steered channels. In the example of Logic 7 signal processing, a left front channel, a right front channel, a center channel, a left side channel, a right side channel, a left rear channel, and a right rear channel may constitute the steered channels, each including a respective spatial audio input signal. In other examples, such as with Dolby 6.1 signal processing, a left front channel, a right front channel, a center channel, a left rear channel, and a right rear channel may constitute the steered channels produced. The steered channels also may include a low frequency channel designated for low frequency loudspeakers, such as a subwoofer. The steered channels may not be amplified output channels, since they may be mixed, filtered, amplified etc. to form the amplified output channels. Alternatively, the steered channels may be amplified output channels used to drive the loudspeakers 204.

The pre-equalized, or not, and spatially processed, or not, input audio signals may be received by a second equalization module that can be referred to as a steered channel equalization block 214. The steered channel equalization block 214 may include plurality of filters ($EQ_1$-$EQ_K$) that may be used to equalize the input audio signals on a respective plurality of steered channels. Each of the filters ($EQ_1$-$EQ_K$) may include one filter, or a bank of filters, that include settings defining the operational signal processing functionality of the respective filter(s). The number of filters (K) may be varied based on the number of input audio channels, or the number of spatial audio input channels depending on whether the spatial processing block 212 is present. For example, when the spatial processing block 212 is operating with Logic 7™ signal processing, there may be seven filters (K) operable on seven steered channels, and when the audio input signals are a left and right stereo pair, and the spatial processing block 212 is omitted, there may be two filters (K) operable on two channels.

The audio signal processor 206 also may include a bass management block 216. The bass management block 216 may manage a low frequency portion of one or more audio output signals provided on respective amplified output channels. The low frequency portion of the selected audio output signals may be re-routed to other amplified output channels. The re-routing of the low frequency portions of audio output signals may be based on the respective loudspeaker(s) 204 being driven by the amplified output channels. The low frequency energy that may otherwise be included in audio output signals may be re-routed with the bass management block 216 from amplified output channels that include audio output signals driving loudspeakers 204 that are not designed for re-producing low frequency audible energy or reproduce the energy very inefficiently. The bass management block 216 may re-route such low frequency energy to output audio signals on amplified output channels that are capable of reproducing low frequency audible energy. Alternatively, where such bass management is not desired, the steered channel equalization block 214 and the bass management block 216 may be omitted.

The pre-equalized, or not, spatially processed, or not, spatially equalized, or not, and bass managed, or not, audio signals may be provided to a bass managed equalization block 218 included in the audio signal processor 206. The bass managed equalization block 218 may include a plurality of filters ($EQ_1$-$EQ_M$) that may be used to equalize and/or phase adjust the audio signals on a respective plurality of amplified output channels to optimize audible output by the respective loudspeakers 204. Each of the filters ($EQ_1$-$EQ_M$) may include one filter, or a bank of filters, that include settings defining the operational signal processing functionality of the respective filter(s). The number of filters (M) may be varied based on the number of audio channels received by the bass managed equalization block 218.

Tuning the phase to allow one or more loudspeakers 204 driven with an amplified output channel to interact in a particular listening environment with one or more other loudspeakers 204 driven by another amplified output channel may be performed with the bass managed equalization block 218. For example, filters ($EQ_1$-$EQ_M$) that correspond to an amplified output channel driving a group of loudspeakers representative of a left front steered channel and filters ($EQ_1$-$EQ_M$) corresponding to a subwoofer may be tuned to adjust the phase of the low frequency component of the respective audio output signals so that the left front steered channel audible output, and the subwoofer audible output may be introduced in the listening space to result in a complimentary and/or desirable audible sound.

The audio signal processor 206 also may include a crossover block 220. Amplified output channels that have multiple loudspeakers 204 that combine to make up the full bandwidth of an audible sound may include crossovers to divide the full bandwidth audio output signal into multiple narrower band signals. A crossover may include a set of filters that may divide signals into a number of discrete frequency components, such as a high frequency component and a low frequency component, at a division frequency(s) called the crossover frequency. A respective crossover setting may be configured for each of a selected one or more amplified output channels to set one or more crossover frequency(s) for each selected channel.

The crossover frequency(s) may be characterized by the acoustic effect of the crossover frequency when a loudspeaker 204 is driven with the respective output audio signal on the respective amplified output channel. Accordingly, the crossover frequency is typically not characterized by the electrical response of the loudspeaker 204. For example, a proper 1 kHz acoustic crossover may require a 900 Hz low pass filter and a 1200 Hz high pass filter in an application where the result is a flat response throughout the bandwidth. Thus, the crossover block 220 includes a plurality of filters that are configurable with filter parameters to obtain the desired crossover(s) settings. As such, the output of the crossover block 220 is the audio output signals on the amplified output channels that have been selectively divided into two or more frequency ranges depending on the loudspeakers 204 being driven with the respective audio output signals.

The crossover frequency(s) may be optimized not only for the optimal acoustic result but also for the minimized power result. A weighting factor may be introduced to instruct the algorithm on the relative importance of acoustic response and power consumption.

A channel equalization block 222 also may be included in the audio signal processing module 206. The channel equalization block 222 may include a plurality of filters ($EQ_1$-$EQ_N$) that may be used to equalize the audio output signals received from the crossover block 220 as amplified audio channels. Each of the filters ($EQ_1$-$EQ_N$) may include one filter, or a bank of filters, that include settings defining the operational signal processing functionality of the respective filter(s). The number of filters (N) may be varied based on the number of amplified output channels.

The filters ($EQ_1$-$EQ_N$) may be configured within the channel equalization block 222 to adjust the audio signals in order to adjust undesirable transducer response characteristics. Accordingly, consideration of the operational characteristics and/or operational parameters of one or more loudspeakers 204 driven by an amplified output channel may be taken into account with the filters in the channel equalization block 222. Where compensation for the operational characteristics and/or operational parameters of the loudspeakers 204 is not desired, the channel equalization block 222 may be omitted.

The signal flow in FIG. 2 is one example of what might be found in an audio system. Simpler or more complex variations are also possible. In this general example, there may be a (J) input channel source, (K) processed steered channels, (M) bass managed outputs and (N) total amplified output channels. Accordingly, adjustment of the equalization of the audio signals may be performed at each step in the signal chain. This may help to minimize the number of filters used in the system overall, since in general N>M>K>J. Global spectral changes to the entire frequency spectrum could be applied with the global equalization block 210. In addition, equalization may be applied to the steered channels with the steered channel equalization block 214. Thus, equalization within the global equalization block 210 and the steered channel equalization block 214 may be applied to groups of the amplified audio channels. Equalization with the bass managed equalization block 218 and the channel equalization block 222, on the other hand, is applied to individual amplified audio channels.

Equalization that occurs prior to the spatial processor block 212 and the bass manager block 216 may constitute linear phase filtering if different equalization is applied to any one audio input channel, or any group of amplified output channels. The linear phase filtering may be used to preserve the phase of the audio signals that are processed by the spatial processor block 212 and the bass manager block 216. Alternatively, the spatial processor block 212 and/or the bass manager block 216 may include phase correction that may occur during processing within the respective modules.

The audio signal processor 206 also may include a delay block 224. The delay block 224 may be used to delay the amount of time an audio signal takes to be processed through the audio signal processor 206 and drive the loudspeakers 204. The delay block 224 may be configured to apply a variable amount of delay to each of the audio output signals on a respective amplified output channel. The delay block 224 may include a plurality of delay blocks ($T_1$-$T_N$) that correspond to the number of amplified output channels. Each of the delay blocks ($T_1$-$T_N$) may include configurable parameters to select the amount of delay to be applied to a respective amplified output channel.

In one example, each of the delay blocks may be a simple digital tap-delay block based on the following equation:

$$y[t]=x[t-n] \qquad \text{EQUATION 1}$$

where x is the input to a delay block at time t, y is the output of the delay block at time t, and n is the number of samples of delay. The parameter n is a design parameter and may be unique to each loudspeaker 204, or group of loudspeakers 204 on an amplified output channel. The latency of an amplified output channel may be the product of n and a sample-period. The filter block can be one or more infinite impulse response (IIR) filters, finite impulse response filters (FIR), or a combination of both. Filter processing by the delay block 224 also may incorporate multiple filter banks processed at different sample-rates. Where no delay is desired, the delay block 224 may be omitted.

A gain optimization block 226 also may be included in the audio signal processor 206. The gain optimization block 226 may include a plurality of gain blocks ($G_1$-$G_N$) for each respective amplified output channel. The gain blocks ($G_1$-$G_N$) may be configured with a gain setting that is applied to each of the respective amplified output channels (Quantity N) to adjust the audible output of one or more loudspeakers 204 being driven by a respective channel. For example, the average output level of the loudspeakers 204 in a listening space on different amplified output channels may be adjusted with the gain optimization block 226 so that the audible sound levels emanating from the loudspeakers 204 are perceived to be about the same at listening positions within the listening space. Where gain optimization is not desired, such as in a situation where the sound levels in the listening positions are perceived to be about the same without individual gain adjustment of the amplified output channels, the gain optimization block 226 may be omitted.

The audio signal processor 206 also may include a nonlinear processing block 228. The nonlinear processing block 228 may include a plurality of nonlinear processing blocks ($NL_1$-$NL_N$) that correspond to the quantity (N) of amplified output channels. The nonlinear processing blocks ($NL_1$-$NL_N$) 228 may be configured with limit settings based on the operational ranges of the loudspeakers 204, to manage distortion levels, power consumption, or any other system limitation(s) that warrants limiting the magnitude of the audio output signals on the amplified output channels. One function of the nonlinear processing block 228 may be to constrain the output voltage of the audio output signals. For example, the nonlinear processing block 228 may provide a hard-limit where the audio output signal is not allowed to exceed some user-defined level. The nonlinear processing block 228 may also constrain the output power of the audio output signals to some user-defined level. In addition, the nonlinear processing block 228 may use predetermined rules to dynamically manage the audio output signal levels. In the absence of a desire to limit the audio output signals, the nonlinear processing block 228 may be omitted.

The audio tuning system may operate in an efficiency mode when power consumption should be monitored or in a non-efficiency mode when power consumption is not at issue. In an example implementation, the audio system may permit the user to set levels of efficiency desired in the performance of the system. Efficiency may be set to a high priority, or to a desired power consumption level. The system may provide the user with the option to set a relative efficiency requirement, or a more direct requirement. A relative efficiency requirement instructs the audio system to limit power consumption relative to the environment. For example, the audio system may operate in an automobile and its power consumption may be limited relative to other systems that draw from the same power source. A more direct requirement may involve power limits that the audio system implements as part of performance optimization checks when determining optimal configuration settings. In another example, the efficiency optimization is automatically determined and power limits may be automatically imposed on the audio system.

In FIG. 2, the modules may operate and have corresponding operational parameters in a number of different power efficiency modes. Modules within the audio signal processor 206 that may be operated in different efficiency modes include the global equalization block 210, the steered channel equalization block 214, the bass management block 216, the bass managed equalization block 218, the crossover block 220, the channel equalization block 222, and the gain optimization block 226. Since each of these blocks have operational settings that affect the amount of power output on one or more audio channels, adjustment of the respective operational parameters of these blocks may change the overall power requirements of the audio system. Thus, one or more of these blocks may include different sets of operational parameters to coincide with different levels of desired power efficiency and desired acoustic performance. Although in some cases acoustic performance may be unaffected (or marginally affected) by adjustments in power consumption, in other cases, a trade off exists between optimizing for power consumption and optimizing for acoustic performance or audio sound quality. Thus, the audio system may be equipped with any number of power efficiency modes that provide differing balance between power efficiency and acoustic performance.

In FIG. 2, the modules of the audio signal processor 206 are illustrated in a specific configuration; however, any other configuration may be used in other examples. For example, any of the channel equalization blocks 222, the delay blocks 224, the gain blocks 226, and the nonlinear processing blocks 228 may be configured to receive the output from the crossover block 220. Although not illustrated, the audio signal processor 206 also may amplify the audio signals during processing with sufficient power to drive each transducer. In addition, although the various blocks are illustrated as separate blocks, the functionality of the illustrated blocks may be combined or expanded into multiple blocks in other examples.

Equalization with the equalization blocks, namely, the global equalization block 210, the steering channel equalization block 214, the bass managed equalization block 218, and the channel equalization block 222 may be developed using parametric equalization, or non-parametric equalization.

Parametric equalization is parameterized such that humans can intuitively adjust parameters of the resulting filters included in the equalization blocks. However, because of the parameterization, flexibility in the configuration of filters is lessened. Parametric equalization is a form of equalization that may utilize specific relationships of coefficients of a filter. For example, a bi-quad filter may be a filter implemented as a ratio of two second order polynomials. The specific relationship between coefficients may use the number of coefficients available, such as the six coefficients of a bi-quad filter, to implement a number of predetermined parameters. Predetermined parameters such as a center frequency, a bandwidth and a filter gain may be implemented while maintaining a predetermined out of band gain, such as an out of band gain of one.

Non-parametric equalization is computer generated filter parameters that directly use digital filter coefficients. Non-parametric equalization may be implemented in at least two ways, finite impulse response (FIR) and infinite impulse response (IIR) filters. Such digital coefficients may not be intuitively adjustable by humans, but flexibility in configuration of the filters is increased, allowing more complicated filter shapes to be implemented efficiently.

Non-parametric equalization may use the full flexibility of the coefficients of a filter, such as the six coefficients of a bi-quad filter, to derive a filter that best matches the response shape needed to correct a given frequency response magnitude or phase anomaly. If a more complex filter shape is desired, a higher order ratio of polynomials can be used. In one example, the higher order ratio of polynomials may be later broken up (factored) into bi-quad filters. Non-parametric design of these filters can be accomplished by several methods that include: the Method of Prony, Steiglitz-McBride iteration, the eigen-filter method or any other methods that yield best fit filter coefficients to an arbitrary frequency response (transfer function). These filters may include an all-pass characteristic where only the phase is modified and the magnitude is unity at all frequencies.

Figure 3:
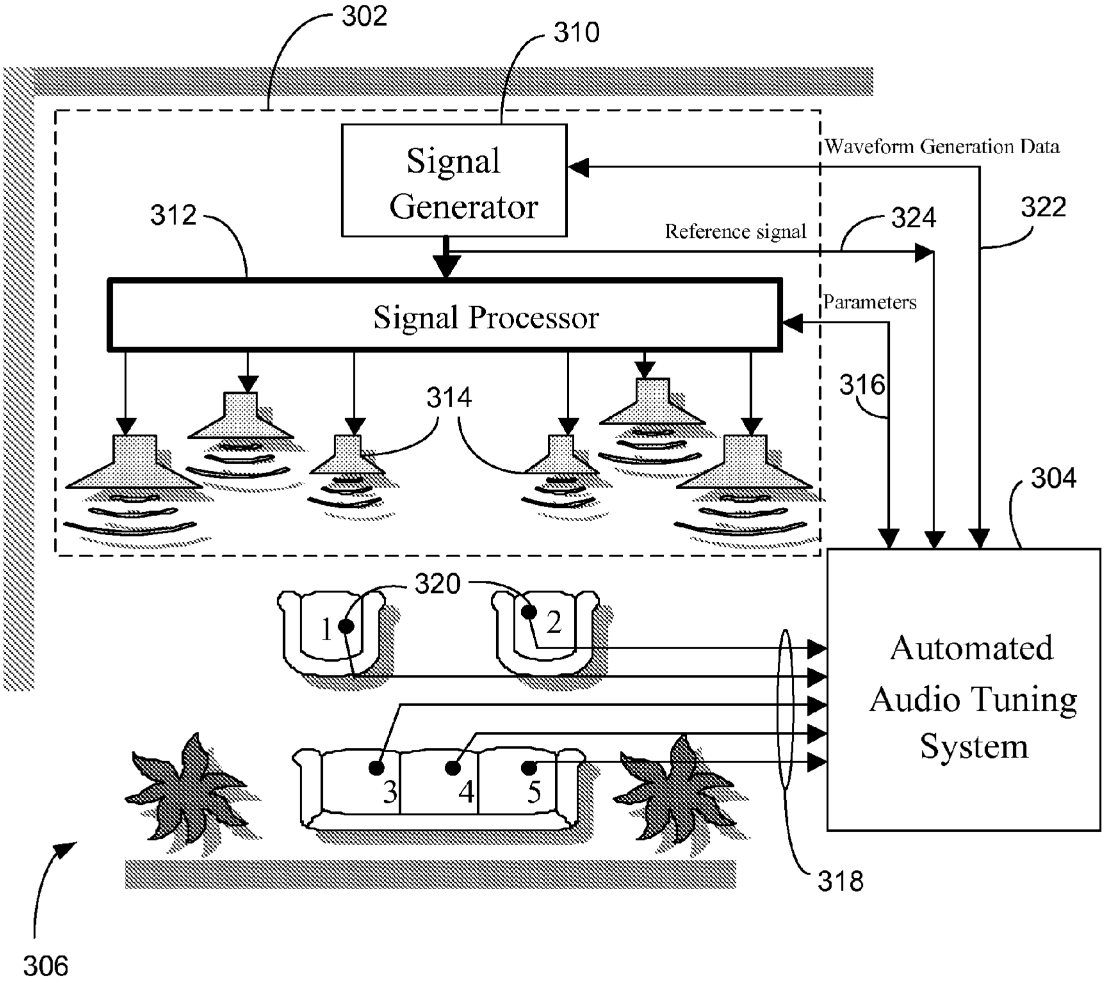
FIG. 3 is a schematic diagram of a listening space, the audio system of FIG. 1, and an example of an automated audio tuning system.

FIG. 3 depicts an example audio system 302 and an automated audio tuning system 304 included in a listening space 306. Although the illustrated listening space is a room, the listening space could be a vehicle, an outdoor area, or any other location where an audio system could be installed and operated. The automated audio tuning system 304 may be used for automated determination of the design parameters to tune a specific implementation of an audio system. Accordingly, the automated audio tuning system 304 includes an automated mechanism to set design parameters in the audio system 302.

The automated audio tuning system 304 may also include modes of operation that tune, or configure the system 304, to operate in accordance with a context for operation. A context of operation may relate to the listening environment for listeners in different positions in the listening area, or to any aspect of operation about which the user may want to have control. In example implementations, the automated audio system 304 includes at least one efficiency mode in which power consumption by the audio system 302 is monitored and may also be tuned to minimize the power consumption. The automated audio tuning system 304 may implement operation in different modes using the signal processor 312. The automated audio system 304 may include a general purpose processor configured to perform functions that do not specifically require signal processing, which includes setting system modes and controlling operation in accordance with the modes.

The audio system 302 may include any number of loudspeakers, signal processors, audio sources, etc. to create any form of audio, video, or any other type of multimedia system that generates audible sound. In addition, the audio system 302 also may be setup or installed in any desired configuration, and the configuration in FIG. 3 is only one of many possible configurations. In FIG. 3, for purposes of illustration, the audio system 302 is generally depicted as including a signal generator 310, a signal processor 312, and loudspeakers 314, however, any number of signal generation devices and signal processing devices, as well as any other related devices may be included in, and/or interfaced with, the audio system 302.

The automated audio tuning system 304 may be a separate stand alone system, or may be included as part of the audio system 302. The automated audio tuning system 304 may include any form of logic device, such as a processor, capable of executing instructions, receiving inputs and providing a user interface. In one example, the automated audio tuning system 304 may be implemented as a computer, such as a personal computer, that is configured to communicate with the audio system 302. The automated audio tuning system 304 may include memory, such as one or more volatile and/or non-volatile memory devices, configured to store instructions and/or data. The instructions may be executed within the automated audio tuning system 304 to perform automated tuning of an audio system. The executable code also may provide the functionality, user interface, etc., of the automated audio tuning system 304. The data may be parameters used/updated during processing, parameters generated/updated during processing, user entered variables, and/or any other information related to processing audio signals.

The automated audio tuning system 304 may allow the automated creation, manipulation and storage of design parameters used in the customization of the audio system 302. In addition, the customized configuration of the audio system 302 may be created, manipulated and stored in an automated fashion with the automated audio tuning system 304. Further, manual manipulation of the design parameters and configuration of the audio system 302 also may be performed by a user of the automated audio tuning system 304.

The automated audio tuning system 304 also may include input/output (I/O) capability. The I/O capability may include wireline and/or wireless data communication in serial or parallel with any form of analog or digital communication protocol. The I/O capability may include a parameters communication interface 316 for communication of design parameters and configurations between the automated audio tuning system 304 and the signal processor 312. The parameters communication interface 316 may allow download of design parameters and configurations to the signal processor 312. In addition, upload to the automated audio tuning system 304 of the design parameters and configuration currently being used by the signal processor may occur over the parameters communication interface 316.

The I/O capability of the automated audio tuning system 304 also may include at least one audio sensor interface 318, each coupled with an audio sensor 320, such as a microphone. In addition, the I/O capability of the automated tuning system 304 may include a waveform generation data interface 322, and a reference signal interface 324. The audio sensor interface 318 may provide the capability of the automated audio tuning system 304 to receive as input signals one or more audio input signals sensed in the listening space 306. In FIG. 3, the automated audio tuning system 304 receives five audio signals from five different listening positions within the listening space. In other examples, fewer or greater numbers of audio signals and/or listening positions may be used. For example, in the case of a vehicle, there may be four listening positions, and four audio sensors 320 may be used at each listening position. Alternatively, a single audio sensor 320 can be used, and moved among all listening positions. The automated audio tuning system 304 may use the audio signals to measure the actual, or in-situ, sound experienced at each of the listening positions.

The automated audio tuning system 304 may generate test signals directly, extract test signals from a storage device, or control an external signal generator to create test waveforms. In FIG. 3, the automated audio tuning system 304 may transmit waveform control signals over the waveform generation data interface 322 to the signal generator 310. Based on the waveform control signals, the signal generator 310 may output a test waveform to the signal processor 312 as an audio input signal. A test waveform reference signal produced by the signal generator 310 also may be output to the automated audio tuning system 304 via the reference signal interface 324. The test waveform may be one or more frequencies having a magnitude and bandwidth to fully exercise and/or test the operation of the audio system 302. In other examples, the audio system 302 may generate a test waveform from a compact disc, a memory, or any other storage media. In these examples, the test waveform may be provided to the automated audio tuning system 304 over the waveform generation interface 322.

In one example, the automated audio tuning system 304 may initiate or direct initiation of a reference waveform. The reference waveform may be processed by the signal processor 312 as an audio input signal and output on the amplified output channels as an audio output signal to drive the loudspeakers 314. The loudspeakers 314 may output an audible sound representative of the reference waveform. The audible sound may be sensed by the audio sensors 320, and provided to the automated audio tuning system 304 as input audio signals on the audio sensor interface 318. Each of the amplified output channels driving loudspeakers 314 may be driven, and the audible sound generated by loudspeakers 314 being driven may be sensed by the audio sensors 320.

In one example, the automated audio tuning system 304 is implemented in a personal computer (PC) that includes a sound card. The sound card may be used as part of the I/O capability of the automated audio tuning system 304 to receive the input audio signals from the audio sensors 320 on the audio sensor interface 318. In addition, the sound card may operate as a signal generator to generate a test waveform that is transmitted to the signal processor 312 as an audio input signal on the waveform generation interface 322. Thus, the signal generator 310 may be omitted. The sound card also may receive the test waveform as a reference signal on the reference signal interface 324. The sound card may be controlled by the PC, and provide all input information to the automated audio tuning system 304. Based on the I/O received/sent from the soundcard, the automated audio tuning system 304 may download/upload design parameters to/from the signal processor 312 over the parameters interface 316.

Using the audio input signal(s) and the reference signal, the automated audio tuning system 304 may automatically determine design parameters to be implemented in the signal processor 312. The automated audio tuning system 304 also may include a user interface that allows viewing, manipulation and editing of the design parameters. The user interface may include a display, and an input device, such as a keyboard, a mouse and or a touch screen. In addition, logic based rules and other design controls may be implemented and/or changed with the user interface of the automated audio tuning system 304. The automated audio tuning system 304 may include one or more graphical user interface screens, or some other form of display that allows viewing, manipulation and changes to the design parameters and configuration.

In general, example automated operation by the automated audio tuning system 304 to determine the design parameters for a specific audio system installed in a listening space may be preceded by entering the configuration of the audio system of interest and design parameters into the automated audio tuning system 304. Following entry of the configuration information and design parameters, the automated audio tuning system 304 may download the configuration information to the signal processor 312. The automated audio tuning system 304 may then perform automated tuning in a series of automated steps as described below to determine the design parameters.

Figure 4:
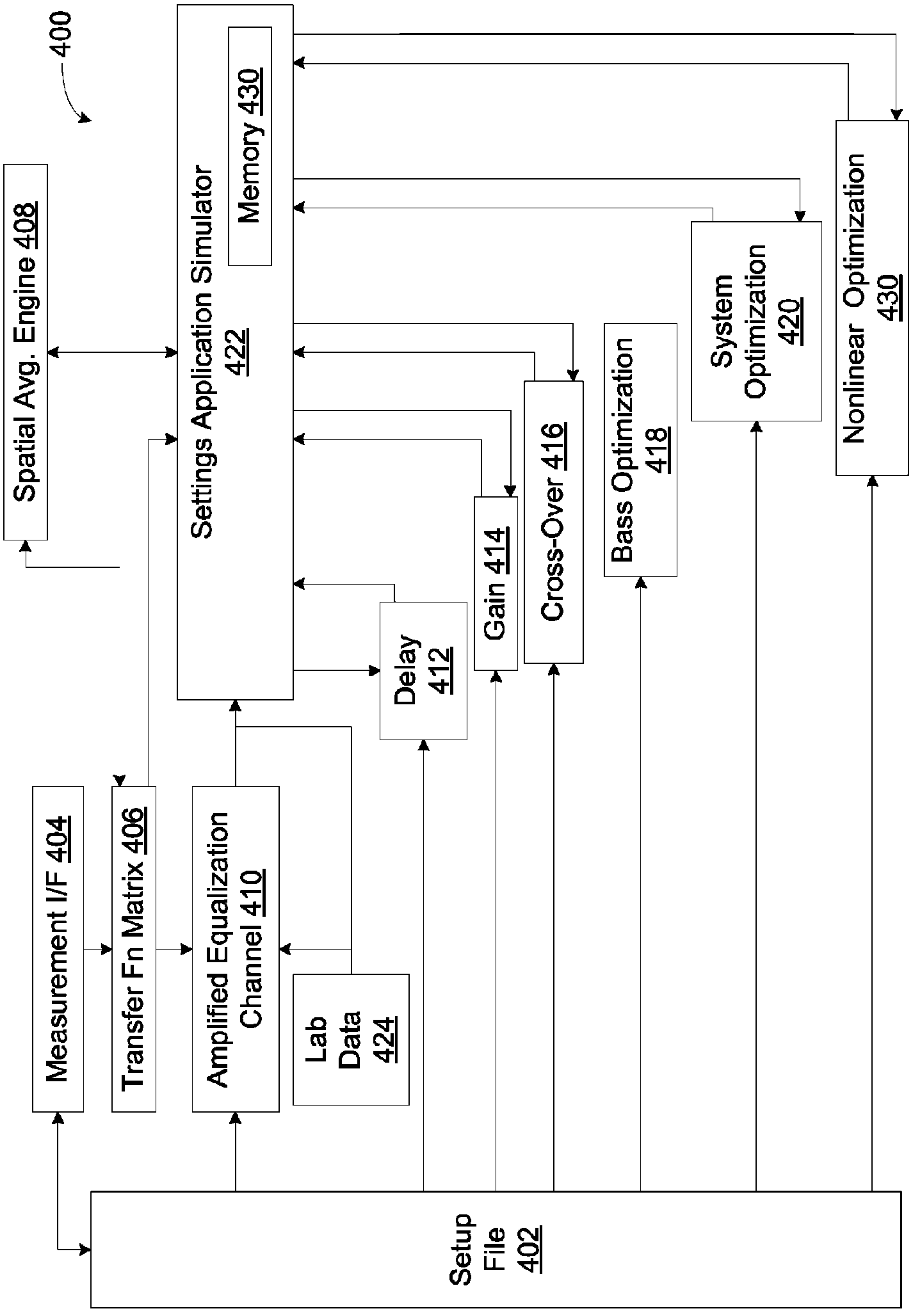
FIG. 4 is a block diagram of an automated audio tuning system.

FIG. 4 is a block diagram of an example automated audio tuning system 400. The automated audio tuning system 400 may include a setup file 402, a measurement interface 404, a transfer function matrix 406, a spatial averaging engine 408, an amplified channel equalization engine 410, a delay engine 412, a gain engine 414, a crossover engine 416, a bass optimization engine 418, a system optimization engine 420, a settings application simulator 422, lab data 424, and nonlinear optimization engine 430. In other examples, fewer or additional blocks may be used to describe the functionality of the automated audio tuning system 400.

The setup file 402 may be a file stored in memory. Alternatively, or in addition, the setup file 402 may be implemented in a graphical user interface as a receiver of information entered by an audio system designer. The setup file 402 may be configured by an audio system designer with configuration information to specify the particular audio system to be tuned, and design parameters related to the automated tuning process.

Automated operation of the automated audio tuning system 400 to determine the design parameters for a specific audio system installed in a listening space may be preceded by entering the configuration of the audio system of interest into the setup file 402. Configuration information and settings may include, for example, the number of transducers, impedance curves of the transducers, the number of listening locations, the number of input audio signals, the number of output audio signals, the processing to obtain the output audio signals from the input audio signals, (such as stereo signals to surround signals) and/or any other audio system specific information useful to perform automated configuration of design parameters. In addition, configuration information in the setup file 402 may include design parameters such as constraints, weighting factors, automated tuning parameters, determined variables, etc., that are determined by the audio system designer. In an example implementation, the setup file 402 includes efficiency mode parameter values, which include values of some or all of the parameters configured for non-efficiency mode operation in addition to any parameters configured for efficiency mode operation.

For example, a weighting factor may be determined for each listening location with respect to the installed audio system. The weighting factor may be determined by an audio system designer based on a relative importance of each listening location. For example, in a vehicle, the driver listen location may have a highest weighting factor. The front passenger listening location may have a next highest weighting factor, and the rear passengers may have a lower weighting factor. The weighting factor may be entered into a weighting matrix included in the setup file 402 using the user interface. Further, example configuration information may include entry of information for the limiter and the gain blocks, or any other information related to any aspect of automated tuning of audio systems. An example listing of configuration information for an example setup file is included as Appendix A. In other examples, the setup file may include additional or less configuration information.

In addition to definition of the audio system architecture and configuration of the design parameters, channel mapping of the input channels, steered channels, and amplified output channels may be performed with the setup file 402. In addition, any other configuration information may be provided in the setup file 402 as previously and later discussed. Following download of the setup information into the audio system to be tuned over the parameter interface 316 (FIG. 3), setup, calibration and measurement with audio sensors 320 (FIG. 3) of the audible sound output by the audio system to be tuned may be performed.

The measurement interface 404 may receive and/or process input audio signals provided from the audio system being tuned. The measurement interface 404 may receive signals from audio sensors, the reference signals and the waveform generation data previously discussed with reference to FIG. 3. The received signals representative of response data of the loudspeakers may be stored in the transfer function matrix 406.

The transfer function matrix 406 may be a multi-dimensional response matrix containing response related information. In one example, the transfer function matrix 406, or response matrix, may be a three-dimensional response matrix that includes the number of audio sensors, the number of amplified output channels, and the transfer functions descriptive of the output of the audio system received by each of the audio sensors. The transfer functions may be the impulse response or complex frequency response measured by the audio sensors. The lab data 424 may be measured loudspeaker transfer functions (loudspeaker response data) for the loudspeakers in the audio system to be tuned. The loudspeaker response data may have been measured and collected in listening space that is a laboratory environment, such as an anechoic chamber. The lab data 424 may be stored in the form of a multi-dimensional response matrix containing response related information. In one example, the lab data 424 may be a three-dimensional response matrix similar to the transfer function matrix 406.

Figure 5:
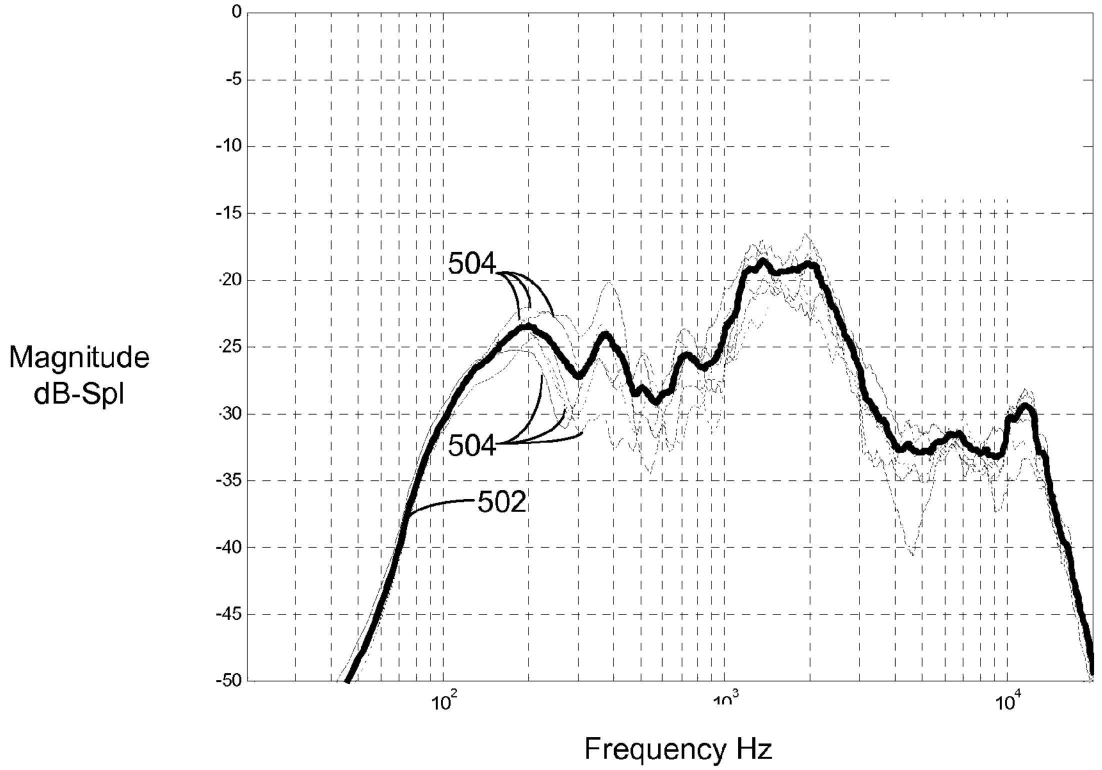
FIG. 5 is an impulse response diagram illustrating spatial averaging.

The spatial averaging engine 408 may be executed to compress the transfer function matrix 406 by averaging one or more of the dimensions in the transfer function matrix 406. For example, in the described three-dimensional response matrix, the spatial averaging engine 408 may be executed to average the audio sensors and compress the response matrix to a two-dimensional response matrix. FIG. 5 illustrates an example of spatial averaging to reduce impulse responses from six audio sensor signals 502 to a single spatially averaged response 504 across a range of frequencies. Spatial averaging by the spatial averaging engine 408 also may include applying the weighting factors. The weighting factors may be applied during generation of the spatially averaged responses to weight, or emphasize, identified ones of the impulse responses being spatially averaged based on the weighting factors. The compressed transfer function matrix may be generated by the spatial averaging engine 408 and stored in a memory 432 of the settings application simulator 422.

In FIG. 4, the amplified channel equalization engine 410 may be executed to generate channel equalization settings for the channel equalization block 222 of FIG. 2. The channel equalization settings generated by the amplified channel equalization engine 410 may correct the response of a loudspeaker or group of loudspeakers that are on the same amplified output channel in an effort to reach a target acoustic response. These loudspeakers may be individual, passively crossed over, or separately actively crossed-over. The response of these loudspeakers, irrespective of the listening space, may not be optimal and may require response correction.

Figure 6:
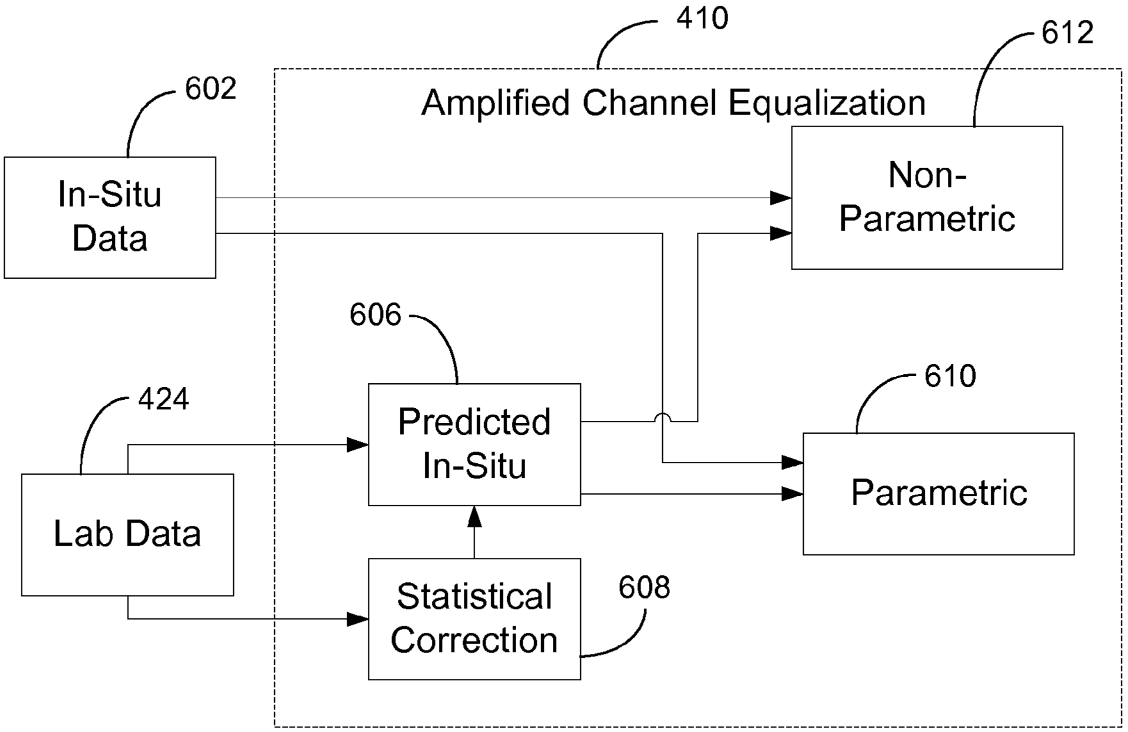
FIG. 6 is a block diagram of an example amplified channel equalization engine that may be included in the automated audio tuning system of FIG. 4.

FIG. 6 is a block diagram of an example amplified channel equalization engine 410, in-situ data 602, and lab data 424. The amplified channel equalization engine 410 may include a predicted in-situ module 606, a statistical correction module 608, a parametric engine 610, and a non-parametric engine 612. In other examples, the functionality of the amplified channel equalization engine 410 may be described with fewer or additional blocks.

The in-situ data 602 may be representative of actual measured loudspeaker transfer functions in the form of complex frequency responses or impulse responses for each amplified audio channel of an audio system to be tuned. The in-situ data 602 may include measured audible output from the audio system when the audio system is installed in the listening space in a desired configuration. Using the audio sensors, the in-situ data may be captured and stored in the transfer function matrix 406 (FIG. 4). In one example, the in-situ data 602 is the compressed transfer function matrix stored in the memory 432. Alternatively, as discussed later, the in-situ data 602 may be a simulation that includes data representative of the response data with generated and/or determined settings applied to the audio system. The lab data 424 may be loudspeaker transfer functions (loudspeaker response data) measured in a laboratory environment for the loudspeakers in the audio system to be tuned.

Automated correction with the amplified channel equalization engine 410 of each of the amplified output channels in an effort to achieve a target acoustic response may be based on the in-situ data 602 and/or the lab data 424. Thus, use by the amplified channel equalization engine 410 of in-situ data 602, lab data 424 or some combination of both in-situ data 602 and lab data 424 is configurable by an audio system designer in the setup file 402 (FIG. 4).

Generation of channel equalization settings to correct the response of the loudspeakers toward the target acoustic response may be performed with the parametric engine 610 or the non-parametric engine 612, or a combination of both the parametric engine 610 and the non-parametric engine 612. A setting in the setup file 402 (FIG. 4) may be used to designate whether the channel equalization settings should be generated with the parametric engine 610, the non-parametric engine 612, or some combination of parametric engine 610 and non-parametric engine 612. For example, the setup file 402 (FIG. 2) may designate the number of parametric filters, and the number of non-parametric filters to be included in the channel equalization block 222 (FIG. 2).

A system consisting of loudspeakers can only perform as well as the loudspeakers that make up the system. The amplified channel equalization engine 410 may use information about the performance of a loudspeaker in-situ, or in a lab environment, to correct or minimize the effect of irregularities in the response of the loudspeaker in view of the target acoustic response.

Channel equalization settings generated based on the lab data 424 may include processing with the predicted in-situ module 606. Since the lab-based loudspeaker performance is not from the in-situ listening space in which the loudspeaker will be operated, the predicted in-situ module 606 may generate a predicted in-situ response. The predicted in-situ response may be based on previously defined parameters in the setup file 402. For example, a user or designer may create a computer model of the loudspeaker(s) in the intended environment or listening space. The computer model may be used to predict the frequency response that would be measured at each sensor location. This computer model may include important aspects to the design of the audio system. In one example, those aspects that are considered unimportant may be omitted. The predicted frequency response information of each of the loudspeaker(s) may be spatially averaged across sensors in the predicted in-situ module 606 as an approximation of the response that is expected in the listening environment. The computer model may use the finite element method, the boundary element method, ray tracing or any other method of simulating the acoustic performance of a loudspeaker or set of loudspeakers in an environment.

Based on the predicted in-situ response, the parametric engine 610 and/or the non-parametric engine 612 may generate channel equalization settings to compensate for correctable irregularities in the loudspeakers based on the target acoustic response. The actual measured in-situ response may not be used since the in-situ response may obscure the actual response of the loudspeaker. The predicted in-situ response may include only factors that modify the performance of the speaker(s) by introducing a change in acoustic radiation impedance. For example, a factor(s) may be included in the in-situ response in the case where the loudspeaker is to be placed near a boundary.

In order to obtain satisfactory results with the predicted in-situ response generated by the parametric engine 610 and/or the non-parametric engine 612, the loudspeakers should be designed to give optimal anechoic performance before being subjected to the listening space. In some listening spaces, compensation may be unnecessary for optimal performance of the loudspeakers, and generation of the channel equalization settings may not be necessary. The channel equalization settings generated by the parametric engine 610 and/or the non-parametric engine 612 may be applied in the channel equalization block 222 (FIG. 2). Thus, the signal modifications due to the channel equalization settings may affect a single loudspeaker or a (passively or actively) filtered array of loudspeakers.

In addition, statistical correction may be applied to the predicted in-situ response by the statistical correction module 608 based on analysis of the lab data 424 (FIG. 4) and/or any other information included in the setup file 402 (FIG. 4). The statistical correction module 608 may generate correction of a predicted in-situ response on a statistical basis using data stored in the setup file 402 that is related to the loudspeakers used in the audio system. For example, a resonance due to diaphragm break up in a loudspeaker may be dependent on the particulars of the material properties of the diaphragm and the variations in such material properties. In addition, manufacturing variations of other components and adhesives in the loudspeaker, and variations due to design and process tolerances during manufacture can affect performance. Statistical information obtained from quality testing/checking of individual loudspeakers may be stored in the lab data 424 (FIG. 4). Such information may be used by the statistical correction module 608 to further correct the response of the loudspeakers based on these known variations in the components and manufacturing processes. Targeted response correction may enable correction of the response of the loudspeaker to account for changes made to the design and/or manufacturing process of a loudspeaker.

In another example, statistical correction of the predicted in-situ response of a loudspeaker also may be performed by the statistical correction module 608 based on end of assembly line testing of the loudspeakers. In some instances, an audio system in a listening space, such as a vehicle, may be tuned with a given set of optimal speakers, or with an unknown set of loudspeakers that are in the listening space at the time of tuning Due to statistical variations in the loudspeakers, such tuning may be optimized for the particular listening space, but not for other loudspeakers of the same model in the same listening space. For example, in a particular set of speakers in a vehicle, a resonance may occur at 1 kHz with a magnitude and filter bandwidth (Q) of three and a peak of 6 dB. In other loudspeakers of the same model, the occurrence of the resonance may vary over ⅓ octave, Q may vary from 2.5 to 3.5, and peak magnitude may vary from 4 to 8 dB. Such variation in the occurrence of the resonance may be provided as information in the lab data 424 (FIG. 4) for use by the amplified channel equalization engine 410 to statistically correct the predicted in-situ-response of the loudspeakers.

The predicted in-situ response data or the in-situ data 602 may be used by either the parametric engine 610 or the non-parametric engine 612. The parametric engine 610 may be executed to obtain a bandwidth of interest from the response data stored in the transfer function matrix 406 (FIG. 4). Within the bandwidth of interest, the parametric engine 610 may scan the magnitude of a frequency response for peaks. The parametric engine 610 may identify the peak with the greatest magnitude and calculate the best fit parameters of a parametric equalization (e.g. center frequency, magnitude and Q) with respect to this peak. The best fit filter may be applied to the response in a simulation and the process may be repeated by the parametric engine 610 until there are no peaks greater than a specified minimum peak magnitude, such as 2 dB, or a specified maximum number of filters are used, such as two. The minimum peak magnitude and maximum number of filters may be specified by a system designer in the setup file 402 (FIG. 4).

The parametric engine 610 may use the weighted average across audio sensors of a particular loudspeaker, or set of loudspeakers, to treat resonances and/or other response anomalies with filters, such as parametric notch filters. For example, a center frequency, magnitude and filter bandwidth (Q) of the parametric notch filters may be generated. Notch filters may be minimum phase filters that are designed to give an optimal response in the listening space by treating frequency response anomalies that may be created when the loudspeakers are driven.

The non-parametric engine 612 may use the weighted average across audio sensors of a particular loudspeaker, or set of loudspeakers, to treat resonances and other response anomalies with filters, such as bi-quad filters. The coefficients of the bi-quad filters may be computed to provide an optimal fit to the frequency response anomaly(s). Non-parametrically derived filters can provide a more closely tailored fit when compared to parametric filters since non-parametric filters can include more complex frequency response shapes than can traditional parametric notch filters. The disadvantage to these filters is that they are not intuitively adjustable as they do not have parameters such as center frequency, Q and magnitude.

The parametric engine 610 and/or the non-parametric engine 612 may analyze the influence that each loudspeaker plays in the in-situ or lab response, not complex interactions between multiple loudspeakers producing the same frequency range. In many cases, the parametric engine 610 and/or the non-parametric engine 612 may determine that it is desirable to filter the response somewhat outside the bandwidth in which the loudspeaker operates. This would be the case if, for example, a resonance occurs at one half octave above the specified low pass frequency of a given loudspeaker, as this resonance could be audible and could cause difficulty with crossover summation. In another example, the amplified channel equalization engine 410 may determine that filtering one octave below the specified high pass frequency of a loudspeaker and one octave above the specified low pass frequency of the loudspeaker may provide better results than filtering only to the band edges.

The selection of the filtering by the parametric engine 610 and/or the non-parametric engine 612 may be constrained with information included in the setup file 402 or based on a power efficiency weighting factor. Constraining of parameters of the filter optimization (not only frequency) may be important to the performance of the amplified channel equalization engine 410 in terms of optimization of power consumption, resource allocation and system performance. Allowing the parametric engine 610 and/or the non-parametric engine 612 to select any unconstrained value could cause the amplified channel equalization engine 410 to generate an undesirable filter, such as a filter with very high positive gain values resulting in significant power consumption as well as the possibility of distortion or stability issues. In one example, the setup file 402 may include information to constrain the gain generated with the parametric engine 610 to a determined range, such as within −12 dB and +6 dB. In another example, a sliding scale of gain limits may be imposed based on the power efficiency weighting factor. Alternatively, or in addition the setup file 402 may include, or the power efficiency weighting factor may be implemented to invoke, a determined range to constrain generation of the magnitude and filter bandwidth (Q), such as within a range of about 0.5 to about 5 for example.

The minimum gain of a filter also may be set as an additional parameter in the setup file 402. The minimum gain may be set at a determined value such as 2 dB. Thus, any filter that has been calculated by the parametric engine 610 and/or the non-parametric engine 612 with a gain of less than 2 dB may be removed and not downloaded to the audio system being tuned. In addition, generation of a maximum number of filters by the parametric engine 610 and/or the non-parametric engine 612 may be specified in the setup file 402 to optimize system performance. The minimum gain setting may enable further advances in system performance when the parametric engine 610 and/or the non-parametric engine 612 generate the maximum number of filters specified in the setup file 402 and then remove some of the generated filters based on the minimum gain setting. When considering removal of a filter, the parametric and/or non-parametric engines 610 and 612 may consider the minimum gain setting of the filter in conjunction with the Q of the filter to determine the psychoacoustic importance of that filter in the audio system. Such removal considerations of a filter may be based on a predetermined threshold, such as a ratio of the minimum gain setting and the Q of the filter, a range of acceptable values of Q for a given gain setting of the filter, and/or a range of acceptable gain for a given Q of the filter. For example, if the Q of the filter is very low, such as 1, a 2 dB magnitude of gain in the filter can have a significant effect on the timber of the audio system, and the filter should not be deleted. The predetermined threshold may be included in the setup file 402 (FIG. 4).

Different power efficiency weighting factors may be used to create one or more sets of operational parameters in the form of channel equalization settings based on a target acoustic response. The channel equalization settings may be in the form of filters having filter design parameters. The amplified channel equalization engine 410 may use impedance data of the loudspeakers from the setup file 402 to determine the effect of channel equalization settings on operational power consumption of the respective loudspeakers. Based on the respective efficiency weighting factor being used to create the channel equalization settings, the amplified channel equalization engine 410 may adjust the equalization settings for one or more of the channels. Thus, if a power efficiency weighting factor is being used that favors minimization of power consumption, channel equalization settings such as gain values may be reduced at some frequency and increased at other frequencies in order to minimize power consumption, while still achieving a target acoustic response from the audio system. In other examples, Q, ranges of frequency being equalized, or any other operational parameters related to equalization may be adjusted by the amplified channel equalization engine 410 as a function of the power efficiency weighting parameters. The amplified channel equalization engine 410 may balance desired acoustic performance of the audio system to achieve a target acoustic response with desired limitations in the power consumed by the amplifier to drive the loudspeakers based on the power efficiency weighting factor.

For example, if the power efficiency weighting factor is a value between one and ten with ten being maximum power efficiency, at a value of one, the amplified channel equalization engine 410 may ignore power consumption and generate channel equalization settings to optimize acoustic performance of the loudspeakers. At a power efficiency weighting factor of ten, on the other hand, significant changes to channel equalization settings optimizing acoustic performance may occur in order to minimize power consumption, while still providing acceptable levels of performance of the audio system. Similarly, at a power efficiency weighting factor of five, the amplified channel equalization engine may compromise between power consumption and acoustic performance.

The level of energy consumption by the amplifier in driving the loudspeakers, and therefore power efficiency may be determined by the amplified channel equalization engine 410 based on the impedance of the loudspeakers. In other examples, any other loss of power in the audio system may be considered. The impedance data of the loudspeakers may be obtained by the amplified channel equalization engine 410 from impedance curves foe each of the respective loudspeakers. The impedance curves may be stored in the setup file 402. Alternatively, or in addition, the amplified channel equalization engine 410 may calculate impedance data for the loudspeakers. Calculation of the impedance data may be based on actual measured values, such as a magnitude of current and voltage being supplied, or projected to be supplied to the loudspeakers (V=R*I). Based on the voltage and current included in the audio signal driving one or more respective loudspeakers, and the impedance data of the one or more loudspeakers, the amplified channel equalization engine 410, may adjust the equalization settings and determine a corresponding change in power consumption by one or more loudspeakers. Using these techniques, the amplified channel equalization engine 410 may iteratively adjust the equalization settings to fit within a desired level of power consumption while still optimizing acoustic performance in view of the target acoustic response and within the constraints imposed by the power efficiency weighting factor.

In FIG. 4, the channel equalization settings generated with the amplified channel equalization engine 410 may be provided to the settings application simulator 422. The settings application simulator 422 may include the memory 432 in which the equalization settings may be stored. The setting application simulator 422 also may be executable to apply the channel equalization settings to the response data included in the transfer function matrix 406. The response data that has been equalized with the channel equalization settings also may be stored in the memory 432 as a simulation of equalized channel response data. In addition, any other settings generated with the automated audio tuning system 400 may be applied to the response data to simulate the operation of the audio system with the generated channel equalization settings applied. Further, settings included in the setup file 402 may be applied to the response data based on a simulation schedule to generate a channel equalization simulation.

The simulation schedule may be included in the setup file 402. The simulation schedule designates the generated and predetermined settings used to generate a particular simulation with the settings application simulator 422. As the settings are generated by the engines in the automated audio tuning system 400, the settings application simulator 422 may generate simulations identified in the simulation schedule. For example, the simulation schedule may indicate a simulation of the response data from the transfer function matrix 406 with the equalization settings applied thereto is desired. Thus, upon receipt of the equalization settings, the settings application simulator 422 may apply the equalization settings to the response data and store the resulting simulation in the memory 432.

The simulation of the equalized response data may be available for use in the generation of other settings in the automated audio tuning system 400. Such simulations of the equalized response data may also be performed for the operational parameters associated with each of the efficiency weighting factors. In that regard, the setup file 402 also may include an order table that designates an order, or sequence in which the various settings are generated by the automated audio tuning system 400. A generation sequence may be designated in the order table. The sequence may be designated so that generated settings used in simulations upon which it is desired to base generation of another group of generated settings may be generated and stored by the settings application simulator 422. In other words, the order table may designate the order of generation of settings and corresponding simulations so that settings generated based on simulation with other generated settings are available. For example, the simulation of the equalized channel response data may be provided to the delay engine 412. Alternatively, where channel equalization settings are not desired, the response data may be provided without adjustment to the delay engine 412. In still another example, any other simulation that includes generated settings and/or determined settings as directed by the audio system designer may be provided to the delay engine 412.

The delay engine 412 may be executed to determine and generate an optimal delay for selected loudspeakers. The delay engine 412 may obtain the simulated response of each audio input channel from a simulation stored in the memory 432 of the settings application simulator 422, or may obtain the response data from the transfer function matrix 406. By comparison of each audio input signal to the reference waveform, the delay engine 412 may determine and generate delay settings. Alternatively, where delay settings are not desired, the delay engine 412 may be omitted.

Figure 7:
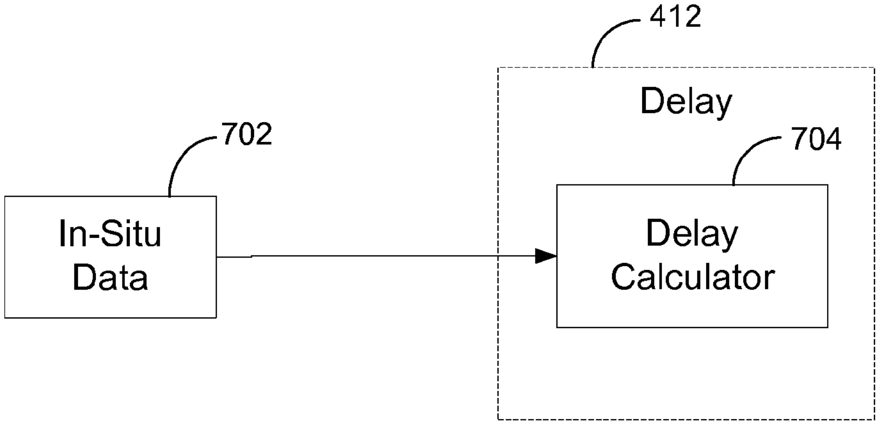
FIG. 7 is a block diagram of an example delay engine that may be included in the automated audio tuning system of FIG. 4.

FIG. 7 is a block diagram of an example delay engine 412 and in-situ data 702. The delay engine 412 includes a delay calculator module 704. Delay values may be computed and generated by the delay calculator module 704 based on the in-situ data 702. The in-situ data 702 may be the response data included in the transfer function matrix 406. Alternatively, the in-situ data 702 may be simulation data stored in the memory 432. (FIG. 4).

The delay values may be generated by the delay calculator module 704 for selected ones of the amplified output channels. The delay calculator module 704 may locate the leading edge of the measured audio input signals and the leading edge of the reference waveform. The leading edge of the measured audio input signals may be the point where the response rises out of the noise floor. Based on the difference between the leading edge of the reference waveform and the leading edge of measured audio input signals, the delay calculator module 704 may calculate the actual delay.

Figure 8:
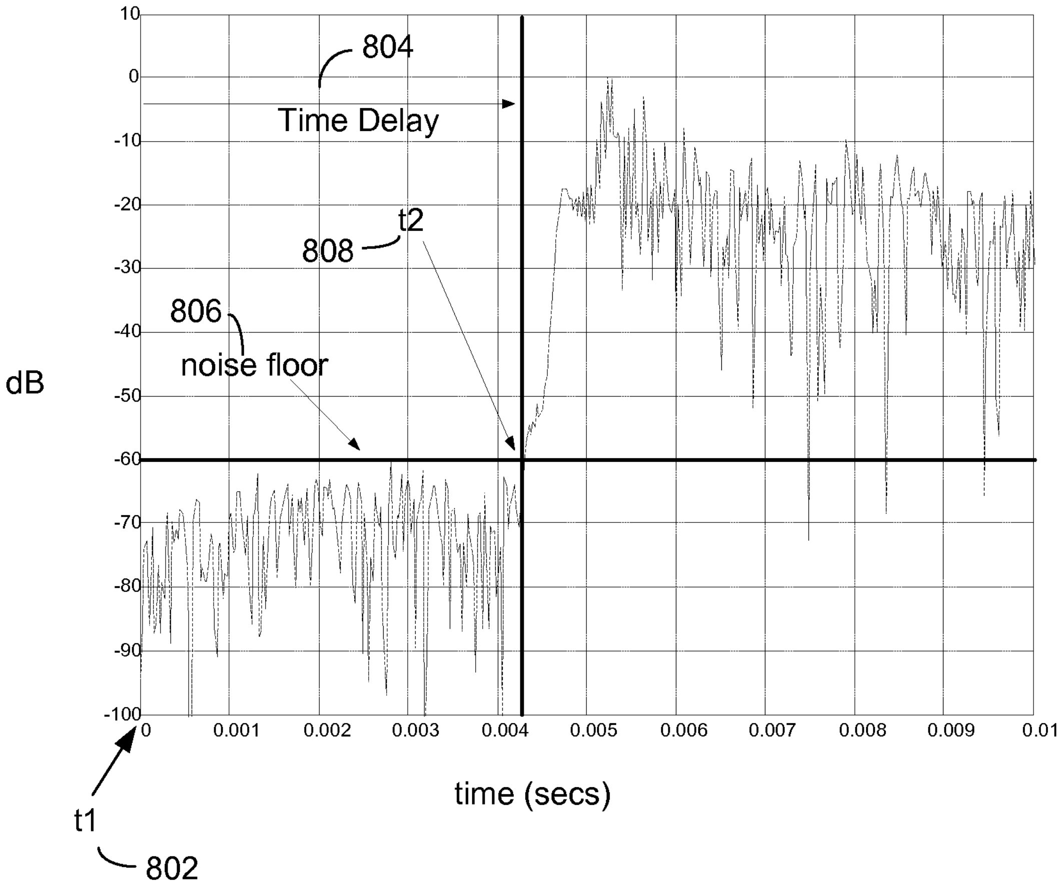
FIG. 8 is an impulse response diagram illustrating time delay.

FIG. 8 is an example impulse response illustrating testing to determine the arrival time of an audible sound at an audio sensing device, such as a microphone. At a time point (t1) 802, which equals zero seconds, the audible signal is provided to the audio system to be output by a loudspeaker. During a time delay period 804, the audible signal received by the audio sensing device is below a noise floor 806. The noise floor 806 may be a determined value included in the setup file 402 (FIG. 4). The received audible sound emerges from the noise floor 806 at a time point (t2) 808. The time between the time point (t1) 802 and the time point (t2) 808 is determined by the delay calculator module 704 as the actual delay. In FIG. 8, the noise floor 806 of the system is 60 dB below the maximum level of the impulse and the time delay is about 4.2 ms.

The actual delay is the amount of time the audio signal takes to pass through all electronics, the loudspeaker and air to reach the observation point. The actual time delay may be used for proper alignment of crossovers and for optimal spatial imaging of audible sound produced by the audio system being tuned. Different actual time delay may be present depending on which listening location in a listening space is measured with an audio sensing device. A single sensing device may be used by the delay calculator module 704 to calculate the actual delay. Alternatively, the delay calculator module 704 may average the actual time delay of two or more audio sensing devices located in different locations in a listening space, such as around a listeners head.

Based on the calculated actual delay, the delay calculator module 704 may assign weightings to the delay values for selected ones of the amplified output channels based on the weighting factors included in the setup file 402 (FIG. 4). The resulting delay settings generated by the delay calculator module 704 may be a weighted average of the delay values to each audio sensing device. Thus, the delay calculator module 704 may calculate and generate the arrival delay of audio output signals on each of the amplified audio channels to reach the respective one or more listening locations. Additional delay may be desired on some amplified output channels to provide for proper spatial impression. For example, in a multi-channel audio system with rear surround speakers, additional delay may be added to the amplified output channels driving the front loudspeakers so that the direct audible sound from the rear surround loudspeakers reaches a listener nearer the front loudspeakers at the same time.

In FIG. 4, the delay settings generated with the delay engine 412 may be provided to the settings application simulator 422. The settings application simulator 422 may store the delay settings in the memory 432. In addition, the settings application simulator 422 may generate a simulation using the delay settings in accordance with the simulation schedule included in the setup file 402. For example, the simulation schedule may indicate that a delay simulation that applies the delay settings to the equalized response data is desired. In this example, the equalized response data simulation may be extracted from the memory 432 and the delay settings applied thereto. Alternatively, where equalization settings were not generated and stored in the memory 432, the delay settings may be applied to the response data included in the transfer function matrix 406 in accordance with a delay simulation indicated in the simulation schedule. The delay simulation also may be stored in the memory 432 for use by other engines in the automated audio tuning system. For example, the delay simulation may be provided to the gain engine 414.

The gain engine 414 may be executable to generate gain settings for the amplified output channels. The gain engine 414, as indicated in the setup file 402, may obtain a simulation from the memory 432 upon which to base generation of gain settings. Alternatively, per the setup file 402, the gain engine 414 may obtain the responses from the transfer function matrix 406 in order to generate gain settings. The gain engine 414 may individually optimize the output on each of the amplified output channels. The output of the amplified output channels may be selectively adjusted by the gain engine 414 in accordance with the weighting specified in the settings file 402.

Figure 9:
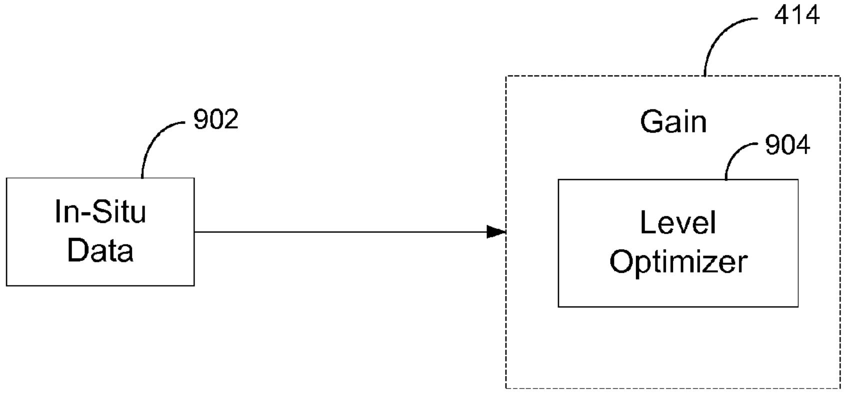
FIG. 9 is a block diagram of an example gain engine that may be included in the automated audio tuning system of FIG. 4.

FIG. 9 is a block diagram of an example gain engine 414 and in-situ data 902. The in-situ data 902 may be response data from the transfer function matrix 406 that has been spatially averaged by the spatial averaging engine 408. Alternatively, the in-situ data 902 may be a simulation stored in the memory 432 that includes the spatially averaged response data with generated or determined settings applied thereto. In one example, the in-situ data 902 is the channel equalization simulation that was generated by the settings application simulator 422 based on the channel equalization settings stored in the memory 432.

The gain engine 414 includes a level optimizer module 904. The level optimizer module 904 may be executable to determine and store an average output level over a determined bandwidth of each amplified output channel based on the in-situ data 902. The stored average output levels may be compared to each other, and adjusted to achieve a desired level of audio output signal on each of the amplified audio channels.

The level optimizer module 904 may generate offset values such that certain amplified output channels have more or less gain than other amplified output channels. These values can be entered into a table included in the setup file 402 so that the gain engine can directly compensate the computed gain values. For example, an audio system designer may desire that the rear speakers in a vehicle with surround sound need to have increased signal level when compared to the front speakers due to the noise level of the vehicle when traveling on a road. Accordingly, the audio system designer may enter a determined value, such as +3 dB, into a table for the respective amplified output channels. In response, the level optimizer module 904, when the gain setting for those amplified output channels is generated, may add an additional 3 dB of gain to the generated values.

The gain engine 414 may also derive different gain values based on application of different power efficiency weighting factors. For example, the gain generated and applied by the gain engine 414 may be correspondingly reduced for power efficiency weighting factors indicating increased emphasis on minimizing power consumption. The gain engine 414 may utilize loudspeaker impedance data of the loudspeakers to ascertain the impact on power consumption of reductions in the gain applied to the amplified output channels in order to balance acoustic performance based on the target acoustic response and power consumption. Thus, operational parameters such as sets of the gain values generated and entered in the table included in the setup file 402 may be associated with different power efficiency weighting factors.

In FIG. 4, the gain settings generated with the gain engine 414 may be provided to the settings application simulator 422. The settings application simulator 422 may store the gain settings in the memory 432. In addition, the settings application simulator 422 may, for example, apply the gain settings to the equalized or not, delayed or not, response data to generate a gain simulation. In other example gain simulations, any other settings generated with the automated audio tuning system 400, or present in the setup file 402 may be applied to the response data to simulate the operation of the audio system with the gain settings applied thereto. A simulation representative of the response data, with the equalized and/or delayed response data (if present), or any other settings, applied thereto may be extracted from the memory 432 and the gain settings applied. Such simulations may also be performed for the operational parameters associated with each of the efficiency weighting factors. Alternatively, where equalization settings were not generated and stored in the memory 432, the gain settings may be applied to the response data included in the transfer function matrix 406 to generate the gain simulation. The gain simulation also may be stored in the memory 432.

The crossover engine 416 may be cooperatively operable with one or more other engines in the automated audio tuning system 10. Alternatively, the crossover engine 416 may be a standalone automated tuning system, or be operable with only select ones of the other engines, such as the amplified channel equalization engine 410 and/or the delay engine 412. The crossover engine 416 may be executable to selectively generate crossover settings for selected amplifier output channels. The crossover settings may include optimal slope and crossover frequencies for high-pass and low-pass filters selectively applied to at least two of the amplified output channels. The crossover engine 416 may generate crossover settings for groups of amplified audio channels that maximize the total energy produced by the combined output of loudspeakers operable on the respective amplified output channels in the group. The loudspeakers may be operable in at least partially different frequency ranges. The crossover engine 416 may also generate crossover settings that maximize total energy output by the combined output of the loudspeakers while minimizing the electrical power that the audio amplifier must deliver to achieve the target acoustic output. The crossover engine 416 includes a crossover optimizer, which determines any number of sets of operational parameters in the form of crossover parameters that achieve a highest level of acoustic performance based on the target acoustic performance as constrained by limits regarding the level of power consumption. Depending on the power efficiency weighting factor in effect, the operational parameter set may be the set of crossover parameters providing optimized acoustic performance (without regard to maximal total energy from the sum of loudspeakers) or it may be the set of crossover parameters providing the lowest overall power required from the amplifier to achieve the target acoustic response.

For example, crossover settings may be generated with the crossover engine 416 for a first amplified output channel driving a relatively high frequency loudspeaker, such as a tweeter, and a second amplified output channel driving a relatively low frequency loudspeaker, such as a woofer. In this example, the crossover engine 416 may determine a crossover point that maximizes the combined total response of the two loudspeakers. Thus, the crossover engine 416 may generate crossover settings that result in application of an optimal high pass filter to the first amplified output channel, and an optimal low pass filter to the second amplified output channel based on optimization of the total energy generated from the combination of both loudspeakers. The crossover settings may adjust the optimal high pass filter and optimal low pass filter to limit total power input when it is desired to optimize efficiency. In other examples, crossovers for any number of amplified output channels and corresponding loudspeakers of various frequency ranges may be generated by the crossover engine 416.

In another example, when the crossover engine 416 is operable as a standalone audio tuning system, the response matrix, such as the in-situ and lab response matrix may be omitted. Instead, the crossover engine 416 may operate with a setup file 402, a signal generator 310 (FIG. 3) and an audio sensor 320 (FIG. 3). In this example, a reference waveform may be generated with the signal generator 310 to drive a first amplified output channel driving a relatively high frequency loudspeaker, such as a tweeter, and a second amplified output channel driving a relatively low frequency loudspeaker, such as a woofer. A response of the operating combination of the loudspeakers may be received by the audio sensor 320. The crossover engine 416 may generate a crossover setting based on the sensed response. The crossover setting may be applied to the first and second amplified output channels. This process may be repeated and the crossover point (crossover settings) moved until the maximal total energy from both of the loudspeakers is sensed with the audio sensor 320.

The crossover engine 416 may determine the crossover settings based on initial values entered in the setup file 402. The initial values for band limiting filters may be approximate values that provide loudspeaker protection, such as tweeter high pass filter values for one amplified output channel and subwoofer low pass filter values for another amplified output channel. In addition, not to exceed limits, such as a number of frequencies and slopes (e.g. five frequencies, and three slopes) to be used during automated optimization by the crossover engine 416 may be specified in the setup file 402. Further, limits on the amount of change allowed for a given design parameter may be specified in the setup file 402. Using response data and the information from the setup file 402, the crossover engine 416 may be executed to generate crossover settings.

Figure 10:
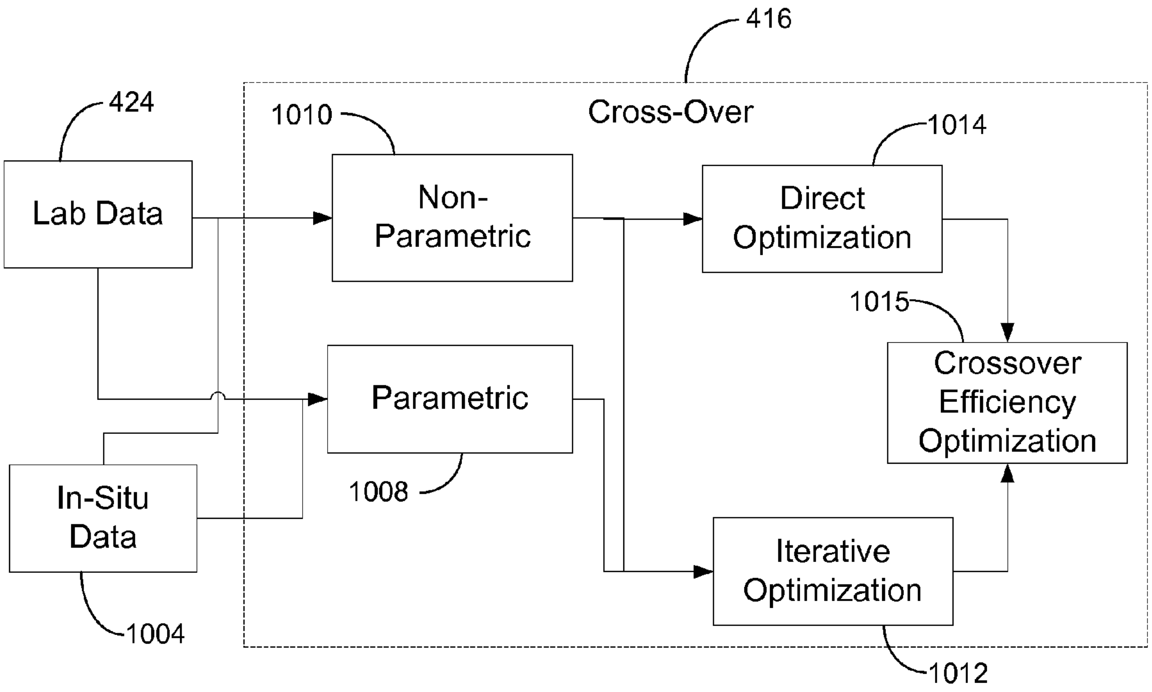
FIG. 10 is a block diagram of an example crossover engine that may be included in the automated audio tuning system of FIG. 4.

FIG. 10 is a block diagram of an example of the crossover engine 416, lab data 424 (FIG. 4), and in-situ data 1004. The lab data 424 may be measured loudspeaker transfer functions (loudspeaker response data) that were measured and collected in a laboratory environment for the loudspeakers in the audio system to be tuned. In another example, the lab data 424 may be omitted. The in-situ data 1004 may be measure response data, such as the response data stored in the transfer function matrix 406 (FIG. 4). Alternatively, the in-situ data 1004 may be a simulation generated by the settings application simulator 422 and stored in the memory 432. In one example, a simulation with the delaying settings applied is used as the in-situ data 1004. Since the phase of the response data may be used to determine crossover settings, the response data may not be spatially averaged.

The crossover engine 416 may include a parametric engine 1008 and a non-parametric engine 1010. Accordingly, the crossover engine 416 may selectively generate crossover settings for the amplified output channels with the parametric engine 1008 or the non-parametric engine 1010, or a combination of both the parametric engine 1008 and the non-parametric engine 1010. In other examples, the crossover engine 416 may include only the parametric engine 1008, or the non-parametric engine 1010. An audio system designer may designate in the setup file 402 (FIG. 4) whether the crossover settings should be generated with the parametric engine 1008, the non-parametric engine 1010, or some combination thereof. For example, the audio system designer may designate in the setup file 402 (FIG. 4) the number of parametric filters, and the number of non-parametric filters to be included in the crossover block 220 (FIG. 2).

The parametric engine 1008 or the non-parametric engine 1010 may use either the lab data 424, and/or the in-situ data 1004 to generate the crossover settings. Use of the lab data 424 or the in-situ data 1004 may be designated by an audio system designer in the setup file 402 (FIG. 4). Following entry of initial values for band-limiting filters (where needed) and the user specified limits, the crossover engine 416 may be executed for automated processing. The initial values and the limits may be entered into the setup file 402, and downloaded to the signal processor prior to collecting the response data.

The crossover engine 416 also may include an iterative optimization engine 1012 and a direct optimization engine 1014. In other examples, the crossover engine 416 may include only the iterative optimization engine 1012 or the direct optimization engine 1014. The iterative optimization engine 1012 or the direct optimization engine 1014 may be executed to determine and generate one or more optimal crossovers for at least two amplified output channel. Designation of which optimization engine will be used may be set by an audio system designer with an optimization engine setting in the setup file. An optimal crossover may be one where the combined response of the loudspeakers on two or more amplified output channels subject to the crossover are about −6 dB at the crossover frequency and the phase of each speaker is about equal at that frequency. This type of crossover may be called a Linkwitz-Riley filter. The optimization of a crossover may require that the phase response of each of the loudspeakers involved have a specific phase characteristic. In other words, the phase of a low passed loudspeaker and the phase of a high passed loudspeaker may be sufficiently equal to provide summation.

The phase alignment of different loudspeakers on two or more different amplified audio channels using crossovers may be achieved with the crossover engine 416 in multiple ways. Example methods for generating the desired crossovers may include iterative crossover optimization and direct crossover optimization.

Iterative crossover optimization with the iterative optimization engine 1012 may involve the use of a numerical optimizer to manipulate the specified high pass and low pass filters as applied in a simulation to the weighted acoustic measurements over the range of constraints specified by the audio system designer in the setup file 402. The optimal response may be the one determined by the iterative optimization engine 1012 as the response with the best summation. The optimal response is characterized by a solution where the sum of the magnitudes of the input audio signals (time domain) driving at least two loudspeakers operating on at least two different amplified output channels is equal to the complex sum (frequency domain), indicating that the phase of the loudspeaker responses are sufficiently optimal over the crossover range.

Complex results may be computed by the iterative optimization engine 1012 for the summation of any number of amplified audio channels having complimentary high pass/low pass filters that form a crossover. The iterative optimization engine 1012 may score the results by overall output and how well the amplifier output channels sum as well as variation from audio sensing device to audio sensing device. A "perfect" score may yield six dB of summation of the responses at the crossover frequency while maintaining the output levels of the individual channels outside the overlap region at all audio sensing locations. The complete set of scores may be weighted by the weighting factors included in the setup file 402 (FIG. 4). In addition, the set of scores may be ranked by a linear combination of output, summation and variation.

To perform the iterative analysis, the iterative optimization engine 1012 may generate a first set of filter parameters, or crossover settings. The generated crossover settings may be provided to the setting application simulator 422. The setting application simulator 422 may simulate application of the crossover settings to two or more loudspeakers on two or more respective audio output channels of the simulation previously used by the iterative optimization engine 1012 to generate the settings. A simulation of the combined total response of the corresponding loudspeakers with the crossover settings applied may be provided back to the iterative optimization engine 1012 to generate a next iteration of crossover settings. This process may be repeated iteratively until the sum of the magnitudes of the input audio signals that is closest to the complex sum is found.

The iterative optimization engine 1012 also may return a ranked list of filter parameters. By default, the highest ranking set of crossover settings may be used for each of the two or more respective amplified audio channels. The ranked list may be retained and stored in the setup file 402 (FIG. 4). In cases where the highest ranking crossover settings are not optimal based on subjective listening tests, lower ranked crossover settings may be substituted. If the ranked list of filtered parameters is completed without crossover settings to smooth the response of each individual amplified output channel, additional design parameters for filters can be applied to all the amplified output channels involved to preserve phase relationships. Alternatively, an iterative process of further optimizing crossovers settings after the crossover settings determined by the iterative optimization engine 1012 may be applied by the iterative optimization engine 1012 to further refine the filters.

Using iterative crossover optimization, the iterative optimization engine 1012 may manipulate the cutoff frequency, slope and Q for the high pass and low pass filters generated with the parametric engine 1008. Additionally, the iterative optimization engine 1012 may use a delay modifier to slightly modify the delay of one or more of the loudspeakers being crossed, if needed, to achieve optimal phase alignment. As previously discussed, the filter parameters provided with the parametric engine 1008 may be constrained with determined values in the setup file 402 (FIG. 4) such that the iterative optimization engine 1012 manipulates the values within a specified range.

Such constraints may be necessary to ensure the protection of some loudspeakers, such as small speakers where the high pass frequency and slope need to be generated to protect the loudspeaker from mechanical damage. For example, for a 1 kHz desired crossover, the constraints might be ⅓ octave above and below this point. The slope may be constrained to be 12 dB/octave to 24 dB/octave and Q may be constrained to 0.5 to 1.0. Other constraint parameters and/or ranges also may be specified depending on the audio system being tuned. In another example, a 24 dB/octave filter at 1 kHz with a Q=0.7 may be required to adequately protect a tweeter loudspeaker. Also, constraints may be specified by an audio system designer to allow the iterative optimization engine 1012 to only increase or decrease parameters, such as constraints to increase frequency, increase slope, or decrease Q from the values generated with the parametric engine 1008 to ensure that the loudspeaker is protected.

A more direct method of crossover optimization is to directly calculate the transfer function of the filters for each of the two or more amplified output channels to optimally filter the loudspeaker for "ideal" crossover with the direct optimization engine 1014. The transfer functions generated with the direct optimization engine 1014 may be synthesized using the non-parametric engine 1010 that operates similar to the previously described non-parametric engine 612 (FIG. 6) of the amplified channel equalization engine 410 (FIG. 4). Alternatively, the direct optimization engine 1014 may use the parametric engine 1008 to generate the optimum transfer functions. The resulting transfer functions may include the correct magnitude and phase response to optimally match the response of a Linkwitz-Riley, Butterworth or other desired filter type.

The crossover engine 416 may also include a crossover efficiency optimization module 1015. The crossover efficiency optimization module 1015 may determine whether the resulting crossover settings exceed or conform to any power limitations, such as for example, any power limitations set in accordance with the power efficiency weighting factor. The crossover efficiency optimization module 1015 may receive performance optimized crossover settings from either the direct optimization engine 1014 or from the iterative optimization engine 1012. In addition, the crossover efficiency module 1015 may obtain or determine impedance data for the loudspeakers such as stored predetermined impedance curve, or actual voltage magnitude and current magnitude information. Since loudspeakers power consumption is minimized at resonance, adjustment of the operational parameters used to create the crossover settings may change the amount of power consumed. The crossover efficiency optimization module 1015 may adjust the crossover frequency by adjusting the operational parameters, or filter design parameters, of high pass and low pass filters to identify power consumption at different crossover frequency locations based on the loudspeaker impedance data. Since some loudspeakers are more efficient than others, for example, a sub woofer is typically more efficient than a mid range loudspeaker, by simply adjusting the crossover frequency, power consumption by the amplifier can be minimized.

Based on the identified crossover frequencies, and the target acoustic response, the crossover efficiency optimization module 1015 may select different crossover frequency setting points as a function of the power efficiency weighting factor to achieve the target acoustic performance. Accordingly, a set of crossover settings may be generated that are each associated with a power efficiency weighting factor to obtain a sliding scale of balance between power consumption and acoustic performance.

In addition, or alternatively, the crossover efficiency optimization module 1015 may add constraints to the parameters used, or determine power consumption estimates for several generated crossover settings. For example, the crossover efficiency optimization module 1015 may provide a power metric to each of the ranked filter parameters and inform the user of the ranked list to enable the user to select a set of ranked filter parameters. The power metric may correspond to one of the power efficiency weighting factors such that a set of efficiency optimized crossover settings may be ranked in order of efficiency and/or performance.

Figure 11:
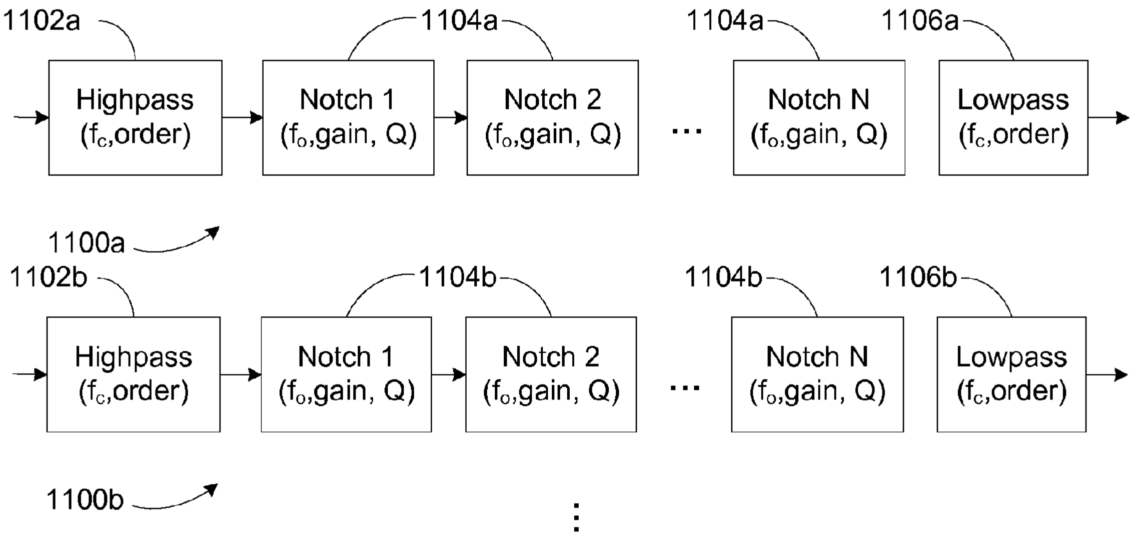
FIG. 11 is a block diagram of an example of a chain of parametric crossover and notch filters that may be generated with the automated audio tuning system of FIG. 4.

FIG. 11 is an example of filter block that may be generated by the automated audio tuning system for implementation in an audio system. The filter block is implemented as a first filter bank 1100*a* with a processing chain that includes a high-pass filter 1102*a*, N-number of notch filters 1104*a*, and a low-pass filter 1106*a*. The filter block may also include a second filter bank 1100*b* with a processing chain that includes a second high-pass filter 1102*b*, N-number of notch filters 1104*b*, and a low-pass filter 1106*b*. The second filter bank 1100*b* may be generated to optimize the audio system within predetermined power limitations. The second filter bank 1100*b* may be one of a set of efficiency optimized filter banks generated to provide a user with different configurations having varying power efficiency settings (efficiency weighting factors) from which to choose. The filters may be generated with the automated audio tuning system based on either in-situ data, or lab data 424 (FIG. 4). In example implementations, only the high and low pass filters 1102 and 1106 may be generated.

In FIG. 11, the filter design parameters for the high-pass and low-pass filters 1102*a,b* and 1106*a,b* include the cutoff frequencies (fc) and the order (or slope) of each filter. The high-pass filters 1102*a,b* and the low-pass filters 1106*a,b* may be generated with the parametric engine 1008 and iterative optimization engine 1012 (FIG. 10) included in the crossover engine 416. When the audio system is operating in a power efficiency mode, the high-pass filters and low-pass filters may be modified in accordance with power limitations set by the power efficiency mode using the crossover efficiency optimization module 1015 described above with reference to FIG. 10. The high-pass filters 1102*a,b* and the low-pass filters 1106*a,b* may be implemented in the crossover block 220 (FIG. 2) on a first and second audio output channel of an audio system being tuned. The high-pass and low-pass filters 1102*a,b* and 1106*a,b* may limit the respective audio signals on the first and second output channels to a determined frequency range, such as the optimum frequency range of a respective loudspeaker being driven by the respective amplified output channel, as previously discussed.

The notch filters 1104*a,b* may attenuate the audio input signal over a determined frequency range. The filter design parameters for the notch filters 1104*a,b* may each include an attenuation gain (gain), a center frequency (f0), and a quality factor (Q). The N-number of notch filters 1104*a,b* may be channel equalization filters generated with the parametric engine 610 (FIG. 6) of the amplified channel equalization engine 410. The notch filters 1104 may be implemented in the channel equalization block 222 (FIG. 2) of an audio system. The notch filters 1104*a,b* may be used to compensate for imperfections in the loudspeaker and compensate for room acoustics as previously discussed.

All of the filters of FIG. 11 may be generated with automated parametric equalization as requested by the audio system designer in the setup file 402 (FIG. 4). Thus, the filters depicted in FIG. 11 represent a completely parametric optimally placed signal chain of filters. Accordingly, the filter design parameters may be intuitively adjusted by an audio system designer following generation. In addition, any number of different sets of filters may be generated to correspond to different efficiency weighting factors.

Figure 12:
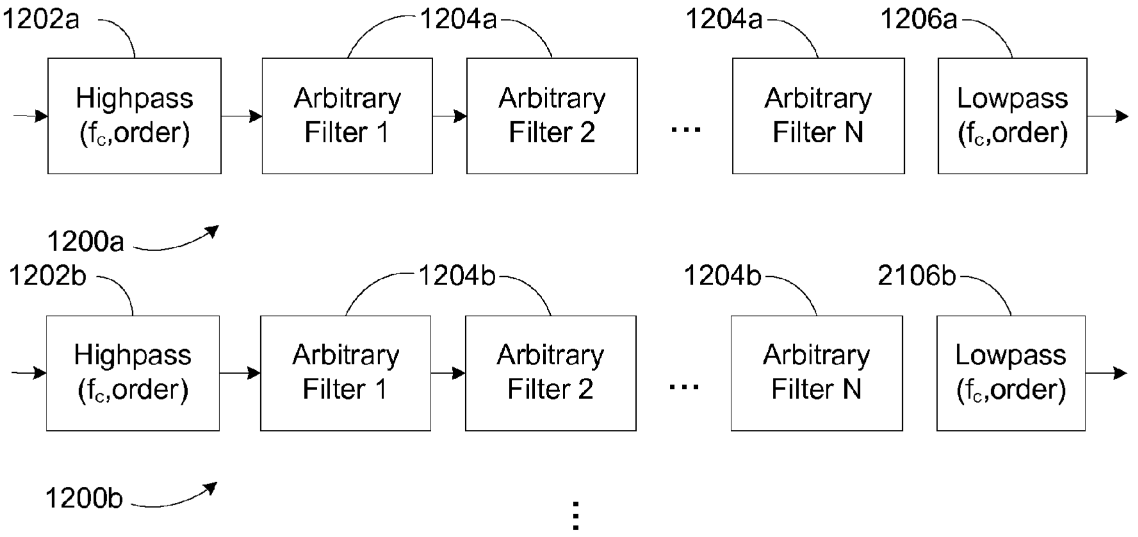
FIG. 12 is a block diagram of an example of a plurality of parametric crossover filters, and non-parametric arbitrary filters that may be generated with the automated audio tuning system of FIG. 4.

FIG. 12 is another example filter block that maybe generated by the automated audio tuning system for implementation in an audio system. The filter block of FIG. 12 may provide a more flexibly designed filter processing chain. In FIG. 12, the filter block includes a first filter chain 1200*a* that includes a high-pass filter 1202*a*, a low pass filter 1204*a* and a plurality (N) of arbitrary filters 1206*a* between the high pass and low pass filters 1202*a*, 1204*a*. The filter block also includes a second filter chain 1200*b* that includes a high-pass filter 1202*b*, a low pass filter 1204*b* and a plurality (N) of arbitrary filters 1206*b* between the high pass and low pass filters 1202*b*, 1204*b*. The second filter chain 1200*b* may be generated to optimize the audio system within predetermined power limitations. The high-pass filters 1202*a,b* and the low-pass filters 1204*a,b* may be configured as a crossover to limit audio signals on respective amplified output channels to an optimum range for respective loudspeakers being driven by the respective amplified audio channel on which the respective audio signals are provided. In this example, the high-pass filters 1202*a,b* and the low pass filter 1204*a,b* are generated with the parametric engine 1008 (FIG. 10) to include the filter design parameters of the cutoff frequencies (fc) and the order (or slope). Thus, the filter design parameters for the crossover settings are intuitively adjustable by an audio system designer.

The arbitrary filters 1206*a,b* may be any form of filter, such as a biquad or a second order digital IIR filter. A cascade of second order IIR filters may be used to compensate for imperfections in a loudspeaker and also to compensate for room acoustics, as previously discussed. The filter design parameters of the arbitrary filters 1206*a,b* may be generated with the non-parametric engine 612 using either in-situ data 602 or lab data 424 (FIG. 4) as arbitrary values that allow significantly more flexibility in shaping the filters, but are not as intuitively adjustable by an audio system designer.

Figure 13:
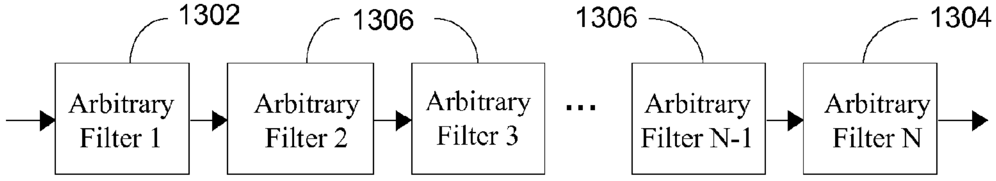
FIG. 13 is a block diagram of an example of a plurality of arbitrary filters that may be generated with the automated audio tuning system of FIG. 4.

FIG. 13 is another example filter block that may be generated by the automated audio tuning system for implementation in an audio system. In FIG. 13, a cascade of arbitrary filters is depicted that includes a high pass filter 1302, a low pass filter 1304 and a plurality of channel equalization filters 1306. The high pass filter 1302 and the low pass filter 1304 may be generated with the non-parametric engine 1010 (FIG.

10) and used in the crossover block 220 (FIG. 2) of an audio system. The channel equalization filters 1306 may be generated with the non-parametric engine 612 (FIG. 6) and used in the channel equalization block 222 (FIG. 2) of an audio system. Since the filter design parameters are arbitrary, adjustment of the filters by an audio system designer would not be intuitive, however, the shape of the filters could be better customized for the specific audio system being tuned to meet the target acoustic response while still coming within power efficiency requirement dictated by a power efficiency weighting factor.

In FIG. 4, the bass optimization engine 418 may be executed to optimize summation of audible low frequency sound waves in the listening space. All amplified output channels that include loudspeakers that are designated in the setup file 402 as being "bass producing" low frequency speakers may be tuned at the same time with the bass optimization engine 418 to ensure that they are operating in optimal relative phase to one another. Low frequency producing loudspeakers may be those loudspeakers operating below 400 Hz. Alternatively, low frequency producing loudspeakers may be those loudspeakers operating below 150 Hz, or between 0 Hz and 150 Hz. The bass optimization engine 418 may be a stand alone automated audio system tuning system that includes the setup file 402 and a response matrix, such as the transfer function matrix 406 and/or the lab data 424. Alternatively, the bass optimization engine 418 may be cooperatively operative with one or more of the other engines, such as with the delay engine 412 and/or the crossover engine 416.

The bass optimization engine 418 generates filter design parameters for at least two selected amplified audio channels that result in respective phase modifying filters. A phase modifying filter may be designed to provide a phase shift of an amount equal to the difference in phase between loudspeakers that are operating in the same frequency range. The phase modifying filters may be separately implemented in the bass managed equalization block 218 (FIG. 2) on two or more different selected amplified output channels. The phase modifying filters may different for different selected amplified output channels depending on the magnitude of phase modification that is desired. Accordingly, a phase modifying filter implemented on one of the selected amplified output channels may provide a phase modification that is significantly larger with respect to a phase modifying filter implemented on another of the selected amplified output channels.

The bass optimization engine 418 may also calculate the power consumption during the optimization process for the phase modifying filters. Calculation of power consumption may be based on impedance data of the loudspeakers to be driven by audio signals subject to phase modification with the phase modifying filters, and performance related data, such as actual or simulated complex response curves of the loudspeakers. The optimization may be weighted based on different power efficiency weighting factors to develop operational parameters, such as filter design parameters for any number of different sets of phase modifying filters. For example, a first set of phase modifying filters may have filter design parameters favoring the lowest power consumption solution, a second set of phase modifying filters may have filter design parameters favoring the optimum phase summation of audible bass sound at one or more listening positions, and any number of other sets of phase modifying filters may have filter design parameters favoring points in-between.

Although phase shifting using all pass filters, for example, does not directly consume power, constructive combination of audible sound emitted by multiple loudspeakers results in increased sound pressure levels (SPL) in a listening space. Out of phase audible sound from different respective loudspeakers, on the other hand, may result in some amount of destructive combination (cancellation) of audible sound emitted by the multiple loudspeakers. Thus, depending on the relative phase of the audio signals, the SPL at a listening position may be higher or lower. If cancellation is minimized, the power output by the amplifier to drive the loudspeakers in order to achieve a desired level of SPL may be lower. However, minimization of cancellation may not result in optimized acoustic performance with respect to a target acoustic response. Thus, the bass optimization engine 418 may generate sets of phase modifying filters associated with respective power efficiency weighting factors to create a balance between acoustic performance to meet a target acoustic response, and power efficiency.

Figure 14:
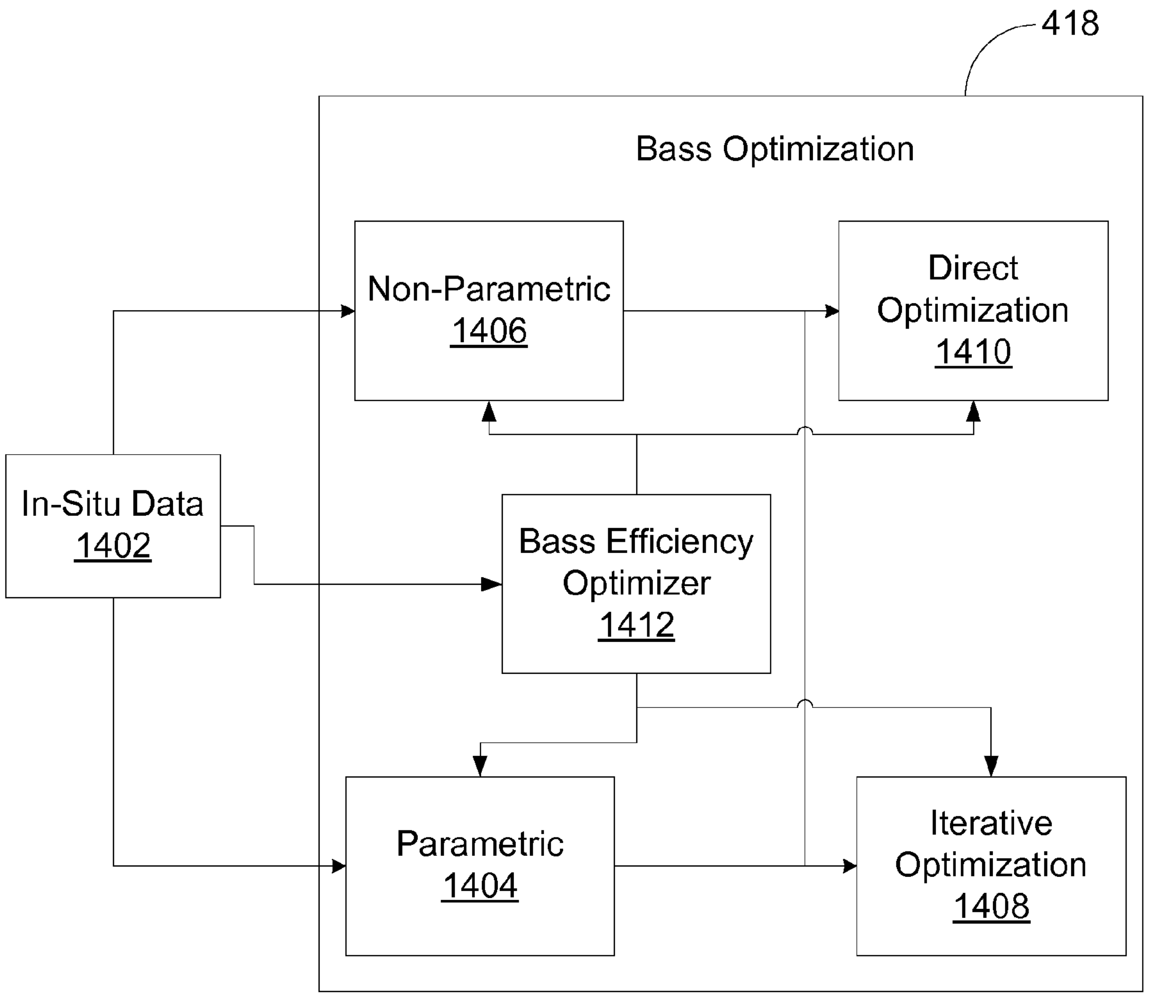
FIG. 14 is a block diagram of an example bass optimization engine that may be included in the automated audio tuning system of FIG. 4.

FIG. 14 is a block diagram that includes the bass optimization engine 418, and in-situ data 1402. The in-situ data 1402 may include response data from the transfer function matrix 406. Alternatively, the in-situ data 1402 may be a simulation that may include the response data from the transfer function matrix 406 with generated or determined settings applied thereto. As previously discussed, the simulation may be generated with the settings application simulator 422 based on a simulation schedule, and stored in memory 432 (FIG. 4).

The bass optimization engine 418 may include a parametric engine 1404 and a non-parametric engine 1406. In other examples, the bass optimization engine may include only the parametric engine 1404 or the non-parametric engine 1406. Bass optimization settings may be selectively generated for the amplified output channels with the parametric engine 1404 or the non-parametric engine 1406, or a combination of both the parametric engine 1404 and the non-parametric engine 1406. Bass optimization settings generated with the parametric engine 1404 may be in the form of filter design parameters that synthesize parametric all-pass filter for each of the selected amplified output channels. Bass optimization settings generated with the non-parametric engine 1406, on the other hand, may be in the form of filter design parameters that synthesize an arbitrary all-pass filter, such as an IIR or FIR all-pass filter for each of the selected amplified output channels.

The bass optimization engine 418 also may include an iterative bass optimization engine 1408, a direct bass optimization engine 1410, and a bass efficiency optimizer 1412. In other examples, the bass optimization engine may include only the iterative bass optimization engine 1408 or the direct bass optimization engine 1410, and the bass efficiency optimizer 1412. The iterative bass optimization engine 1408 may be executable to compute, at each iteration, weighted spatial averages across audio sensing devices of the summation of the bass devices specified. As parameters are iteratively modified, the relative magnitude and phase response of the individual loudspeakers or pairs of loudspeakers on each of the selected respective amplified output channels may be altered, resulting in alteration of the complex summation.

The target for optimization by the bass optimization engine 418 may be to achieve maximal summation of the low frequency audible signals from the different loudspeakers within a frequency range at which audible signals from different loudspeakers overlap. The target may be the summation of the magnitudes (time domain) of each loudspeaker involved in the optimization. The test function may be the complex summation of the audible signals from the same loudspeakers based on a simulation that includes the response data from the transfer function matrix 406 (FIG. 4). Thus, the bass optimization settings may be iteratively provided to the settings application simulator 422 (FIG. 4) for iterative simulated application to the selected group of amplified audio output channels and respective loudspeakers. The resulting simulation, with the bass optimization settings applied, may be used by the bass optimization engine 418 to determine the next iteration of bass optimization settings. Weighting factors also may be applied to the simulation by the direct bass optimization engine 1410 to apply priority to one or more listening positions in the listening space. As the simulated test data approaches the target, the summation may be optimal. The bass optimization may terminate with the best possible solution within constraints specified in the setup file 402 (FIG. 4).

Alternatively, the direct bass optimization engine 1410 may be executed to compute and generate the bass optimization settings. The direct bass optimization engine 1410 may directly calculate and generate the transfer function of filters that provide optimal summation of the audible low frequency signals from the various bass producing devices in the audio system indicated in the setup file 402. The generated filters may be designed to have all-pass magnitude response characteristics, and to provide a phase shift for audio signals on respective amplified output channels that may provide maximal energy, on average, across the audio sensor locations. Weighting factors also may be applied to the audio sensor locations by the direct bass optimization engine 1410 to apply priority to one or more listening positions in a listening space.

When the audio system is operating in an efficiency mode, the optimization settings determined by the system may be weighted towards a solution that has lower power consumption versus optimal acoustic performance. The configuration may still include parametric and/or non-parametric all-pass filters (phase modifying filters). However, the specific design of those filters may differ when optimized when efficiency is to be considered. The bass efficiency optimizer 1412 takes in acoustic and electrical responses from the in-situ data 1402, and applies adjustments to the filter design parameters generated with the parametric engine 1404 and the non-parametric engine 1406 to produce an optimal balance of efficiency and acoustic performance of one or more bass producing devices (woofers) included in the audio system. The filters that produce the greatest acoustic performance may not have the lowest power consumption and a solution may exist that has only slightly poorer acoustic performance, but significantly lower power consumption (higher efficiency).

In addition or alternatively, the bass efficiency optimizer 1412 may adjust the iterative optimization engine 1408 such that a target for optimization may be a balance between achieving maximal summation of the low frequency audible signals from the different loudspeakers and optimizing power consumption. The bass efficiency optimizer 1412 may also provide adjustment of the direct optimization engine generation of the transfer function of filters to provide balance between power consumption and optimal summation of the audible low frequency signals from the various bass producing devices in the audio system.

In FIG. 4, the optimal bass optimization settings generated with the bass optimization engine 418 may be identified to the settings application simulator 422. Since the settings application simulator 422 may store all of the iterations of the bass optimization settings in the memory 432, the optimum settings may be indicated in the memory 432. In addition, the settings application simulator 422 may generate one or more simulations that include application of the bass optimization settings to the response data, other generated settings and/or determined settings as directed by the simulation schedule stored in the setup file 402. The bass optimization simulation(s) may be stored in the memory 432, and may, for example, be provided to the system optimization engine 420.

The system optimization engine 420 may use a simulation that includes the response data, one or more of the generated settings, and/or the determined settings in the setup file 402 to generate group equalization settings to optimize groups of the amplified output channels. The group equalization settings generated by the system optimization engine 420 may be used to configure filters in the global equalization block 210 and/or the steered channel equalization block 214 (FIG. 2).

Figure 15:
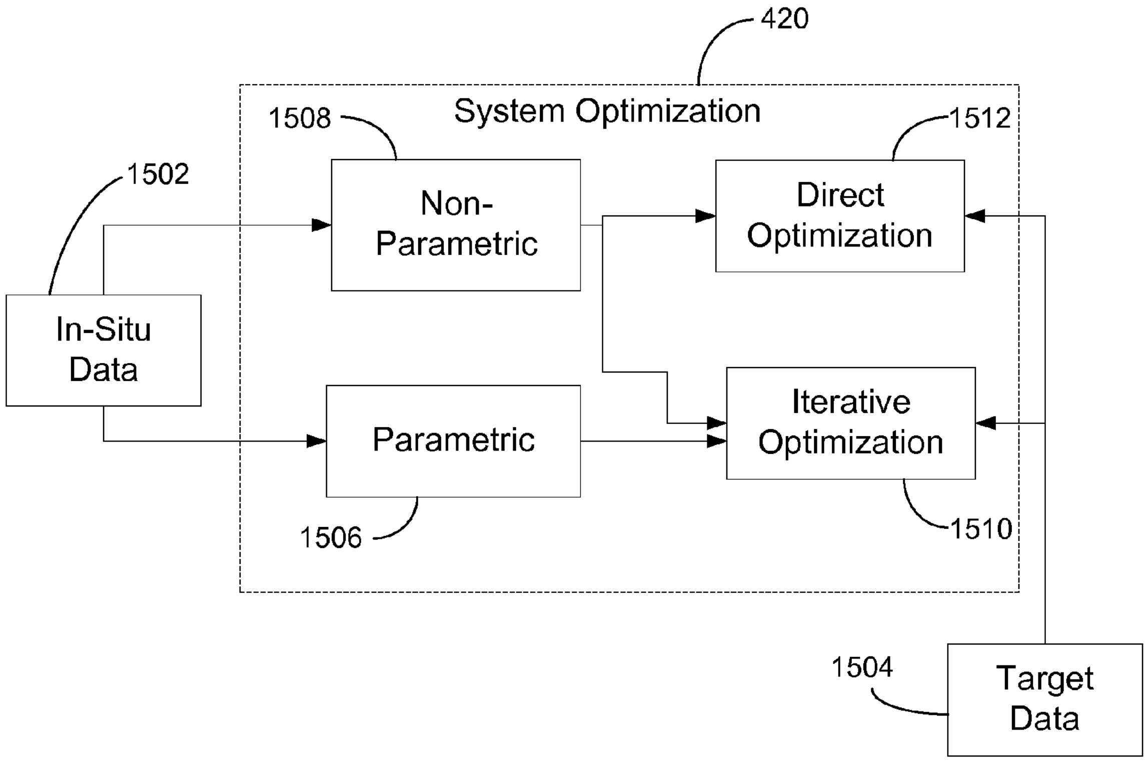
FIG. 15 is a block diagram of an example system optimization engine that may be included in the automated audio tuning system of FIG. 4.

FIG. 15 is a block diagram of an example system optimization engine 420, in-situ data 1502, and target data 1504. The in-situ data 1502 may be response data from the transfer function matrix 406. Alternatively, the in-situ data 1502 may be one or more simulations that include the response data from the transfer function matrix 406 with generated or determined settings applied thereto. As previously discussed, the simulations may be generated with the settings application simulator 422 based on a simulation schedule, and stored in memory 432 (FIG. 4).

The target data 1504 may be a frequency response magnitude that a particular channel or group of channels is targeted to have in a weighted spatial averaged sense. For example, the left front amplified output channel in an audio system may contain three or more loudspeakers that are driven with a common audio output signal provided on the left front amplified output channel. The common audio output signal may be a frequency band limited audio output signal. When an input audio signal is applied to the audio system, that is to energize the left front amplified output channel, some acoustic output is generated. Based on the acoustic output, a transfer function may be measured with an audio sensor, such as a microphone, at one or more locations in the listening environment. The measured transfer function may be spatially averaged and weighted.

The target data 1504 or desired response for this measured transfer function may include a target curve, or target function. An audio system may have one or many target curves, such as, one for every major speaker group in a system. For example, in a vehicle audio surround sound system, channel groups that may have target functions may include left front, center, right front, left side, right side, left surround and right surround. If an audio system contains a special purpose loudspeaker such as a rear center speaker for example, this also may have a target function. Alternatively, all target functions in an audio system may be the same.

Target functions may be predetermined curves that are stored in the setup file 402 as target data 1504. The target functions may be generated based on lab information, in-situ information, statistical analysis, manual drawing, or any other mechanism for providing a desired response of multiple amplified audio channels. Depending on many factors, the parameters that make up a target function curve may be different. For example, an audio system designer may desire or expect an additional quantity of bass in different listening environments. In some applications the target function(s) may not be equal pressure per fractional octave, and also may have some other curve shape.

Figure 16:
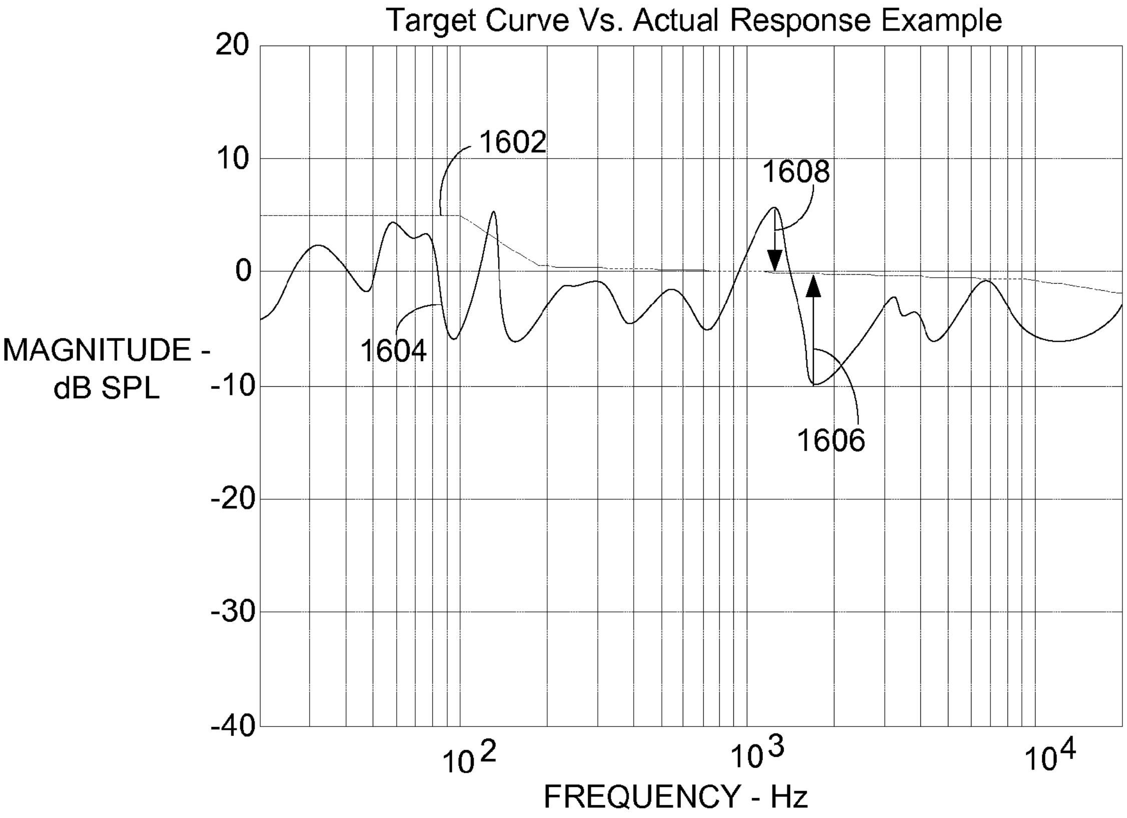
FIG. 16 is an example target acoustic response and in-situ data.

An example target acoustic response in the form of a target function curve 1602 vs. an actual in-situ response curve 1604 is shown in FIG. 16. The target function curve 1602 is the desired response in the listening location. The actual in-situ response curve 1604 may represent an actual measured response, or a simulated response at the listening location. In other words, the target function curve 1602 represents the desired audible sound received by a listener positioned in the listening location, and the actual in-situ response represents the actual audible sound received by the listener in the listening location. The difference between the desired and actual audible sound may be adjusted by the system to optimize audio quality and power consumption.

For example; in FIG. 16, the amplified channel equalization engine 410 may attenuate or boost the audio signal using filters as previously discussed. The attenuation and boost adjustments may be based on the actual in-situ response curve 1604 and be applied to individual frequencies or ranges of frequencies in order to better match the target function curve 1602. For example, in FIG. 16, arrow 1606 represents a range of frequencies that may be boosted toward the target function curve 1604. In another example, arrow 1608 represents a range of frequencies that may be attenuated toward the target function curve 1604. Similarly, the gain engine 414 may increase the overall gain of the actual in-situ response curve 1604 to more closely align with the target function curve 1602. The parameters that form a target function curve may be generated parametrically or non-parametrically. Parametric implementations allow an audio system designer or an automated tool to adjust parameters such as frequencies and slopes. Non-parametric implementations allow an audio system designer or an automated tool to "draw" arbitrary curve shapes.

The system optimization engine 420 may compare portions of a simulation as indicated in the setup file 402 (FIG. 4) with one or more target functions. The system optimization engine 420 may identify representative groups of amplified output channels from the simulation for comparison with respective target functions. Based on differences in the complex frequency response, or magnitude, between the simulation and the target function, the system optimization engine may generate group equalization settings that may be global equalization settings and/or steered channel equalization settings (210 and 214 in FIG. 2).

In FIG. 15, the system optimization engine 420 may include a parametric engine 1506 and a non-parametric engine 1508. Global equalization settings and/or steered channel equalization settings may be selectively generated for the input audio signals or the steered channels, respectively, with the parametric engine 1506 or the non-parametric engine 1508, or a combination of both the parametric engine 1506 and the non-parametric engine 1508. Global equalization settings and/or steered channel equalization settings generated with the parametric engine 1506 may be in the form of filter design parameters that synthesize a parametric filter, such as a notch, band pass, and/or all pass filter. Global equalization settings and/or steered channel equalization settings generated with the non-parametric engine 1508, on the other hand, may be in the form of filter design parameters that synthesize an arbitrary IIR or FIR filter, such as a notch, band pass, or all-pass filter.

The system optimization engine 420 also may include an iterative equalization engine 1510, and a direct equalization engine 1512. The iterative equalization engine 1510 may be executable in cooperation with the parametric engine 1506 to iteratively evaluate and rank filter design parameters generated with the parametric engine 1506. The filter design parameters from each iteration may be provided to the setting application simulator 422 for application to the simulation(s) previously provided to the system optimization engine 420. Based on comparison of the simulation modified with the filter design parameters, to one or more target curves included in the target data 1504, additional filter design parameters may be generated. The iterations may continue until a simulation generated by the settings application simulator 422 is identified with the system iterative equalization engine 1510 that most closely matches the target curve.

The direct equalization engine 1512 may calculate a transfer function that would filter the simulation(s) to yield the target curves(s). Based on the calculated transfer function, either the parametric engine 1506 or the non-parametric engine 1508 may be executed to synthesize a filter with filter design parameters to provide such filtering. Use of the iterative equalization engine 1510 or the direct equalization engine 1512 may be designated by an audio system designer in the setup file 402 (FIG. 4).

In FIG. 4, the system optimization engine 420 may use target curves and a summed response provided with the in-situ data to consider a low frequency response of the audio system. At low frequencies, such as less than 400 Hz, modes in a listening space may be excited differently by one loudspeaker than by two or more loudspeakers receiving the same audio output signal. The resulting response can be very different when considering the summed response, versus an average response, such as an average of a left front response and a right front response. The system optimization engine 420 may address these situations by simultaneously using multiple audio input signals from a simulation as a basis for generating filter design parameters based on the sum of two or more audio input signals. The system optimization engine 420 may limit the analysis to the low frequency region of the audio input signals where equalization settings may be applied to a modal irregularity that may occur across all listening positions.

The system optimization engine 420 also may provide automated determination of filter design parameters representative of spatial variance filters. The filter design parameters representative of spatial variance filters may be implemented in the steered channel equalization block 214 (FIG. 2). The system optimization engine 420 may determine the filter design parameters from a simulation that may have generated and determined settings applied. For example, the simulation may include application of delay settings, channel equalization settings, crossover settings and/or high spatial variance frequencies settings stored in the setup file 402.

When enabled, system optimization engine 420 may analyze the simulation and calculate variance of the frequency response of each audio input channel across all of the audio sensing devices. In frequency regions where the variance is high, the system optimization engine 420 may generate variance equalization settings to maximize performance, similar to those described with reference to FIG. 16 across all the channels. Based on the calculated variance, the system optimization engine 420 may determine the filter design parameters representative of one or more parametric filters and/or non-parametric filters. The determined design parameters of the parametric filter(s) may best fit the frequency and Q of the number of high spatial variance frequencies indicated in the setup file 402. The magnitude of the determined parametric filter(s) may be seeded with a mean value across audio sensing devices at that frequency by the system optimization engine 420. Further adjustments to the magnitude of the parametric notch filter(s) may occur during subjective listening tests. The system optimization engine 420 also may perform filter efficiency optimization. After the application and optimization of all filters in a simulation, the overall quantity of filters may be high, and the filters may be inefficiently and/or redundantly utilized. The system optimization engine 420 may use filter optimization techniques to reduce the overall filter count. This may involve fitting two or more filters to a lower order filter and comparing differences in the characteristics of the two or more filters vs. the lower order filters. If the difference is less than a determined amount the lower order filter may be accepted and used in place of the two or more filters.

The optimization also may involve searching for filters which have little influence on the overall system performance and deleting those filters. For example, where cascades of minimum phase bi-quad filters are included, the cascade of filters also may be minimum phase. Accordingly, filter optimization techniques may be used to minimize the number of filters deployed. In another example, the system optimization engine 420 may compute or calculate the complex frequency response of the entire chain of filters applied to each amplified output channel. The system optimization engine 420 may then pass the calculated complex frequency response, with appropriate frequency resolution, to filter design software, such as FIR filter design software. The overall filter count may be reduced by fitting a lower order filter to multiple amplified output channels. The FIR filter also may be automatically converted to an IIR filter to reduce the filter count. The lower order filter may be applied in the global equalization block 210 and/or the steering channel equalization block 214 at the direction of the system optimization engine 420.

The system optimization engine 420 also may generate a maximum gain of the audio system. The maximum gain may be set based on a parameter specified in the setup file 402, such as a level of distortion. When the specified parameter is a level of distortion, the distortion level may be measured at a simulated maximum output level of the audio amplifier or at a simulated lower level. The distortion may be measured in a simulation in which all filters are applied and gains are adjusted. The distortion may be regulated to a certain value, such as 10% THD, with the level recorded at each frequency at which the distortion was measured. Maximum system gain may be derived from this information. The system optimization module 420 also may set or adjust limiter settings in the nonlinear processing block 228 (FIG. 2) based on the distortion information.

The system optimization engine 420 may also generate sets of operational parameters for each of any number of different power efficiency weighting factors. Using the impedance data of the loudspeakers, performance related data such as in-situ data, operational parameters generated by one or more of the other engines and a target acoustic response, the system optimization engine 420 may generate operational parameters as a function of each of the power efficiency weighting factors. Generation of the sets of operational parameters may also include elimination of filters, In FIG. 4, the nonlinear optimization engine 430 may use in-situ measurements and device characteristics to set operational parameters in the form of non-linear settings of limits on nonlinear characteristic of the system, such as, limiters, compressors, clipping and other nonlinear processes that are applied to the audio system for acoustic performance, protection, power reduction, distortion management and/or other reasons. Using the target acoustic response, the in-situ response, and the audio system specific configuration information, the non-linear optimization engine may generate non-linear settings. In addition, using the impedance data, the nonlinear optimization engine 430 may adjust the non-linear settings to optimize power consumption. For example, the attack time of limiters may be increased to avoid large magnitude short duration energy intensive outputs of audible sound from the loudspeakers in order to optimize energy efficiency. In another example, a compressor may be disabled to optimize energy efficiency.

Operation of the nonlinear optimization engine 430 may occur after each engine creates operational parameters for each of the power efficiency modes. Alternatively, or in addition, operation of the nonlinear optimization engine 430 may occur following completion of creation of the power efficiency mode(s) by all the engines. In either case, the nonlinear optimization engine 430 operates to confirm that the operational parameters developed for the power efficiency mode(s) do not result in distortion or other detrimental effect that can be addressed with nonlinear processing. If such conditions are identified, such as by analysis of the in-situ data and/or simulations using the operational parameters developed for the power efficiency mode(s), the nonlinear optimization engine 430 may develop appropriate settings to protect against such conditions. In addition, or alternatively, the nonlinear optimization engine 430 may provide such information to the other engines such that additional/revised operational parameters may be generated that provide the desired balance between acoustic performance and power efficiency while also minimizing the identified conditions.

The nonlinear optimization engine 430 may vary the nonlinear settings based on a level of priority of power efficiency considerations as indicated with the power efficiency weighting factor(s). The non-linear settings may be generated in sets with the nonlinear optimization engine 430 based on power consumption considerations. Power consumption may be determined under various operating conditions by the nonlinear optimization engine 430 based on impedance data of the loudspeakers, operational parameters generated by one or more of the other engines, and performance related data such as in-situ data. Non-linear settings by the nonlinear optimization engine 430 for a respective power efficiency weighting factor may be based on overall audio system power consumption limits. In addition, or alternatively, such limits may be set based on external factors. In the example of a hybrid vehicle, external factors may include available battery power, projected available battery power based on a destination input to a navigation system, other auxiliary systems in operation, such as heaters, lights or windshield wipers, or any other power consumption related considerations. In non-vehicle applications, external factors may similarly include available power source, power supply quality, nominal voltage levels and the like.

Figure 17:
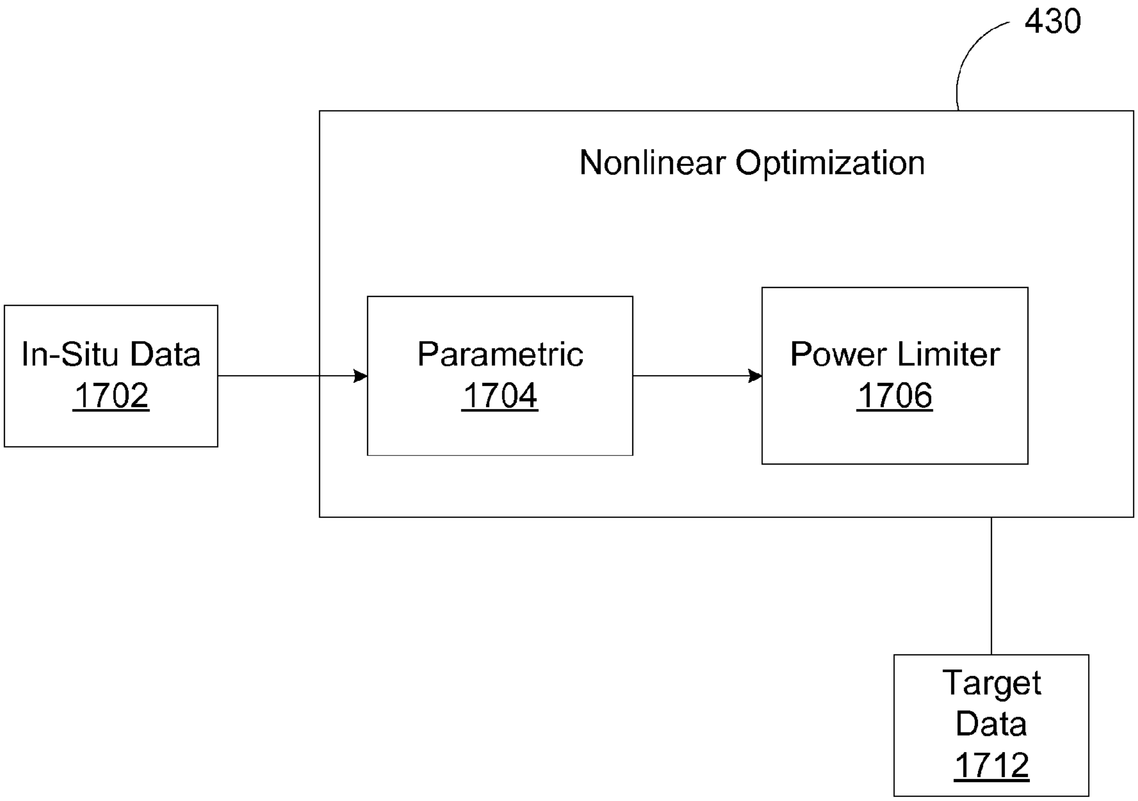
FIG. 17 is a block diagram of an example nonlinear optimization engine that may be included in the automated audio tuning system of FIG. 4.

FIG. 17 is a block diagram illustrating operation of the nonlinear optimization engine 430. The nonlinear optimization engine 430 includes a parametric engine 1704 and a power limiter 1706. The nonlinear optimization engine 430 may receive in-situ measurement information from in-situ data 1702. The parametric engine 1704 may use the measurement data to calculate various performance parameters, including power consumption of audio devices or groups of audio devices in the audio system. In one example, a group of audio devices may be an amplifier and one or more loudspeakers. The calculated performance parameters relating to power consumption are provided to the power limiter 1706, which determines whether a channel or group of channels is operating at power levels that exceed a predetermined limit. The power limiter 1706 may determine a weighted factor or use some other technique to configure filters to adjust the power spectra of the channel or group of channels to maintain power consumption of the respective channel or group of channels at or below the predetermined limit.

Figure 18:
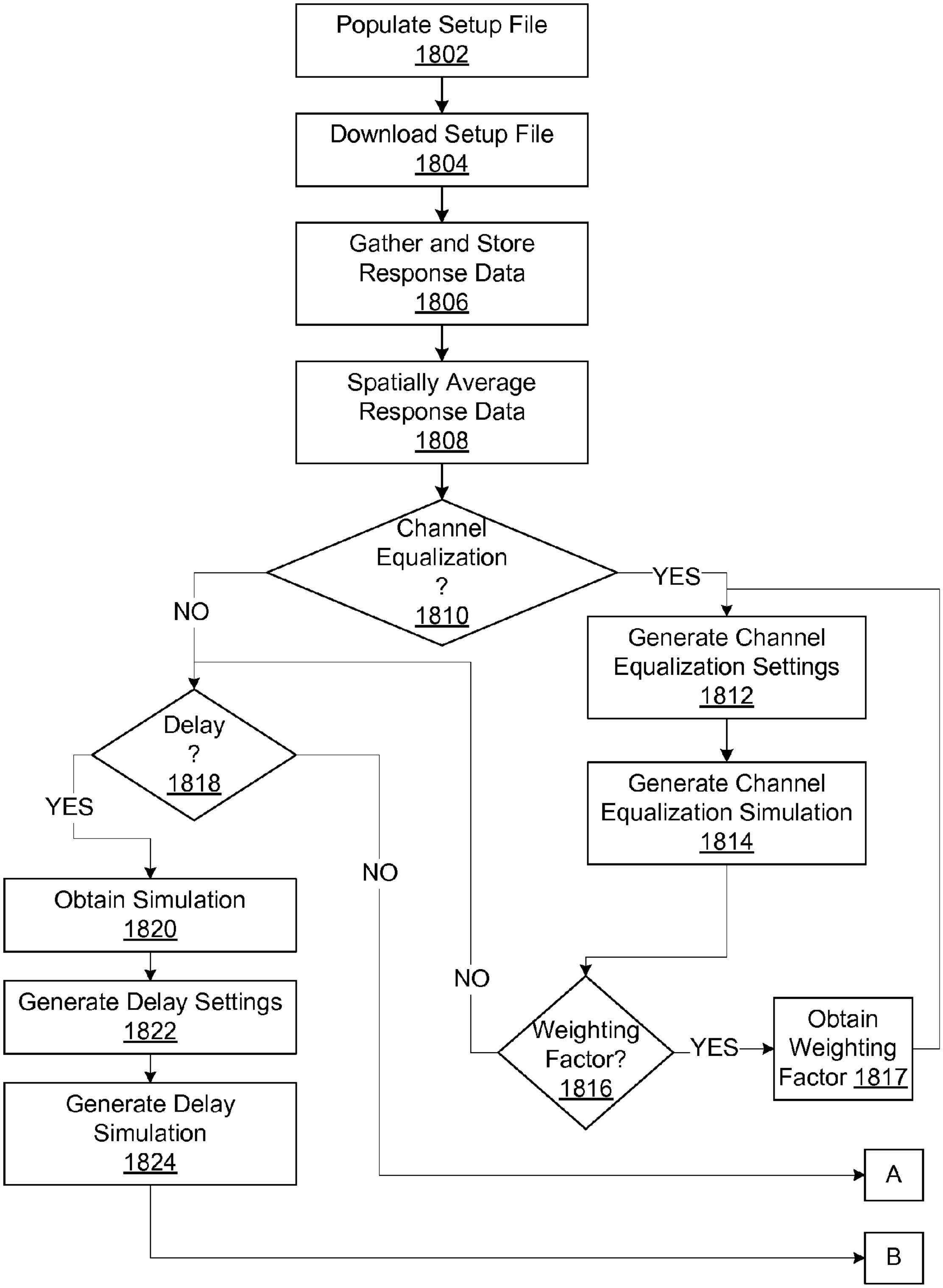
FIG. 18 is a process flow diagram illustrating example operation of the automated audio tuning system of FIG. 4.

FIG. 18 is a flow diagram describing example operation of the automated audio tuning system. In the following example, automated steps for adjusting the parameters and determining the types of filters to be used in the blocks included in the signal flow diagram of FIG. 2 will be described in a particular order. However, as previously indicated, for any particular audio system, some of the blocks described in FIG. 2 may not be implemented. Accordingly, the portions of the automated audio tuning system 400 corresponding to the unimplemented blocks may be omitted. In addition, the order of the steps may be modified in order to generate simulations for use in other steps based on the order table and the simulation schedule with the setting application simulator 422, as previously discussed. Thus, the exact configuration of the automated audio tuning system may vary depending on the implementation needed for a given audio system. In addition, the automated steps performed by the automated audio tuning system, although described in a sequential order, need not be executed in the described order, or any other particular order, unless otherwise indicated. Further, some of the automated steps may be performed in parallel, in a different sequence, or may be omitted entirely depending on the particular audio system being tuned.

In FIG. 18, at block 1802, the audio system designer may enable population of the setup file with data related to the audio system to be tested. The data may include audio system architecture, channel mapping, weighting factors, lab data, constraints, order table, simulation schedule, impedance data, and the like. At block 1804, the information from the setup file may be downloaded to the audio system to be tested to initially configure the audio system. At block 1806, response data from the audio system may be gathered and stored in the transfer function matrix as in-situ data. Gathering and storing response data may include setup, calibration and measurement with sound sensors of audible sound waves produced by loudspeakers in the audio system. The audible sound may be generated by the audio system based on input audio signals, such as waveform generation data processed through the audio system and provided as audio output signals on amplified output channels to drive the loudspeakers.

The response data may be spatially averaged and stored at block 1808. At block 1810, it is determined if amplified channel equalization is indicated in the setup file. Amplified channel equalization, if needed, may need to be performed before generation of gain settings or crossover settings. If amplified channel equalization is indicated, at block 1812, the amplified channel equalization engine may use the setup file and the spatially averaged response data to generate channel equalization settings. The channel equalization settings may be generated based on in-situ data or lab data. If lab data is used, in-situ prediction and statistical correction may be applied to the lab data. Filter parameter data may be generated based on the parametric engine, the non-parametric engine, or some combination thereof.

The channel equalization settings may be provided to the setting application simulator, and a channel equalization simulation may be generated and stored in memory at block 1814. The channel equalization simulation may be generated by applying the channel equalization settings to the response data based on the simulation schedule and any other determined parameters in the setup file. At block 1816 it is determined if an efficiency power mode will be used in the audio system for the equalization settings. If no, the operation proceeds to block 1818. If at block 1816 it is determined that an efficiency power mode will be used, a power efficiency weighting factor is retrieved at block 1817, and the operation returns to 1812 to generate a set of equalization settings based on the retrieved power efficiency weighting factor. Operations at blocks 1812, 1814, 1816 and 1817 may be repeated for each power efficiency weighting factor to be used in the audio system and corresponding simulations generated. Once equalization settings and corresponding simulations have been generated for all the power efficiency weighting factors to be used in the audio system, the operation proceeds to block 1810.

Following generation of the channel equalization simulations at block 1814, or if amplified channel equalization is not indicated in the setup file at block 1810, it is determined if automated generation of delay settings are indicated in the setup file at block 1818. Delay settings, if needed, may be needed prior to generation of crossover settings and/or bass optimization settings. If delay settings are indicated, a simulation is obtained from the memory at block 1820. The simulation may be indicated in the simulation schedule in the setup file. In one example, the simulation obtained may be the channel equalization simulation. The delay engine may be executed to use the simulation to generate delay settings at block 1822. Delay settings may be generated for each of simulation corresponding to a set of equalization settings when the audio system includes power efficiency weighting factors.

Delay settings may be generated based on the simulation and the weighting matrix for the amplified output channels that may be stored in the setup file. If one listening position in the listening space is prioritized in the weighting matrix, and no additional delay of the amplified output channels is specified in the setup file, the delay settings may be generated so that all sound arrives at the one listening position substantially simultaneously. At block 1824, the delay settings may be provided to the settings application simulator, and a simulation with the delay settings applied may be generated. The delay simulation may be the channel equalization simulation with the delay settings applied thereto.

Figure 19:
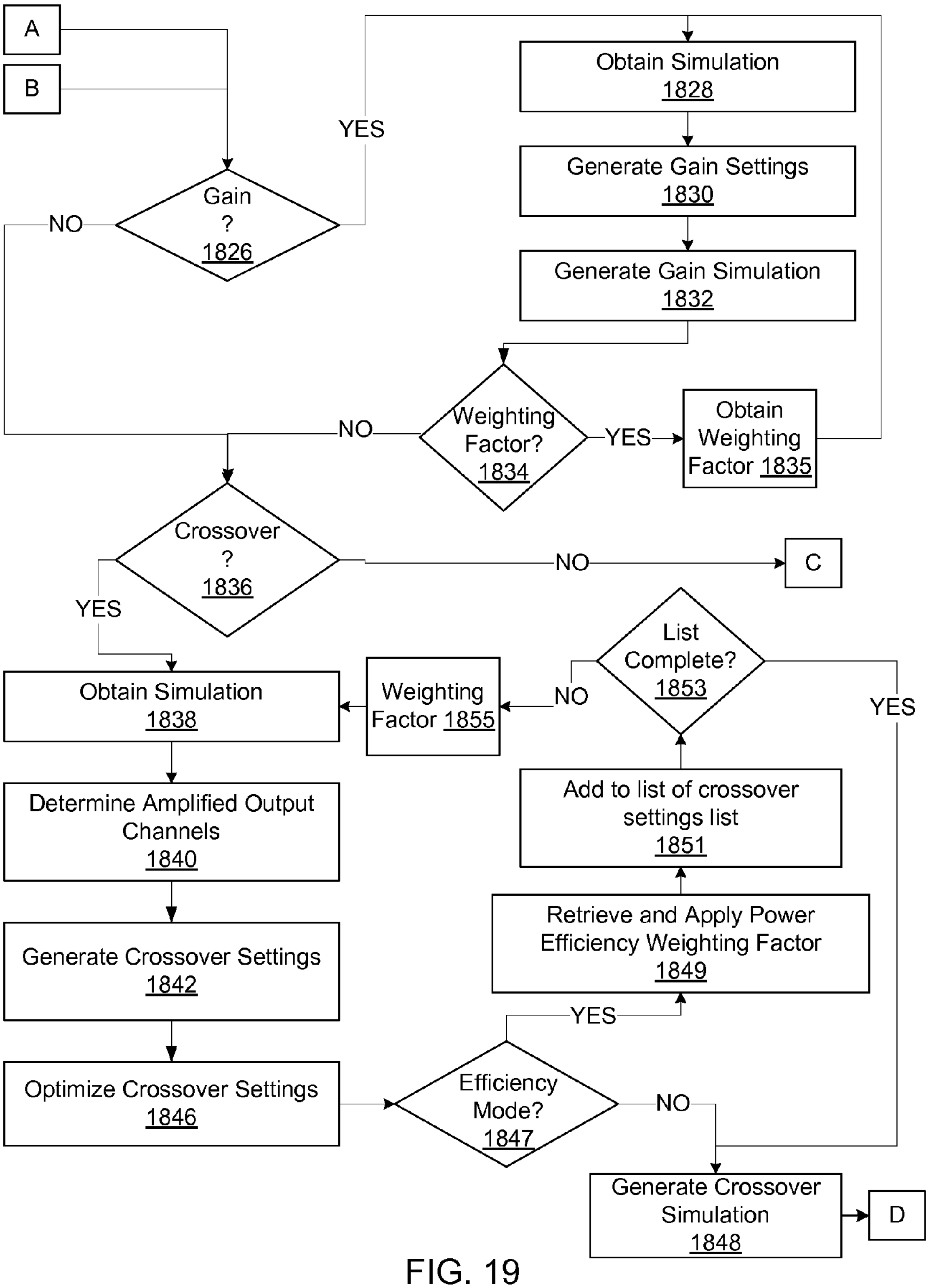
FIG. 19 is a second part of the process flow diagram of FIG. 18.

In FIG. 19, following generation of the delay simulation(s) at block 1824, or if delay settings are not indicated in the setup file at block 1818, it is determined if automated generation of gain settings are indicated in the setup file at block 1826. If yes, a simulation is obtained from the memory at block 1828. The simulation may be indicated in the simulation schedule in the setup file. In one example, the simulation obtained may be the delay simulation. The gain engine may be executed to use the simulation and generate gain settings at block 1830.

Gain settings may be generated based on the simulation and the weighting matrix for each of the amplified output channels. If one listening position in the listening space is prioritized in the weighting matrix, and no additional amplified output channel gain is specified, the gain settings may be generated so that the magnitude of sound perceived at the prioritized listening position is substantially uniform. At block 1832, the gain settings may be provided to the settings application simulator, and a simulation with the gain settings applied may be generated. The gain simulation may be the delay simulation with the gain settings applied thereto. At block 1834 it is determined if an efficiency power mode will be used in the audio system for the gain settings. If no, the operation proceeds to block 1836. If at block 1834 it is determined that an efficiency power mode will be used, a power efficiency weighting factor is retrieved at block 1835, and the operation returns to 1828 to retrieve the delay simulation containing the equalization settings corresponding to the retrieved power efficiency weighting factor. Operations at blocks 1828, 1830, 1832, 1834 and 1835 may be repeated for each power efficiency weighting factor to be used in the audio system and corresponding simulations containing the gain generated. Once gain settings and corresponding simulations have been generated for all the power efficiency weighting factors to be used in the audio system, the operation proceeds to block 1836.

After the gain simulation(s) is generated at block 1834, or if gain settings are not indicated in the setup file at block 1828, it is determined if automated generation of crossover settings is indicated in the setup file at block 1836. If yes, at block 1838, a simulation is obtained from memory. The simulation may not be spatially averaged since the phase of the response data may be included in the simulation. At block 1840, it is determined, based on information in the setup file, which of the amplified output channels are eligible for crossover settings.

The crossover settings are selectively generated for each of the eligible amplified output channels at block 1842. Similar to the amplified channel equalization, in-situ or lab data may be used, and parametric or non-parametric filter design parameters may be generated. In addition, the weighting matrix from the setup file may used during generation. At block 1846, optimized crossover settings may be determined by either a direct optimization engine operable with only the non-parametric engine, or an iterative optimization engine, which may be operable with either the parametric or the non-parametric engine.

At decision block 1847, it is determined if the system will be operated in an efficiency mode with one or more power efficiency weighting factors. If yes, a power efficiency weighting factor may be retrieved and applied at step 1849. The set of crossover settings corresponding to the retrieved power efficiency weighting factor may be added to a list of crossover settings in step 1851. Decision block 1853 checks to determine if the list is complete. If it is not complete, another power efficiency weighting factor is obtained at step 1855 and the corresponding simulation is used at steps 1838 to 1846 to calculate another set of crossover settings weighted to a reduced power output. For example, a crossover settings list generated based on performance may be compared with a second crossover settings list generated based on power efficiency settings using the efficiency weighting factor(s) as an indication of the extent to which the user may tolerate lower performance in favor of higher power efficiency. A resulting list may be generated as a compromise between performance and power that is based on the efficiency weighting factor. The efficiency weighting factor may be used in other ways as well. If at decision block 1853, the list is complete, a list of crossover settings with different power outputs, or efficiency power ratings may be generated. The list may include any number of configurations, or simply a high audio quality configuration and a high efficiency configuration. One or more crossover simulations may be generated at step 1848.

Figure 22A:
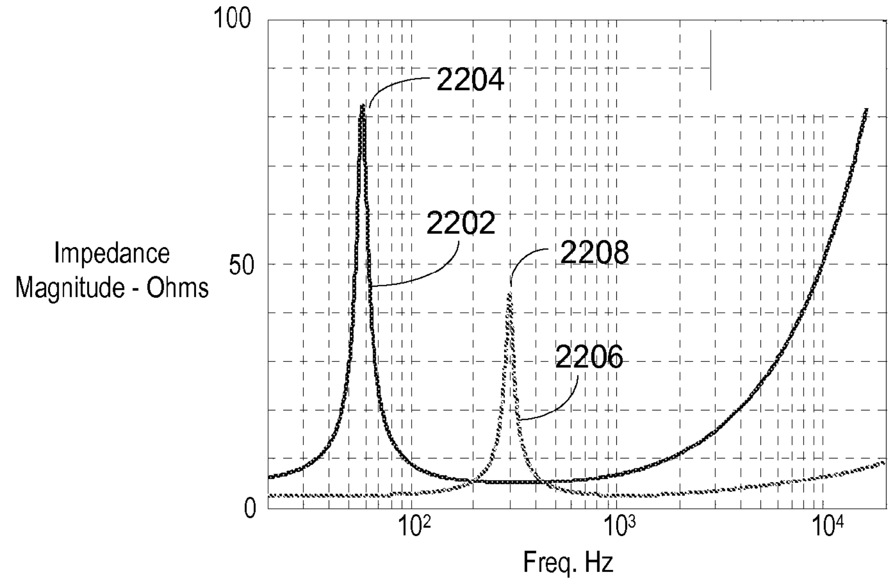
FIG. 22 is an example of response curves for loudspeakers.
Figure 22B:
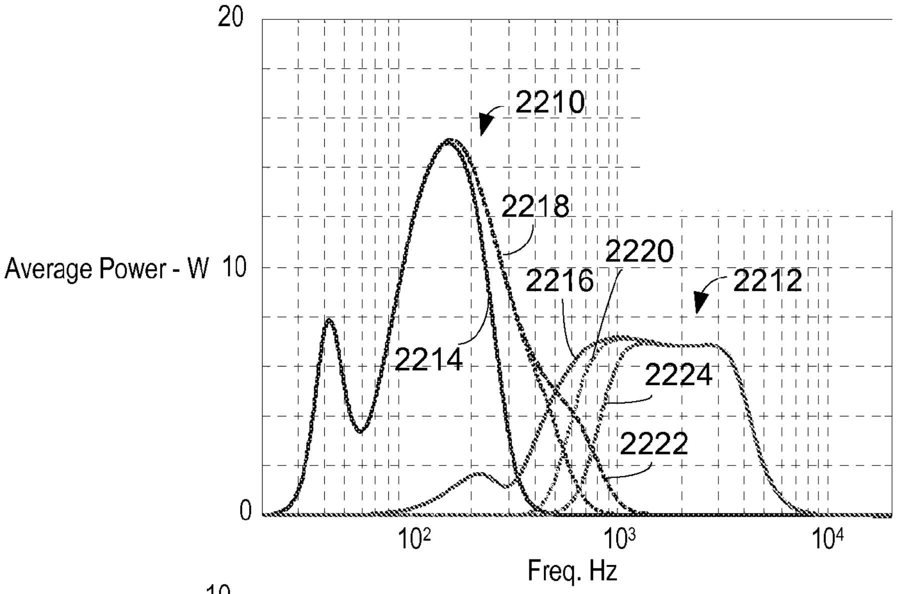
Figure 22C:
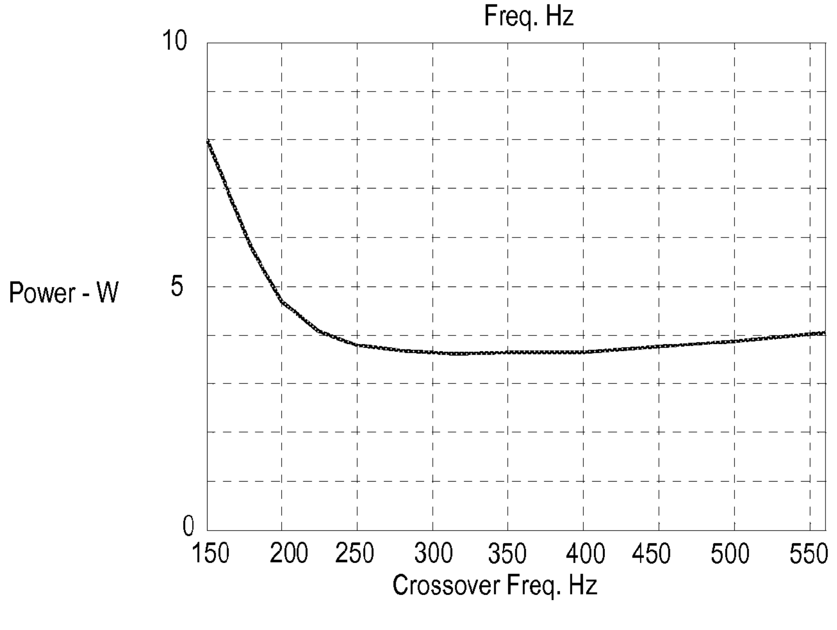

FIG. 22 is a set of example performance curves for a woofer and midrange loudspeaker. In FIG. 22*a*, an example estimate impedance curve includes a first impedance curve 2202 of a woofer loudspeaker that identifies resonance as occurring at about 400 Hz at an impedance magnitude of about 84 ohms, and a second impedance curve 2204 of a midrange loudspeaker that identifies a resonance as occurring at about 3 KHz at an impedance magnitude of about 45 ohms. In FIG. 22*b* a first set of in-situ response curves 2210 for the woofer loudspeaker and a second set of in-situ response curves 2212 for the mid-range loudspeaker illustrate average power in watts over a range of frequency. In FIG. 22*c* a graph of the effect on power consumption as the crossover frequency varies is illustrated.

In FIG. 22*b*, a first in-situ response curve 2214 of the woofer and a first in-situ response curve 2216 of the mid range are depicted at a first example crossover frequency of 280 Hz. A second in-situ response curve 2218 of the woofer and a second in-situ response curve 2220 of the mid range are depicted at a second example crossover frequency of 560 Hz. A third in-situ response curve 2222 of the woofer and a third in-situ response curve 2224 of the mid range are depicted at a third example crossover frequency of 840 Hz. Comparing FIGS. 22*a* and 22*b* to FIG. 22*c*, optimal power consumption occurs at about 315 Hz, which is relatively close to resonance 2204 of the woofer loudspeaker. As further illustrated in FIG. 22*c*, crossover frequency settings below about 200 Hz and above about 400 Hz, in this example will result in higher power consumption. However, a crossover setting with higher power consumption may represent optimum acoustic performance based on the target acoustic response. Since the crossover engine 416 performs balancing between optimizing for acoustic performance and optimizing for power efficiency, the crossover setting may be generated by the crossover engine 416 as a function of the efficiency weighting factor. For example, if the crossover setting for optimal acoustic performance was at 500 Hz, the crossover engine 416 may generate this setting when the efficiency weighting factor is heavily weighted toward acoustic performance, whereas 315 Hz may be chosen when energy efficiency is heavily weighted. Similarly, when acoustic performance and energy efficiency are substantially similarly weighted, 400 Hz may be chosen.

Figure 20:
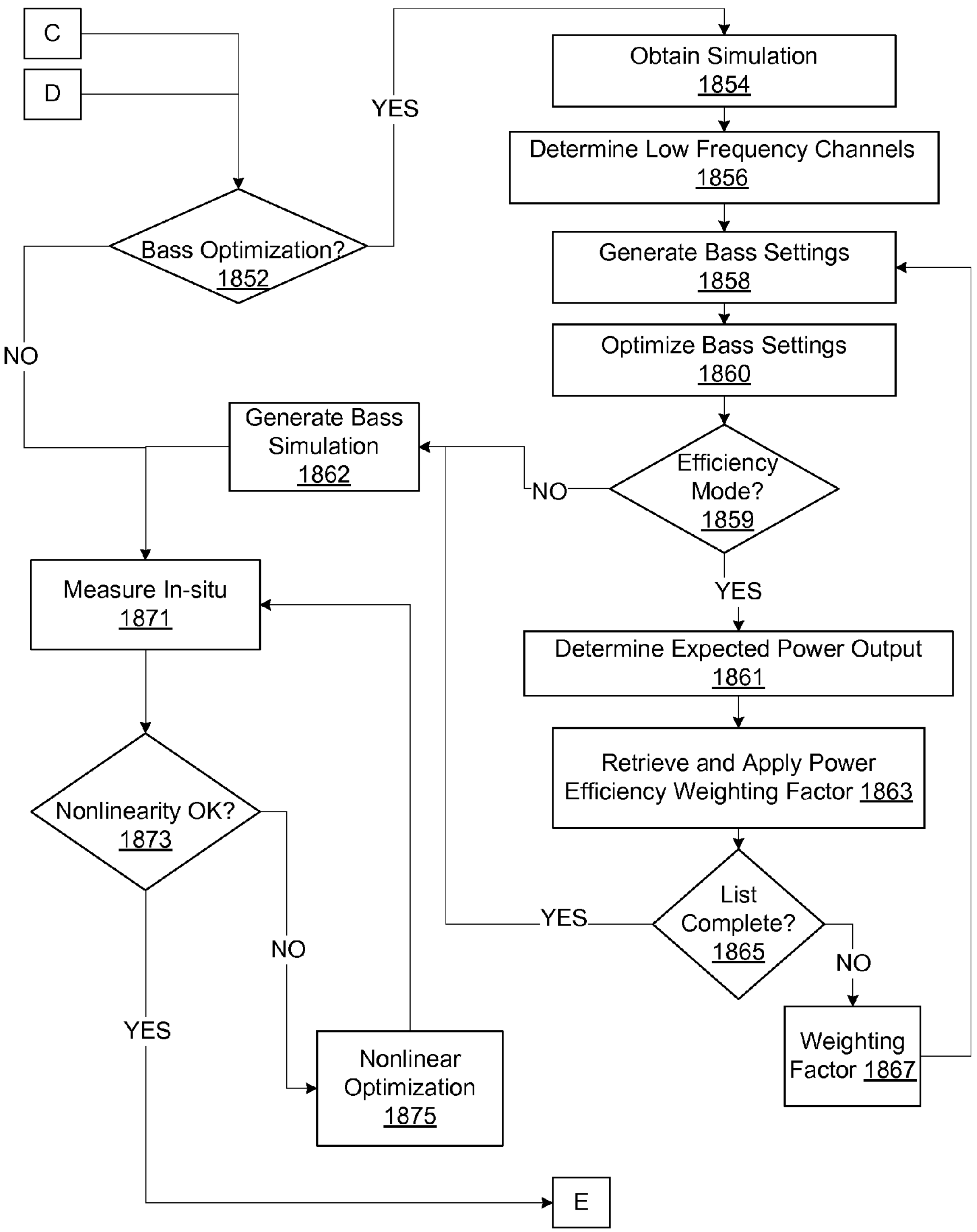
FIG. 20 is a third part of the process flow diagram of FIG. 18.

In FIG. 20, after the crossover simulation is generated at block 1848, or if crossover settings are not indicated in the setup file at block 1836, it is determined if automated generation of bass optimization settings is indicated in the setup file at block 1852. If yes, at block 1854, a simulation is obtained from memory. The simulation may not be spatially averaged similar to the crossover engine since the phase of the response data may be included in the simulation. At block 1856, it is determined based on information in the setup file which of the amplified output channels are driving loudspeakers operable in the lower frequencies.

The bass optimization settings may be selectively generated for each of the identified amplified output channels at block 1858. The bass optimization settings may be generated to correct phase in a weighted sense according to the weighting matrix such that all bass producing speakers sum optimally. In-situ data may be used, and parametric and/or non-parametric filter design parameters may be generated. In addition, the weighting matrix from the setup file may be used during generation. At block 1860, optimized bass settings may be determined by either a direct optimization engine operable with only the non-parametric engine, or an iterative optimization engine, which may be operable with either the parametric or the non-parametric engine.

At decision block 1859, it is determined if the system is operating in efficiency mode. If yes, a power efficiency weighting factor may be retrieved and applied at step 1861. The bass settings and the corresponding retrieved power efficiency weighting factor is added to a bass settings list at step 1863. At decision block 1865, the list is checked to determine if it is complete. If the list is not complete, another power efficiency weighting factor and the corresponding simulation is obtained at step 1867 and another set of bass settings weighted for power efficiency is determined at step 1858. If the list is complete at decision block 1865, one or more bass simulations are generated at step 1862.

If either no bass optimization is specified to be performed (the 'NO' path at decision block 1852), or if the bass simulation settings have been generated at step 1862, in-situ data is measured at step 1871. In-situ measurements are performed once at the beginning of the process for the other system functions. However, large magnitude signal operation resulting in nonlinear data, such as in bass optimization can be re-measured as changes are made to the operational parameters in an iterative process. The measurement of in-situ non-linear data may involve acoustic measurements at the highest audio output levels that the system would produce for each of the power efficiency weighting factors (if present). At decision block 1873, distortion, excursion, power output and current output are determined and checked against threshold levels for each of the power efficiency weighting factors (if present). If the levels are higher than the thresholds (the 'NO' path out of decision block 1873), then at step 1875, the non-linear parameters are adjusted iteratively for optimal performance for each of the power efficiency weighting factors (if present). Such non-linearity checking may occur after each of the engines completes balanced optimization of the acoustic performance and power efficiency based on the power efficiency weighting factor(s). In addition, or alternatively, such non-linearity checking may be performed when all engines have completed balanced optimization.

Figure 21:
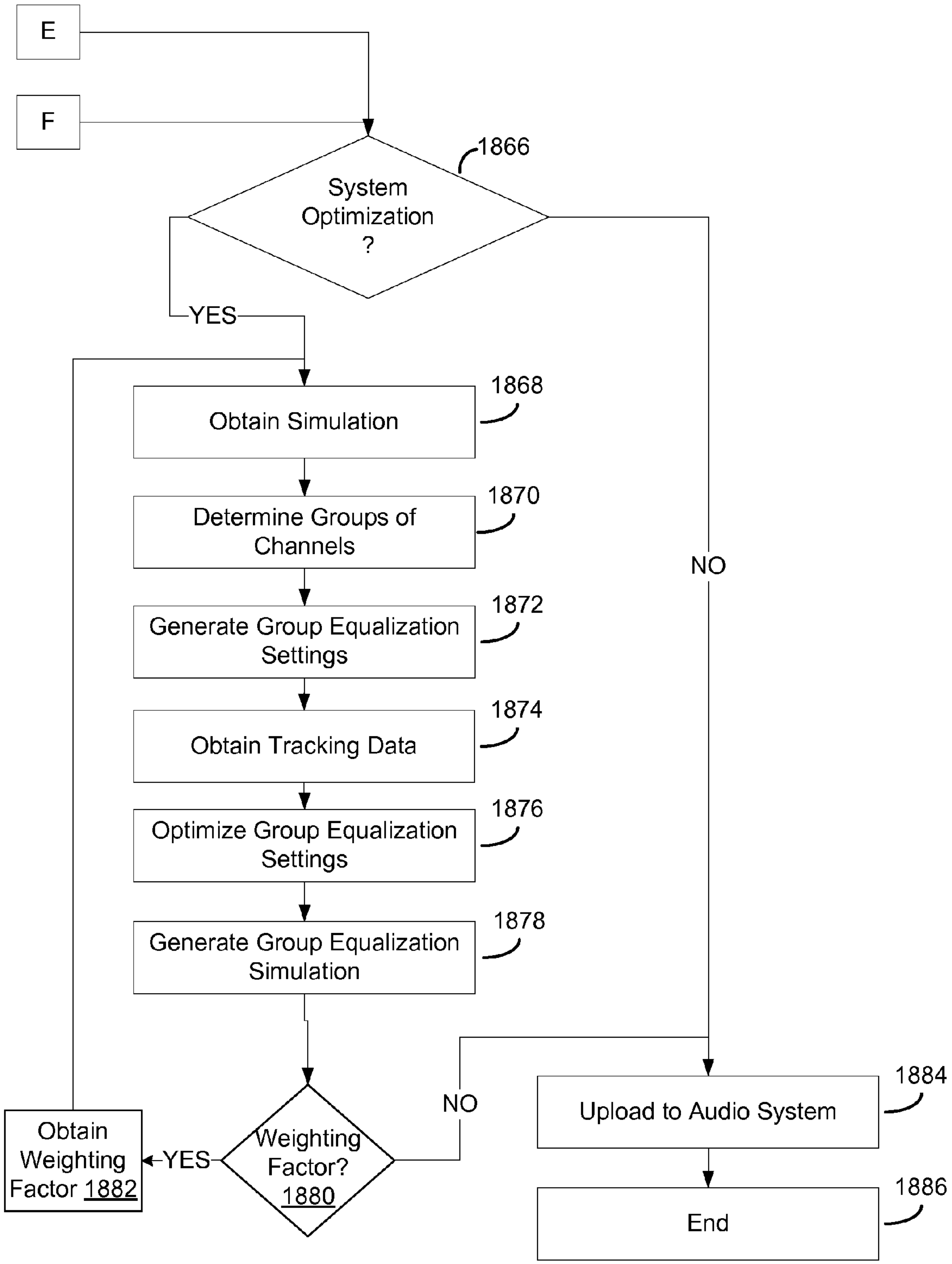
FIG. 21 is a fourth part of the process flow diagram of FIG. 18.

Following generation of bass optimization at block 1862, or if bass optimization settings are not indicated in the setup file at block 1852, it is determined if automated system optimization is indicated in the setup file at block 1866 in FIG. 21. If yes, at block 1868, a simulation is obtained from memory. The simulation may be spatially averaged. At block 1870, it is determined, based on information in the setup file, which groups of amplified output channels may need further equalization.

Group equalization settings may be selectively generated for groups of determined amplified output channels at block 1872. System optimization may include establishing a system gain and limiter, and/or reducing the number of filters. Group equalization settings also may correct response anomalies due to crossover summation and bass optimization on groups of channels as desired. At block 1874, tracking data may be obtained to review variances in the filters, and previously discussed. Optimization of the group equalization settings may occur at block 1876, as previously discussed. At block 1878, group equalization simulation may be generated. At block 1880 it is determined if an efficiency power mode will be used in the audio system for the group equalization settings. If no, the operation proceeds to block 1884. If at block 1880 it is determined that an efficiency power mode will be used, a power efficiency weighting factor is retrieved at block 1882, and the operation returns to block 1868 to retrieve the simulation corresponding to the retrieved power efficiency weighting factor. Operations at blocks 1868 through 1882 may be repeated for each power efficiency weighting factor to be used in the audio system and corresponding simulations. Once group equalization settings and corresponding simulations have been generated for all the power efficiency weighting factors to be used in the audio system, the operation proceeds to block 1884 to upload the operational parameters to the audio system, and the operation ends at block 1886.

After completion of the above-described operations, each channel and/or group of channels in the audio system that have been optimized may include the optimal response characteristics according to the weighting matrix. A maximal tuning frequency may be specified such that in-situ equalization is preformed only below a specified frequency. This frequency may be chosen as the transition frequency, and may be the frequency where the measured in-situ response is substantially the same as the predicated in-situ response. Above this frequency, the response may be corrected using only predicted in-situ response correction. In addition, the channels or group of channels may be optimized in terms of providing more power-efficient operation as a function of each of the power efficiency weighting factors.

In some implementations, the user may be provided with options that allow the user to choose modes of operation that place a priority on consuming less power. An example audio tuning system may generate one or more sets of operating parameters as described above that are either ranked or generated to provide power efficient operation.

Figure 23:
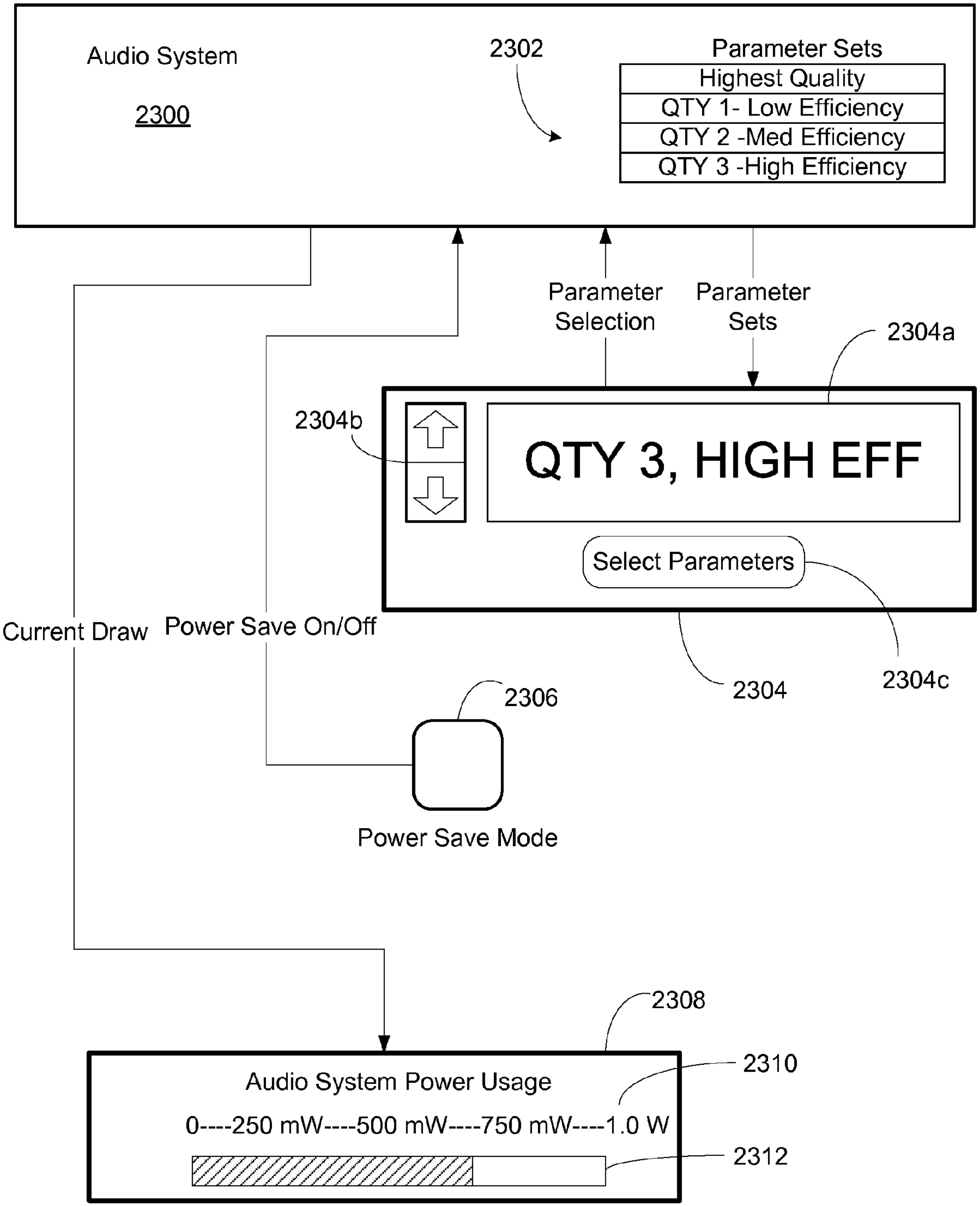
FIG. 23 is a schematic diagram showing examples of user interface devices that may be used in an audio tuning system.

FIG. 23 is a schematic diagram showing examples of user interface devices that may be used in an audio tuning system. FIG. 23 shows an example of an audio system 2300 that provides automated tuning as described above with reference to FIGS. 1-20. The audio system 2300 may generate one or more parameter sets 2302 that include settings for efficiency optimized operation of the audio system 2300. One set that operates at optimal power efficiency may be generated for operation in an efficiency mode, or a different set may be generated for operation at optimal audio quality for operation in a non-efficiency mode. Multiple parameter sets 2302 may be generated and ranked according to power efficiency. For example, the example parameter set 2302 in FIG. 23 includes configuration parameters that are ranked in order of audio quality. The highest quality audio parameters presumably consume the most power. The next level of quality, "QTY 1," provides at least a low level of power efficiency. The next level of audio quality, "QTY 2," provides a next level of power efficiency. The next level of audio quality, "QTY 3," provides a highest level of power efficiency. The extent to which the audio system is made more efficient may be adjusted according to an efficiency mode. The efficiency mode may provide a setting for high efficiency, medium efficiency or low efficiency relative to the power consumption required for optimum performance. The levels of power efficiency may be indicated in a target power array setting, an example of which is described in Appendix A. The target power array may be used to determine the parameter sets provided to the user as choices for selection.

The ranked parameter sets 2302 provide the user the option to include power efficiency considerations in selecting quality of sound generated by the audio system. The user's selection may be effected using user interface devices, examples of which are depicted in FIG. 23. The user interface may include an input/output panel 2304, at least one button 2306, and a power meter 2308.

The input/output panel 2304 may include a display 2304_a_, such as for example, LED, LCD, or other types of devices that provide visual display of text or images. The input/output panel 2304 may also include touch-screen that has image buttons, which the user may press to select functions. The input/output panel 2304 also includes a scrolling input 2304_b_ to allow the user to scroll through the different selections available to the user. For example, the scrolling input 2304_b_ may be an up and a down arrow buttons that the user may press to go up and down through the list of choices. In another example, a rotary button, a slide button, or any other suitable input device may be used, as an image on the touchscreen or as a hardware button on the user interface. On a touchscreen, the scrolling input 2304_b_ may also be a list of choices on the screen that the user may move by touch. The selection may be made by a touch of the choice on the screen. The list of choices may appear in the display 2304_a_. The display 2304_a_ may show one set of parameters that the user may choose, or several choices selectable by positioning a cursor using the scrolling input 2304_b_. The user may make a selection by pressing a selector button 2304_c_.

The at least one button 2306 may be used to select that the system operate in a power efficiency mode. The audio system 2300 may then automatically tune the system, but implement a configuration that has limited power consumption.

The power meter 2308 may indicate the power usage by the audio system. The power meter 2308 may include a power scale 2310, which indicates the power consumption level indicated by a consumption indicator 2312. The power meter 2308 may be implemented using any type of meter. The power meter 2308 may also be part of a list of meters indicating power consumption of different components in a larger system. For example, when the audio system 2300 is being implemented in a vehicle, the list of meters may include meters showing power consumption by the audio system, the air conditioner, the lights, and any other significant power using components in the vehicle.

It will be understood, and is appreciated by persons skilled in the art, that one or more processes, sub-processes, or process steps described in connection with FIGS. 1-23 may be performed by hardware and/or software. In addition, as used herein, the terms "engine" or "engines," "module" or "modules," or "block" or "blocks" may include one or more components that include software, hardware, and/or some combination of hardware and software. As described herein, the engines, modules and blocks are defined to include software modules, hardware modules or some combination thereof executable by a controller or processor. Software modules may include software in the form of instructions stored in memory that are executable by a controller or processor. Hardware modules may include various devices, components, circuits, gates, circuit boards, and the like that are executable, directed, and/or controlled for performance by the controller or processor.

If a process is performed by software, the software may reside in software memory in a suitable electronic processing component or system such as, one or more of the functional components or modules schematically depicted in FIGS. 1-23. The software in software memory may include an ordered listing of executable instructions for implementing logical functions (that is, "logic" that may be implemented either in digital form such as digital circuitry or source code or in analog form such as analog circuitry or an analog source such an analog electrical, sound or video signal), and may selectively be embodied in any computer-readable medium for use by or in connection with an instruction execution system, apparatus, or device, such as a computer-based system, processor-containing system, or other system that may selectively fetch the instructions from the instruction execution system, apparatus, or device and execute the instructions. In the context of this disclosure, a "computer-readable medium" is any means that may contain, store or communicate the program for use by or in connection with the instruction execution system, apparatus, or device. The computer readable medium may selectively be, for example, but is not limited to, an electronic, magnetic, optical, electromagnetic, infrared, or semiconductor system, apparatus or device. More specific examples, but nonetheless a non-exhaustive list, of computer-readable media would include the following: a portable computer diskette (magnetic), a RAM (electronic), a read-only memory "ROM" (electronic), an erasable programmable read-only memory (EPROM or Flash memory) (electronic) and a portable compact disc read-only memory "CDROM" (optical). Note that the computer-readable medium may even be paper or another suitable medium upon which the program is printed, as the program can be electronically captured, via for instance optical scanning of the paper or other medium, then compiled, interpreted or otherwise processed in a suitable manner if necessary, and then stored in a computer memory. However, the computer-readable medium does not encompass a wire or other signal transmission medium, and instructions do not encompass a signal on the signal transmission medium.

While various example implementations of the invention have been described, it will be apparent to those of ordinary skill in the art that many more example implementations are possible within the scope of the invention. Accordingly, the invention is not to be restricted except in light of the attached claims and their equivalents.

APPENDIX A: EXAMPLE SETUP FILE CONFIGURATION INFORMATION

System Setup File Parameters

- Measurement Sample Rate: Defines the sample rate of the data in the measurement matrix
- DSP Sample Rate: Defines the sample rate at which the DSP operates.
- Input Channel Count (J): Defines the number of input channels to the system. (e.g. for stereo, J=2).
- Spatially Processed Channel Count (K): Defines the number of outputs from the spatial processor, K. (e.g. for Logic7, K=7)
- Spatially Processed Channel Labels: Defines a label for each spatially processed output. (e.g. left front, center, right front . . . )
- Bass Managed Channel Count (M): Defines the number of outputs from the bass manager
- Bass Manager Channel Labels: Defines a label for each bass managed output channel. (e.g. left front, center, right front, subwoofer 1, subwoofer 2, . . . )
- Amplified Channel Count (N): Defines the number of amplified channels in the system
- Amplified Channel Labels: Defines a label for each of the amplified channels. (e.g. left front high, left front mid, left front low, center high, center mid, . . . )
- System Channel Mapping Matrix: Defines the amplified channels that correspond to physical spatial processor output channels. (e.g. center=[3,4] for a physical center channel that has 2 amplified channels, 3 and 4, associated with it.)
- Microphone Weighting Matrix: Defines the weighting priority of each individual microphone or group of microphones.
- Amplified Channel Grouping Matrix: Defines the amplified channels that receive the same filters and filter parameters. (e.g. left front and right front)
- Measurement Matrix Mapping: Defines the channels that are associated with the response matrix.

Amplified Channel EQ Setup Parameters

- Parametric EQ Count: Defines the maximum number of parametric EQ's applied to each amplified channel. Value is zero if parametric EQ is not to be applied to a particular channel.
- Parametric EQ Thresholds: Define the allowable parameter range for parametric EQ based on filter Q and/or filter gain.
- Parametric EQ Frequency Resolution: Defines the frequency resolution (in points per octave) that the amplified channel EQ engine uses for parametric EQ computations.
- Parametric EQ Frequency Smoothing: Defines the smoothing window (in points) that the amplified channel EQ engine uses for parametric EQ computations.
- Non-Parametric EQ Frequency Resolution: Defines the frequency resolution (in points per octave) that the amplified channel EQ engine uses for non-parametric EQ computations.

Non-Parametric EQ Frequency Smoothing: Defines the smoothing window (in points) that the amplified channel EQ engine uses for non-parametric EQ computations.

Non-Parametric EQ Count: Defines the number of non-parametric biquads that the amplified channel EQ engine can use. Value is zero if non-parametric EQ is not to be applied to a particular channel.

Amplified Channel EQ Bandwidth: Defines the bandwidth to be filtered for each amplified channel by specifying a low and a high frequency cutoff Parametric EQ Constraints: Defines maximum and minimum allowable settings for parametric EQ filters. (e.g. maximum & minimum Q, frequency and magnitude)

Non-Parametric EQ constraints: Defines maximum and minimum allowable gain for the total non-parametric EQ chain at a specific frequency. (If constraints are violated in computation, filters are re-calculated to conform to constraints)

Crossover Optimization Parameters

Crossover Matrix: Defines which channels will have high pass and/or low pass filters applied to them and the channel that will have the complimentary acoustic response. (e.g. left front high and left front low)

Parametric Crossover Logic Matrix: Defines if parametric crossover filters are used on a particular channel.

Non-Parametric crossover Logic Matrix: Defines if non-parametric crossover filters are used on a particular channel.

Non-Parametric crossover maximum bi-quad count: Defines the maximum number of bi-quads that the system can use to compute optimal crossover filters for a given channel.

Initial Crossover Parameter Matrix: Defines the initial parameters for frequency and slope of the high pass and low pass filters that will be used as crossovers Crossover Optimization Frequency Resolution: Defines the frequency resolution (in points per octave) that the amplified channel equalization engine uses for crossover optimization computations.

Crossover Optimization Frequency Smoothing: Defines the smoothing window (in points) that the amplified channel equalization engine uses for crossover optimization computations.

Crossover Optimization Microphone Matrix: Defines which microphones are to be used for crossover optimization computations for each group of channels with crossovers applied.

Parametric Crossover Optimization Constraints: Defines the minimum and maximum values for filter frequency, Q and slope.

Polarity Logic Vector: Defines whether the crossover optimizer has permission to alter the polarity of a given channel. (e.g. 0 for not allowed, 1 for allowed)

Delay Logic Vector: Defines whether the crossover optimizer has permission to alter the delay of a given channel in computing the optimal crossover parameters.

Delay Constraint Matrix: Defines the change in delay that the crossover optimizer can use to compute an optimal set of crossover parameters. Active only if the delay logic vector allows.

Delay Optimization Parameters

Amplified Channel Excess Delay: Defines any additional (non coherent) delay to add to specific amplified channels (in seconds).

Weighting Matrix.

Gain Optimization Parameters

Amplified Channel Excess Gain: Defines and additional gain to add to specific amplified channels.

Weighting Matrix.

Bass Optimization Parameters

Bass Producing Channel Matrix: Defines which channels are defined as bass producing and should thus have bass optimization applied.

Phase Filter Logic Vector: Binary variables for each channel out of the bass manager defining whether phase compensation can be applied to that channel.

Phase Filter Biquad Count: Defines the maximum number of phase filters to be applied to each channel if allowed by Phase Filter Logic Vector.

Bass Optimization Microphone Matrix: Defines which microphones are to be used for bass optimization computations for each group of bass producing channels.

Weighting Matrix.

Nonlinear Optimization Parameters

Target power array: Defines the target maximum power value for each amplified channel in the system.

Target distortion array: Defines the maximum allowable distortion for each amplified channel in the system.

Target Function Parameters

Target Function: Defines parameters or data points of the target function as applied to each channel out of the spatial processor. (e.g. left front, center, right front, left rear, right rear).

Settings Application Simulator

Simulation Schedule(s): provides selectable information to include in each simulation Order Table: designates an order, or sequence in which settings are generated.

We claim:

1. An automated power efficiency audio tuning system comprising:

a processor;

at least one engine executable with the processor to obtain impedance data of at least two loudspeakers, the at least two loudspeakers configured to be driven by an audio system to produce audible sound;

the engine further executable with the processor to obtain acoustic performance data representative of cooperative operation of the at least two loudspeakers in the audio system to produce audible sound;

the engine further executable with the processor to obtain a target acoustic response;

the engine further executable with the processor to obtain a power efficiency weighting factor representative of a balance between a desired degree of power efficiency and a desired acoustic performance in the audio system;

the engine further executable with the processor to generate operational parameters based on the target acoustic response, the acoustic performance data and the impedance data where, the operational parameters are applied to the audio system to optimize acoustic performance of the at least two loudspeakers; and the engine further executable with the processor to adjust the operational parameters to balance the optimized acoustic performance and optimized power efficiency of the at least two loudspeakers based on the power efficiency weighting factor.

2. The automated power efficiency audio tuning system of claim 1, where the engine is an equalization engine, and the operational parameters include filter design parameters, the filter design parameters set by the equalization engine to balance equalization of audible sound produced by the at least two loudspeakers and power consumption of the at least two loudspeakers based on the power efficiency weighting factor.

3. The automated power efficiency audio tuning system of claim 1, where the engine is a cross over engine, and the operational parameters include filter design parameters, the filter design parameters being cross over settings set by the cross over engine to a cross over frequency that balances acoustic performance of at least one of the at least two loudspeakers and power consumption of the at least one of the at least two loudspeakers based on the power efficiency weighting factor.

4. The automated power efficiency audio tuning system of claim 1, where the engine is a bass optimization engine, and the operational parameters include filter design parameters providing a phase shift of audio signals driving the at least two loudspeakers, a degree of phase shift set by the bass optimization engine to balance cooperative acoustic performance of the at least two loudspeakers and power consumption of the at least two loudspeakers based on the power efficiency weighting factor.

5. The automated power efficiency audio tuning system of claim 1, where the engine is further executable to calculate the impedance data of each of the at least two loudspeakers based on at least two of a current magnitude, a voltage magnitude and a power magnitude being supplied to the at least two loudspeakers.

6. The automated power efficiency audio tuning system of claim 5, where the engine is further executable to access a stored predetermined impedance curve for each of the at least two loudspeakers to obtain the impedance data.

7. The automated power efficiency audio tuning system of claim 1, where the acoustic performance data comprises in-situ data representing actual cooperative operation of the at least two loudspeakers to produce audible sound in a listening space.

8. The automated power efficiency audio tuning system of claim 1, where the acoustic performance data comprises in-situ data representing simulation of cooperative operation of the at least two loudspeakers to produce audible sound in a listening space.

9. A method of performing automated power efficiency tuning of an audio system, the method comprising:

obtaining impedance data of at least two loudspeakers with a processor, the at least two loudspeakers configured to be driven by an audio system to produce audible sound;

obtaining acoustic performance related data with the processor, the performance related data representative of cooperative operation of the at least two loudspeakers in the audio system to produce audible sound;

with the processor obtaining a target acoustic response for the audio system;

with the processor further obtaining a power efficiency weighting factor representative of a balance between power efficiency required of the at least two loudspeakers in the audio system and acoustic performance of the at least two loudspeakers in the audio system;

generating operational parameters for use in the audio system with an engine to optimize the acoustic performance of the at least two loudspeakers based on the target acoustic response and the acoustic performance related data; and balancing optimization of the acoustic performance and optimization of the power efficiency with the engine by adjustment of the operational parameters based on the impedance data and the power efficiency weighting factor.

10. The method of claim 9, where generating operational parameters comprises generating filter design parameters for at least one of an all pass filter and a notch filter that are used to filter an audio signal from which the at least two loudspeakers are driven.

11. The method of claim 9, where balancing optimization comprises adjusting a crossover setting of an audio signal from which the at least two loudspeakers are driven to identify optimal power consumption and optimal acoustic performance of the at least two loudspeakers in accordance with the power efficiency weighting factor.

12. A method of performing automated power efficiency tuning of an audio system, the method comprising:

obtaining impedance data of at least two loudspeakers with a processor, the at least two loudspeakers configured to be driven by an audio system to produce audible sound;

obtaining performance related data with the processor, the performance related data representative of cooperative operation of the at least two loudspeakers in the audio system to produce audible sound;

with the processor obtaining a target acoustic response for the audio system and a power efficiency weighting factor representative of a degree of power efficiency required of the at least two loudspeakers in the audio system;

generating operational parameters for use in the audio system with an engine to optimize acoustic performance of the at least two loudspeakers based on the target acoustic response and the performance related data; and balancing optimization of the acoustic performance and optimization of power efficiency with the engine by adjustment of the operational parameters based on the impedance data and the power efficiency weighting factor, where the at least two loudspeakers include a first loudspeaker capable of generating a first sound wave when driven by a first audio signal, and a second loudspeaker capable of generating a second sound wave when driven by a second audio signal, and where balancing optimization comprises minimizing a magnitude of the first audio signal and the second audio signal by optimizing constructive addition of the corresponding first and second sound waves in a listening space by adjusting a phase setting of the first audio signal with respect to the second audio signal in accordance with the power efficiency weighting factor.

13. The method of claim 9, where balancing optimization comprises generating equalization settings for application to respective audio signals driving the at least two loudspeakers and adjusting the equalization settings in accordance with the power efficiency weighting factor to appropriately constrain power consumption by the at least two loudspeakers.

14. The method of claim 9, where balancing optimization comprises generating gain settings for application to audio signals respectively driving the at least two loudspeakers to optimize the acoustic performance, and attenuating the gain settings in accordance with the power efficiency weighting factor.

15. A method of performing automated power efficiency tuning of an audio system, the method comprising:

obtaining impedance data of at least two loudspeakers with a processor, the at least two loudspeakers configured to be driven by an audio system to produce audible sound;

obtaining performance related data with the processor, the performance related data representative of cooperative operation of the at least two loudspeakers in the audio system to produce audible sound;

with the processor obtaining a target acoustic response for the audio system and a power efficiency weighting factor representative of a degree of power efficiency required of the at least two loudspeakers in the audio system;

generating operational parameters for use in the audio system with an engine to optimize acoustic performance of the at least two loudspeakers based on the target acoustic response and the performance related data; and balancing optimization of the acoustic performance and optimization of power efficiency with the engine by adjustment of the operational parameters based on the impedance data and the power efficiency weighting factor, where balancing optimization comprises generating equalization settings and crossover settings for application to respective audio signals driving the at least two loudspeakers, and first adjusting the equalization settings followed by the crossover settings in accordance with the power efficiency weighting factor to appropriately constrain power consumption by the at least two loudspeakers.

16. A computer readable non-transitory storage medium for storing executable code in the form of instructions, the computer readable storage medium comprising:

instructions executable by a processor to obtain acoustic performance data representative of cooperative operation of at least two loudspeakers driven by the audio system to produce audible sound;

instructions executable by the processor to obtain target acoustic response data representative of a target acoustic response of the at least two loudspeakers;

instructions executable by the processor to initiate an engine to generate operational parameters that alter the audio channels of the audio system to optimize acoustic performance of the at least two loudspeakers, the operational parameters generated based on differences in the acoustic performance data and the target acoustic response data; and instructions executable by the processor to constrain optimization of the acoustic performance by adjusting the operational parameters with a power efficiency weighting factor, the power efficiency weighting factor representative of a balance between a desired level of power efficiency of the audio system and optimization of the acoustic performance of the at least two loudspeakers.

17. An automated power efficiency audio tuning system comprising:

a processor;

a setup file accessible by the processor, the setup file configured to store audio system specific configuration settings of an audio system to be tuned to operate in a power efficiency mode, the stored audio system specific configuration settings comprising operational data indicative of cooperative operational performance of a plurality of loudspeakers driven by a plurality of respective audio channels generated by the audio system;

an engine executable with the processor to optimize acoustic performance of the audio system by generation of operational parameters used in the audio system to adjust the audio channels, the operational parameters generated based on a comparison of the operational data and a target acoustic response; and the engine further executable to develop the power efficiency mode by balancing optimized acoustic performance and optimized power efficiency of the audio system by adjustment of the operational parameters using a power efficiency weighting factor, the power efficiency weighting factor indicative of an importance of power efficiency relative to acoustic performance.

18. The automated power efficiency audio tuning system of claim 17 where the engine comprises a crossover engine configured to generate at least one efficiency optimized crossover setting for a selected group of amplified channels, the crossover setting optimized to minimize power consumption when operating the audio system in the power efficiency mode.

19. The automated power efficiency audio tuning system of claim 18 where the crossover engine includes a crossover efficiency optimization module executable by the processor to receive a list of performance optimized crossover settings, to generate a list of efficiency optimized crossover settings, and to generate a weighted list of crossover settings containing crossover settings from the performance optimized crossover settings list or the efficiency optimized crossover settings list, the weighted list of crossover settings generated based on the power efficiency weighting factor.

20. The automated power efficiency audio tuning system of claim 18 where the efficiency optimized crossover setting includes a plurality of filter parameters to configure at least one efficiency optimized filter bank to include a high-pass filter, N-number of notch filters, and a low pass filter.

21. The automated power efficiency audio tuning system of claim 18 where the engine further comprises a bass optimization engine configured to optimize a phase alignment of two audio channels as a function of the power efficiency weighting factor to balance optimized acoustic performance and optimized power efficiency.

22. The automated power efficiency audio tuning system of claim 21 where the engine further comprises a nonlinear optimization engine configured to monitor and control power consumption in the audio system.

23. The automated power efficiency audio tuning system of claim 22 where the nonlinear optimization engine includes a power limiter configured to determine whether a channel or a group of channels is operating at power levels that exceed a predetermined limit, and to adjust a power spectra, gain or dynamic range of the channel or the group of channels.

24. The automated power efficiency audio tuning system of claim 17 further comprising a user interface having at least one user input device, the user input device configured to enable user selection of operation in the power efficiency mode, and selection of an efficiency level.

25. A method of performing automated power efficiency tuning of an audio system, the method comprising:

providing a setup file containing configuration settings for an audio system to be tuned to operate in a power efficiency mode;

retrieving operational data included in the setup file with an engine, the operational data indicative of cooperative operational acoustic performance of a plurality of loudspeakers included in the audio system and driven by a plurality of respective audio channels;

comparing the operational data with a target acoustic response;

optimizing acoustic performance of the audio system with the engine based on the comparison of the operational data and the target acoustic response by generating operational parameters used in the audio system to adjust the audio channels so that the operational data substantially corresponds to the target acoustic response; and developing the power efficiency mode with the engine by balancing optimization of the acoustic performance of the audio system and optimization of power efficiency of the audio system with the engine based on a power efficiency weighting factor, the power efficiency weighting factor indicative of an importance of power efficiency relative to acoustic performance, and the balancing performed by adjusting the operational parameters used in the audio system to adjust the audio channels.

26. The method of claim 25 where generating operational parameters comprises the step of generating at least one crossover setting with the engine for each of at least two of the amplified audio channels, and balancing optimized acoustic performance and optimized power efficiency comprises the step of adjusting a frequency crossover point of each of the at least two crossover settings with the engine to optimize power consumption in accordance with the power efficiency weighting factor.

27. The method of claim 26 where generating operational parameters comprises the step of generating a phase adjustment with the engine for at least one of the amplified audio channels, and balancing optimized acoustic performance and optimized power efficiency comprises the step of adjusting the phase adjustment with the engine in accordance with the power efficiency weighting factor to optimize constructive combination of audible sound produced by at least two of the loudspeakers.

28. The method of claim 27 further comprising setting power limits with the engine for operation of the audio system in the power efficiency mode, the power limits adjusting a power spectra of a selected audio channel or a group of audio channels to limit power consumption according to the power limits.

* * * * *